(12) United States Patent
Wada et al.

(10) Patent No.: US 8,546,913 B2
(45) Date of Patent: Oct. 1, 2013

(54) SEMICONDUCTOR INTEGRATED CIRCUIT DEVICE

(75) Inventors: Masatake Wada, Kanagawa (JP); Naoki Imakita, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 82 days.

(21) Appl. No.: 13/064,599

(22) Filed: Apr. 1, 2011

(65) Prior Publication Data
US 2011/0204477 A1  Aug. 25, 2011

(30) Foreign Application Priority Data

Feb. 4, 2010 (JP) ................................. 2010-085686
Mar. 3, 2011 (JP) ................................. 2011-046790

(51) Int. Cl.
*H01L 27/118* (2006.01)
*H01L 23/52* (2006.01)

(52) U.S. Cl.
USPC .................. 257/532; 257/207; 257/E27.048

(58) Field of Classification Search
CPC .. H01L 23/5223; H01L 27/0805; H01L 28/04
USPC .......................... 257/202, 207, 532, E27.048
See application file for complete search history.

(56) References Cited

U.S. PATENT DOCUMENTS

| | | | | |
|---|---|---|---|---|
| 6,066,537 A | * | 5/2000 | Poh | 438/393 |
| 6,933,551 B1 | * | 8/2005 | Stribley et al. | 257/296 |
| 7,994,609 B2 | * | 8/2011 | Quinn | 257/532 |
| 2005/0001291 A1 | * | 1/2005 | Miyada et al. | 257/659 |
| 2007/0138587 A1 | * | 6/2007 | Shin et al. | 257/435 |

FOREIGN PATENT DOCUMENTS

JP  2009-033194 A  2/2009

* cited by examiner

*Primary Examiner* — Jerome Jackson, Jr.
*Assistant Examiner* — Paul Budd
(74) *Attorney, Agent, or Firm* — McGinn IP Law Group, PLLC

(57) ABSTRACT

A capacitance cell includes a substrate structure layer having pair diffusion regions, and an interconnect layer having pair of power supply lines. The capacitance cell also includes a capacitance composed of a first electrode, a dielectric member and a second electrode stacked together, and is formed in a frame shape and disposed in a space between the substrate structure layer and the interconnect layer so as to extend along an outer rim of the frame shape of a standard cell region in which a standard cell is arranged. The capacitance cell also includes a first substrate contact that electrically connects one of the pair of power supply lines to one of the diffusion regions externally of the standard cell region. The capacitance cell also includes a second substrate contact that electrically connects the other power supply line to the other diffusion region, externally of the standard cell region. The capacitance cell further includes a first capacitance contact electrically connecting the first electrode to the other diffusion region internally of the standard cell region, and a second capacitance contact electrically connecting the second electrode to the one power supply line internally of the standard cell region.

8 Claims, 45 Drawing Sheets

A – A'

B – B'

C – C'

A − A'

B − B'

C − C'

A – A'

B – B'

C – C'

D – D'

E – E'

A – A'

B – B'

C – C'

A – A'

B – B'

C – C'

D – D'

E – E'

A – A'

B – B'

A – A'

B – B'

SEMICONDUCTOR INTEGRATED CIRCUIT DEVICE

TECHNICAL FIELD (Reference To Related Application)

This application is based upon and claims the benefit of the priorities of Japanese patent application No. 2010-085686, filed on Apr. 2, 2010, and Japanese patent application No. 2011-046790, filed on Mar. 3, 2011, the disclosures of which are incorporated herein in their entirety by reference thereto. The present disclosure relates to a semiconductor integrated circuit device. More particularly, it relates to a semiconductor integrated circuit device having a decoupling capacitor within a standard cell.

BACKGROUND

Recently, in digital cameras or mobile phones, the amount of data handled is increasing. However, the size of the digital cameras or mobile phones is becoming smaller. To further reduce the size, many products are presented in which a DRAM (Dynamic Random Access Memory) capacitor is built within an LSI (Large Scale Integration) to reduce the chip size as a whole. Moreover, in keeping up with the LSI size reduction, the demand for increasing the operating speed of the LSI is becoming stronger.

However, increasing the operating speed of an LSI is tantamount to increasing its operating frequency. If, in case larger numbers of flipflop circuits, each operating with a clock signal, are arranged at a given site of the LSI, these numerous flipflop circuits are simultaneously run in operation, the electrical charges of power supply lines and ground interconnects flow abruptly through the flipflop circuits. The electrical charges of the power supply lines and the ground line are then decreased instantaneously to give rise to power supply voltage fluctuations.

To suppress these power supply voltage fluctuations, it has so far been proposed to provide a standard cell within an LSI. The standard cell, a gate capacitance configuration capacitor cell, operates to store the electrical charges in a gate capacitance. The gate capacitance configuration capacitor cell has both its electrodes connected to the power supply lines and the ground line to constitute a decoupling capacitor (bypass capacitor) to suppress the power supply voltage fluctuations.

However, if the gate capacitance configuration capacitor cell is arranged within the LSI, the area taken up by the LSI is increased. To suppress the LSI size from increasing, such a technique has recently been desired which allows a decoupling capacitor to be formed in the LSI without using the gate capacitance configuration capacitor cell in which electrical charges are stored in the gate capacitance.

In Patent Document 1, for example, there is disclosed a method for generating a pattern for a semiconductor integrated circuit device as a technique of forming a decoupling capacitor (bypass capacitor). The pattern generation method includes a step of designing and placing a layout pattern of a semiconductor chip including layered (stacked) interconnects of first and second interconnect layers of respective different film thicknesses. The pattern generation method also includes a step of extracting a circuit block liable to generate a noise from the layout pattern, and a step of verifying whether or not a capacitance cell may be placed on the circuit block. The pattern generation method further includes a step of placing a capacitance by sandwiching a capacitance insulation film between first and second interconnect layers in a capacitance placing region in the circuit block extracted. The capacitance placing region is a region concluded in the above verifying step to be a region in the circuit block in which it is possible to place the capacitor. The first and second interconnect layers are to be connected to two power supply lines of respective different potentials. In the capacitance placing region, the insulation capacitance film is sandwiched between the first and second interconnect layers, on the circuit block, in order to constitute a bypass capacitor. In the other regions of the semiconductor integrated circuit device, the first and second interconnect layers are directly layered (stacked) together to constitute an interconnection of the polycide configuration. If, in this known method for generating a pattern for a semiconductor integrated circuit device, it is found in the verifying step that a capacitor is unable to be placed in a region in question, such a region in which the capacitor may be placed is sequentially searched towards upper layers.

[Patent Document 1]
JP Patent Kokai Publication No. JP2009-33194A (paragraph 0055)

SUMMARY

The entire disclosure of Patent Document 1 is incorporated herein by reference thereto. The following analysis is presented according to the view of the present disclosure. The technique disclosed in Patent Document suffers a problem that the LSI is increased in size as a result of placing the capacitance cell. The reason may be summarized as follows. In the technique in which no gate capacitance configuration capacitor cell is used, and a capacitance cell is provided in the first interconnect layer or the second interconnect layer where there is an interconnect pattern, the capacitance cell may be provided only in such a region where there is no risk of an interconnect layer of the region in question shorting with the interconnect layer of the other region (interconnect region). If there is the risk of shorting, it is checked whether or not the capacitance cell may be formed on a directly upper layer. However, if, in the region where it has been attempted to form a capacitance cell, there is no vacant area in the total of the interconnect layers, such that there are no interconnect resources in the region, it is not possible to lay the capacitance cells. Thus, if there are no interconnect resources but it is necessary to arrange a capacitance cell in a specified region at any rate to suppress power supply voltage fluctuations, it is necessary to create a vacant area to secure interconnect resources to arrange the capacitance cell in the so formed vacant area. This leads to an increased area of the circuit block.

Hence, in the conventional art, there is a risk that capacitance may not be constructed without increasing the area of the circuit block. Thus there is much to be desired in the art.

In a first aspect of the present disclosure, there is provided a semiconductor integrated circuit device comprising a substrate structure layer at least including a pair of diffusion regions arranged at a preset spacing from each other. The semiconductor integrated circuit device also comprises an interconnect layer at least including a pair of power supply lines arranged at a preset spacing from each other so that the power supply lines will be superposed with the diffusion regions. The semiconductor integrated circuit device also comprises a capacitance composed of a first electrode, a dielectric layer and a second electrode stacked in this order looking from the side the substrate structure layer. The capacitance is formed in the shape of a frame of a preset width and is disposed inside an outer rim of a standard cell region so as to extend along the outer rim of the standard cell region within a space delimited between the substrate structure layer and the interconnect layer. The standard cell region is a region in which a standard cell is arranged between the pair of power supply lines. The semiconductor integrated circuit device also includes a first substrate contact that electrically connects, externally of the standard cell region, one of the pair of power supply line superposed with one of the pair diffusion regions to the one diffusion region. The semiconductor integrated circuit device also comprises, externally of the standard cell region, a second substrate contact that electrically connects the other of the pair of power supply lines power supply line superposed with the other of the diffusion regions to the other diffusion region. The semiconductor integrated circuit device further comprises a first capacitance contact that electrically connects, internally of the standard cell region, the first electrode and the other diffusion region, and a second capacitance contact that electrically connects, internally of the standard cell region, the second electrode to the one power supply line, internally of the standard cell region.

In a second aspect of the present disclosure, a semiconductor integrated circuit device includes a substrate structure layer comprised of a substrate having a plurality of wells and a plurality of diffusion regions thereon. The circuit device also includes an interconnect layer comprised of a pair of power supply lines arranged at a preset spacing from the substrate structure layer. The interconnect layer also includes an input side interconnect and an output side interconnect between the pair of power supply lines. The circuit device also includes a standard cell having a logic circuit on the substrate. The logic circuit is electrically connected to the pair of power supply lines, the input side interconnect and the output side interconnect. The circuit device also includes one or more capacitances arranged between the substrate structure layer and the interconnect layer and arranged in a region between the pair of power supply lines. The region is to include a region superposed with the pair of power supply lines. The capacitance is electrically connected to at least one out of areas delimited between the pair of power supply lines, between one of the pair of power supply lines and the input side interconnect, between the other of the pair of power supply lines and the input side interconnect, between the one power supply line and the output side interconnect or an arbitrary interconnect and between the other power supply line and the output side interconnect or an arbitrary interconnect.

The meritorious effects of the present disclosure are summarized as follows without limitation thereto. According to the present disclosure, a decoupling capacitor may be constructed without increasing the LSI area. The reason is that, since the capacitance is arranged between the interconnect layer and the substrate structure layer, the gate capacitance configuration capacitor cell(s), arranged in the conventional system within the LSI to combat power supply voltage fluctuations, may be dispensed with. Hence, it becomes unnecessary to arrange the capacitance(s) such as to by-pass the pair of power supply lines of the interconnect layer.

Moreover, according to the present disclosure, the design TAT (Turn Around Time) may be made shorter. The reason is that, since a capacitor that plays the role of a decoupling capacitor may be obtained by simply arranging a standard cell, it is unnecessary to look for a site in which it is possible to arrange the capacitance(s), thus leading to shortened design time.

PREFERRED MODES (General Mode 1)

Figure 1:
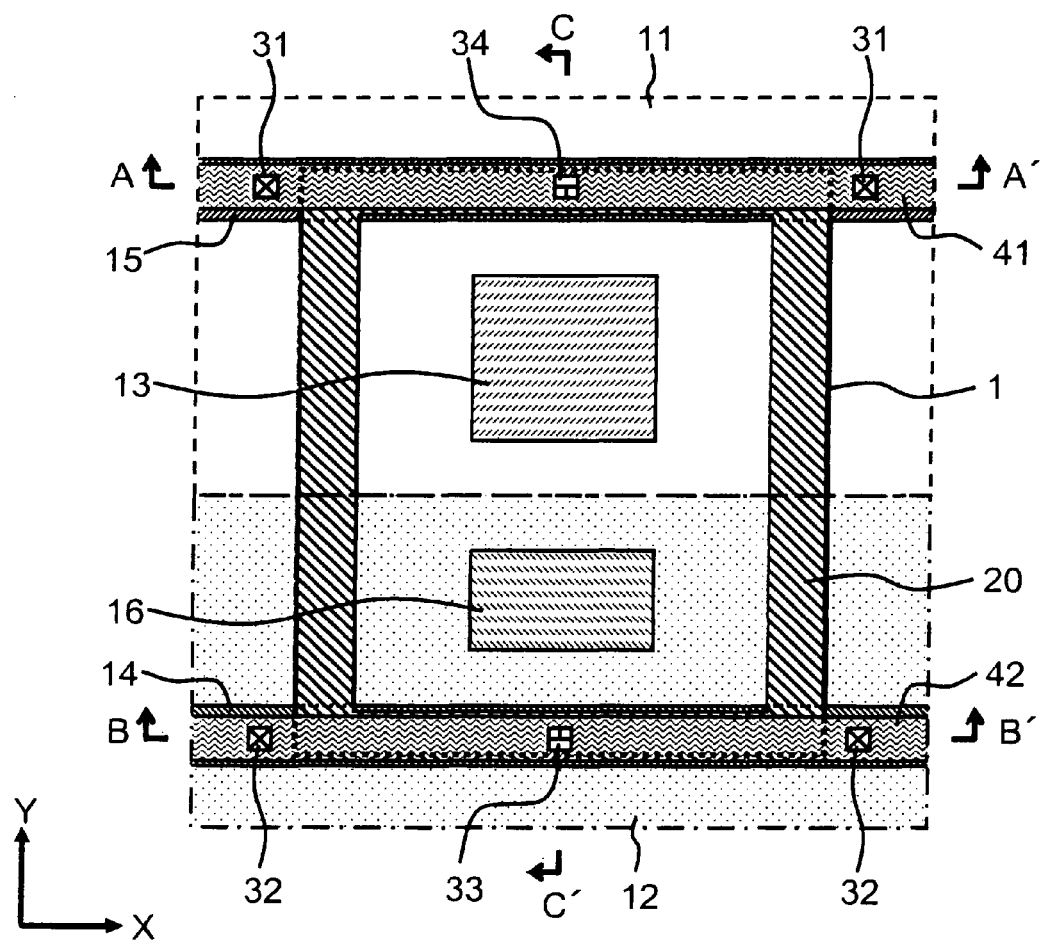
FIG. 1 is a schematic plan view showing a structure of a standard cell region with its vicinity in a semiconductor integrated circuit device according to Example 1 of the present disclosure.

A semiconductor integrated circuit device according to preferred General Mode 1 of the present disclosure includes a substrate structure layer (10 of FIGS. 1 and 2) at least including a pair of diffusion regions (15, 14 of FIGS. 1 and 2) arranged at a preset spacing from each other. The circuit device also includes an interconnect layer (40 of FIG. 2) at least including a pair of power supply lines (41, 42 of FIGS. 1 and 2) arranged at a preset spacing from each other so that the power supply lines will be superposed with the diffusion regions. The circuit device also includes a capacitance (20 of FIGS. 1 and 2) composed of a first electrode (21 of FIG. 2), a dielectric layer (22 of FIG. 2) and a second electrode (23 of FIG. 2), stacked in this order looking from the side of the substrate structure layer. The capacitance is arranged within a space delimited between the substrate structure layer and the interconnect layer, and is formed in the shape of a frame of a preset width. The capacitance of the frame shape. is disposed inside an outer rim of a standard cell region (1 of FIG. 1) and extended along the outer rim of the standard cell region. The standard cell region is a region in which a standard cell is arranged at least between the pair of power supply lines. The circuit device also includes a first substrate contact (31 of FIGS. 1 and 2) that electrically connects one (41 of FIGS. 1 and 2) of the power supply lines that is superposed with one (15 of FIGS. 1 and 2) of the pair diffusion regions to the one diffusion region externally of the standard cell region. The circuit device also includes a second substrate contact (32 of FIGS. 1 and 2) that electrically connects the other (42 of FIGS. 1 and 2) of the power supply lines that is superposed with the other (14 of FIGS. 1 and 2) of the diffusion regions to the other diffusion region, externally of the standard cell region. The circuit device also includes a first capacitance contact (34 of FIGS. 1 and 2) that electrically connects the first electrode to the other diffusion region internally of the standard cell region, and a second capacitance contact (33 of FIGS. 1 and 2) that electrically connects the second electrode to the one power supply line internally of the standard cell region.

(General Mode 2)

A semiconductor integrated circuit device according to preferred General Mode 2 of the present disclosure includes a substrate structure layer (10 of FIGS. 8 and 9) comprised of a substrate having a plurality of wells (11 and 12 of FIGS. 7 to 9) and a plurality of diffusion regions (13a, 13b, 16a, 16b of FIGS. 7 to 9) thereon. The circuit device also includes an interconnect layer (40 of FIGS. 8 and 9) comprised of a pair of power supply lines (41 and 42 of FIGS. 7 and 8) arranged at a preset spacing from the substrate structure layer. The interconnect layer also includes an input side interconnect (43 of FIGS. 7 and 8) and an output side interconnect (44 of FIGS. 7 and 9) between the pair of power supply lines. The circuit device also includes a standard cell (combination of 61 and 62 of FIG. 7) having a logic circuit on the substrate. The logic circuit is electrically connected to the pair of power supply lines, the input side interconnect and the output side interconnect. The circuit device also includes one or more capacitances (20 of FIGS. 7, 70 and 75 of FIGS. 11, 14, 17, 19, 21, 23, 25 and 31, 80 and 85 of FIGS. 27 and 90 of FIGS. 34, 37, 40, 43) arranged between the substrate structure layer and the interconnect layer in a region between the pair of power supply lines. The region includes an area superposed with the pair of power supply lines. The capacitance is electrically connected to at least one out of areas delimited between the pair of power supply lines, between one of the pair of power supply lines and the input side interconnect, between the other of the pair of power supply lines and the input side interconnect, between the one power supply line and the output side interconnect or an arbitrary interconnect and between the other power supply line and the output side interconnect or an arbitrary interconnect.

It is observed that reference numerals entered in parentheses ( ) hereinabove in the preferred modes are only for illustration by way of examples for assisting in understanding the present disclosure and are not intended for limiting the disclosure to the particular formulations shown in the drawings.

(Mode 1-1)

In the semiconductor integrated circuit device according to the present disclosure, the standard cell is preferably a tapless configuration standard cell in a rectangular frame of which there is not provided a substrate contact or a well contact. The standard cell may include a DRAM.

(Mode 1-2)

In the semiconductor integrated circuit device according to the present disclosure, the width of the capacitance is preferably set so that no shorting will occur between the capacitance and the first or second substrate contact.

(Mode 1-3)

In the semiconductor integrated circuit device according to the present disclosure, the substrate structure layer preferably has a preset diffusion region inside the frame shape of the capacitance. The other power supply line may include a portion extended to a site superposed with the preset diffusion region. The preset diffusion region may be electrically connected via a third substrate contact to the extended portion of the other power supply line. The capacitance may include a portion extended to a region where the third substrate contact is not provided.

(Mode 1-4)

In the semiconductor integrated circuit device according to the present disclosure, the capacitance preferably includes a portion extended from a side of its region superposed with the one power supply line towards the other power supply line.

(Mode 1-5)

In the semiconductor integrated circuit device according to the present disclosure, it is preferred that the extended portion of the capacitance is formed so as not to be superposed with the extended portion of the other power supply line and with the third substrate contact.

(Mode 1-6)

In the semiconductor integrated circuit device according to the present disclosure, the standard cell does not include, in the standard cell region, it is preferred that a substrate contact that electrically connects the pair of power supply lines to a component part of the substrate structure layer. The capacitance may include a portion that is extended from a side of its region superposed with one of the power supply lines and that connects to a side of its region superposed with the other power supply line.

(Mode 1-7)

In the semiconductor integrated circuit device according to the present disclosure, it is preferred that the standard cell does not include, in the standard cell region, a substrate contact that electrically connects the pair of power supply lines to a component part of the substrate structure layer. The capacitance may be formed in the standard cell region in its entirety.

(Mode 2-1)

In the above semiconductor integrated circuit device according to the present disclosure, the substrate structure layer includes a pair of diffusion areas arranged superposed with the pair of power supply lines. The capacitance includes a first capacitance arranged in a region formed in a frame shape or a U-shape so as to extend along the outer rim of the standard cell. The region is superposed with both of the pair of power supply lines. The one power supply line is electrically connected to one of the pair diffusion regions via a first substrate contact arranged outside the first capacitance. The other power supply line is electrically connected to the other of the pair diffusion regions via a second substrate contact arranged outside the first capacitance. The first capacitance has one end electrically connected to the one power supply line, and has the other end electrically connected to the other power supply line.

(Mode 2-2)

In the above semiconductor integrated circuit device according to the present disclosure, the first capacitance preferably has one end electrically connected to the one power supply line via a capacitance contact, the one diffusion region and the first substrate contact. The first capacitance has the other end electrically connected to the other power supply line via a capacitance contact.

(Mode 2-3)

In the above semiconductor integrated circuit device according to the present disclosure, the substrate structure layer includes a pair of diffusion regions arranged for superposed with the pair of power supply lines. The capacitance includes a first capacitance arranged in a region formed in a frame shape or a U-shape so as to extend along the outer rim of the standard cell. The region is superposed with both of the pair of power supply lines. The one power supply line is electrically connected to one of the pair diffusion regions via a first substrate contact arranged outside the first capacitance. The other power supply line is electrically connected to the other of the pair diffusion regions via a second substrate contact arranged outside the first capacitance. The first capacitance has one end electrically connected to the other power supply line and has the other end electrically connected to the one power supply line.

(Mode 2-4)

In the above semiconductor integrated circuit device according to the present disclosure, the first capacitance preferably has one end electrically connected to the other power supply line via a capacitance contact, the other diffusion region and the second substrate contact. The first capacitance has the other end electrically connected to the one power supply line via a capacitance contact.

(Mode 2-5)

In the above semiconductor integrated circuit device according to the present disclosure, the first capacitance is preferably formed to a preset width.

(Mode 2-6)

In the above semiconductor integrated circuit device according to the present disclosure, the capacitance preferably includes a second capacitance arranged within a region of the standard cell. The second capacitance has one end electrically connected to the one power supply line, while having the other end electrically connected to the input side interconnect, the output side interconnect or an arbitrary interconnect.

(Mode 2-7)

In the above semiconductor integrated circuit device according to the present disclosure, the second capacitance preferably has one end electrically connected to the one power supply line via a capacitance contact, a diffusion region and a substrate contact. The second capacitance has the other end electrically connected via a capacitance contact to the input side interconnect, to the output side interconnect or an arbitrary interconnect.

(Mode 2-8)

In the above semiconductor integrated circuit device according to the present disclosure, the capacitance preferably includes a second capacitance arranged within a region of the standard cell. The second capacitance has one end electrically connected to the output side interconnect or to the input side interconnect, while having the other end electrically connected to the one power supply line.

(Mode 2-9)

In the above semiconductor integrated circuit device according to the present disclosure, the second capacitance preferably has one end electrically connected to the output side interconnect via a capacitance contact, a diffusion region and a substrate contact. The second capacitance has the other end electrically connected via a capacitance contact to the one power supply line.

(Mode 2-10)

In the above semiconductor integrated circuit device according to the present disclosure, the second capacitance preferably has one end electrically connected to the input side interconnect via a capacitance contact, a gate electrode and a contact. The second capacitance has the other end electrically connected via a capacitance contact to the one power supply line.

(Mode 2-11)

In the above semiconductor integrated circuit device according to the present disclosure, the capacitance preferably includes a third capacitance arranged in a region of the standard cell. The third capacitance has one end electrically connected to the other power supply line, while having the other end electrically connected to the input side interconnect, the output side interconnect or an arbitrary interconnect.

(Mode 2-12)

In the above semiconductor integrated circuit device according to the present disclosure, the third capacitance preferably has one end electrically connected to the other power supply line via a capacitance contact, a diffusion region or a substrate contact. The third capacitance has the other end electrically connected via a capacitance contact to the input side interconnect, the output side interconnect or an arbitrary interconnect.

(Mode 2-13)

In the above semiconductor integrated circuit device according to the present disclosure, the capacitance preferably includes a third capacitance arranged within an area of the standard cell region. The third capacitance has one end electrically connected to the output side interconnect or to the input side interconnect, while having the other end electrically connected to the other power supply line.

(Mode 2-14)

In the above semiconductor integrated circuit device according to the present disclosure, the third capacitance preferably has one end electrically connected to the output side interconnect via a capacitance contact, a diffusion region and a substrate contact, while having the other end electrically connected via capacitance contact to the other power supply line.

(Mode 2-15)

In the above semiconductor integrated circuit device according to the present disclosure, the third capacitance preferably has one end electrically connected to the input side interconnect via a capacitance contact, a gate contact and a contact. The third capacitance has the other end electrically connected via capacitance contact to the other power supply line.

(Mode 2-16)

In the above semiconductor integrated circuit device according to the present disclosure, the substrate structure layer preferably includes a pair of diffusion regions arranged at sites superposed with the pair of power supply lines. The capacitance includes a fourth capacitance arranged in an area superposed with the one power supply line or the logic circuit. The one power supply line is electrically connected to one of the pair diffusion regions via a first substrate contact arranged in an area not superposed with the fourth capacitance. The other power supply line is electrically connected via a second substrate contact to the other of the pair diffusion regions. The fourth capacitance has one end electrically connected to the one power supply line, while having the other end electrically connected to the output side interconnect, the input side interconnect or an arbitrary interconnect.

(Mode 2-17)

In the above semiconductor integrated circuit device according to the present disclosure, the fourth capacitance preferably has one end electrically connected to the one power supply line via a capacitance contact, the one diffusion region and the first substrate contact. The other end of the fourth capacitance is electrically connected via a capacitance contact to the output side interconnect, the input side interconnect or an arbitrary interconnect.

(Mode 2-18)

In the above semiconductor integrated circuit device according to the present disclosure, the capacitance preferably includes a fifth capacitance arranged in an area superposed with the other power supply line or on top of the logic circuit. The other power supply line is electrically connected to the other of the pair diffusion regions via the second substrate contact arranged in an area not superposed with the fifth capacitance. The fifth capacitance has one end electrically connected to the other power supply line, while having the other end connected to the output side interconnect, the input side interconnect or an arbitrary interconnect.

(Mode 2-19)

In the above semiconductor integrated circuit device according to the present disclosure, the fifth capacitance preferably has one end electrically connected to the other power supply line via a capacitance contact, the other diffusion region and the second substrate contact. The other end of the fifth capacitance is electrically connected via a capacitance contact to the output side interconnect, the input side interconnect or an arbitrary interconnect.

(Mode 2-20)

In the above semiconductor integrated circuit device according to the present disclosure, the capacitance preferably includes a fourth capacitance arranged in a region superposed with the one power supply line or the logic circuit. The fourth capacitance has one end electrically connected to the output side interconnect or to the input side interconnect, while having the other end electrically connected to the one power supply line.

(Mode 2-21)

In the above semiconductor integrated circuit device according to the present disclosure, the fourth capacitance preferably has one end electrically connected to the output side interconnect via a capacitance contact, a diffusion region and a substrate contact. The other end of the fourth capacitance is electrically connected via a capacitance contact to the one power supply line.

(Mode 2-22)

In the above semiconductor integrated circuit device according to the present disclosure, the fourth capacitance preferably has one end electrically connected to the input side interconnect via a capacitance contact, a gate electrode and a contact. The other end of the fourth capacitance is electrically connected via a capacitance contact to the one power supply line.

(Mode 2-23)

In the above semiconductor integrated circuit device according to the present disclosure, the capacitance preferably includes a fifth capacitance arranged in an area superposed with the other power supply line or the logic circuit. The fifth capacitance has one end electrically connected to the output side interconnect or to the input side interconnect and having the other end electrically connected to the other power supply line.

(Mode 2-24)

In the above semiconductor integrated circuit device according to the present disclosure, the fifth capacitance preferably has one end electrically connected to the output side interconnect via a capacitance contact, a diffusion region and a substrate contact. The other end of the fifth capacitance is electrically connected to the other power supply line via a capacitance contact.

(Mode 2-25)

In the above semiconductor integrated circuit device according to the present disclosure, the fifth capacitance preferably has one end electrically connected to the input side interconnect via a capacitance contact, a gate electrode and a contact. The other end of the fifth capacitance is electrically connected to the other power supply line via a capacitance contact.

EXAMPLE 1

Figure 2A:
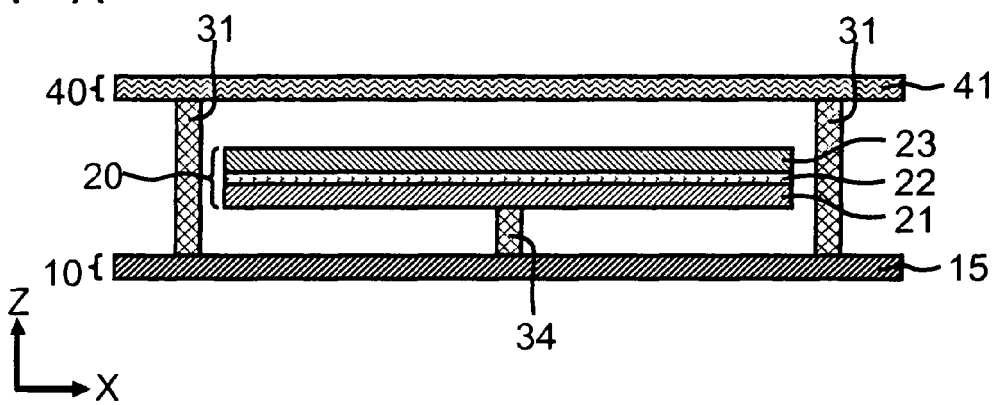
FIGS. 2A, 2B and 2C show schematic cross-sectional views taken along lines A-A', B-B' and C-C' of FIG. 1, respectively, for showing the structure of the standard cell region with its vicinity in the semiconductor integrated circuit device according to Example 1.
Figure 2B:
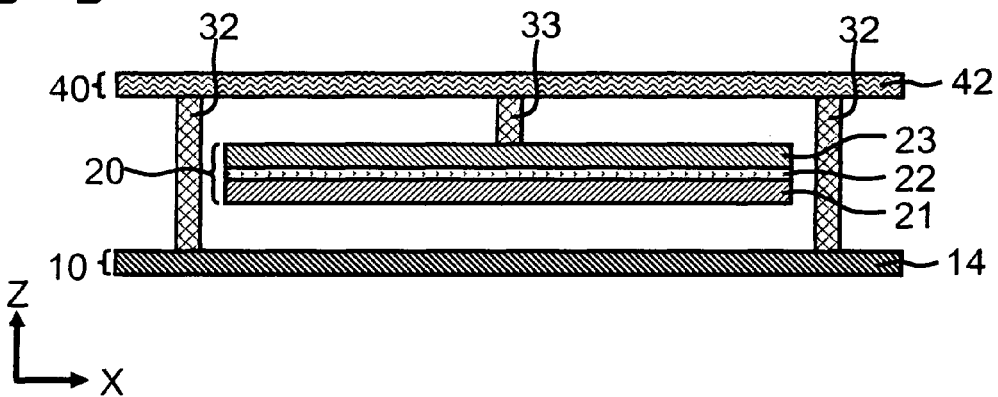
Figure 2C:
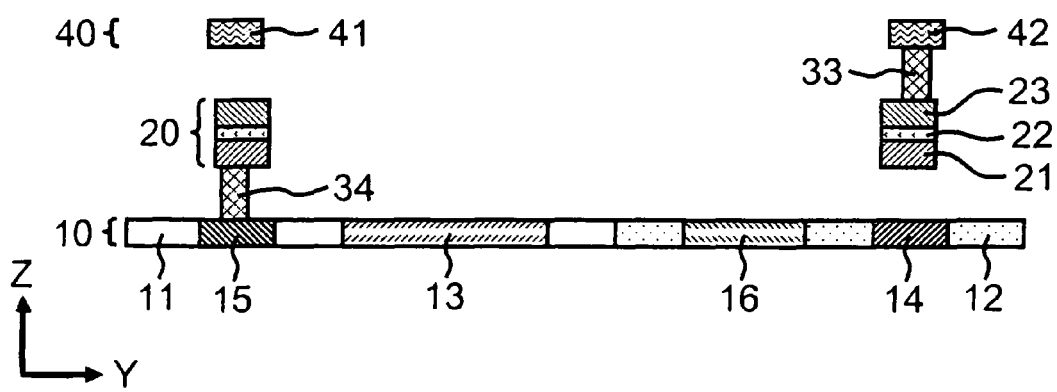
Figure 3:
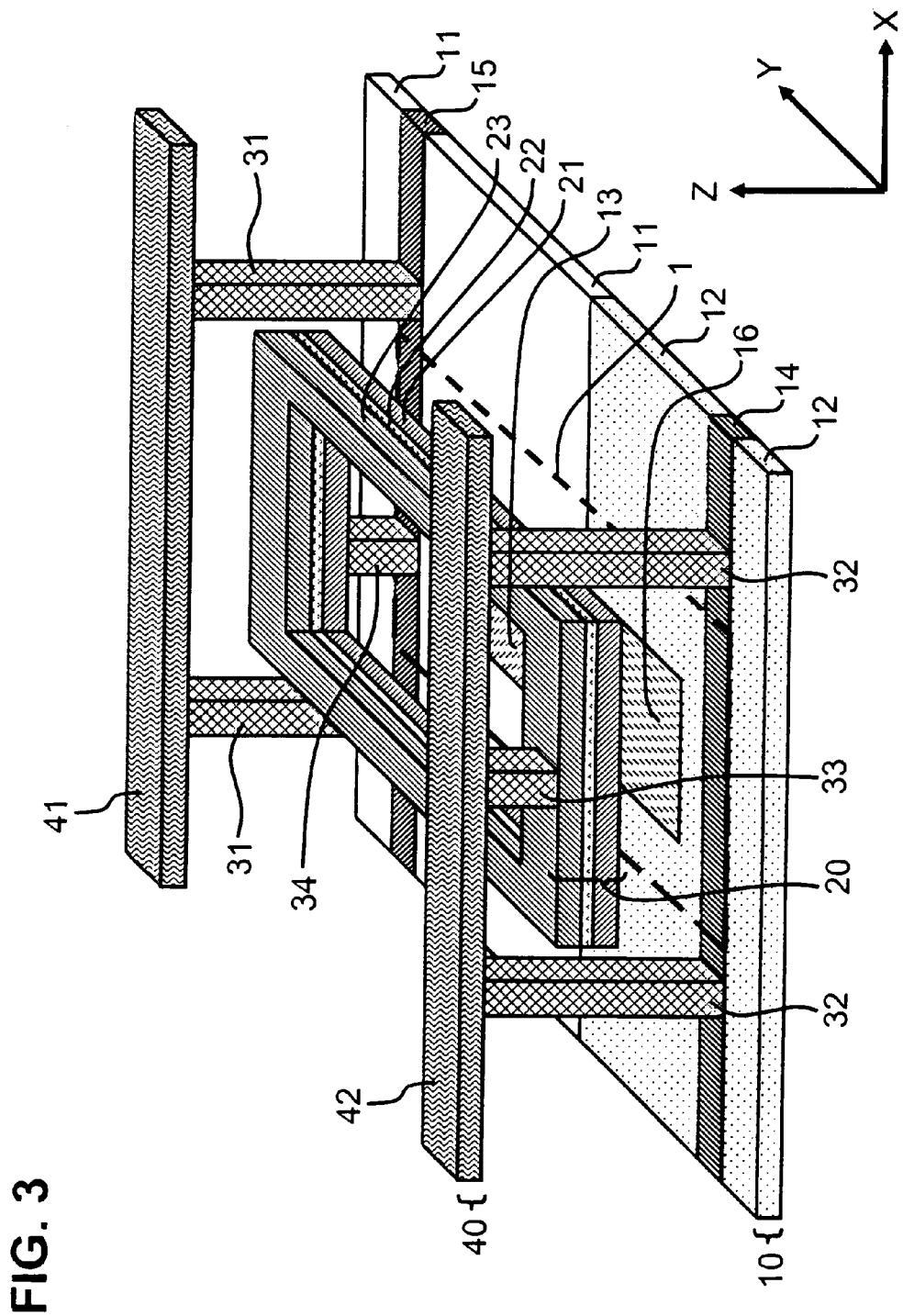
FIG. 3 is a schematic perspective view showing the structure of the standard cell region with its vicinity in a semiconductor integrated circuit device according to Example 1.

In the following, examples as preferred will be described with reference to the Drawings. A semiconductor integrated circuit device according to Example 1 of the present disclosure will now be described with reference to the drawings. FIG. 1 shows a schematic plan view showing the configuration of a standard cell region with its neighborhood in the semiconductor integrated circuit device according to Example 1. FIGS. 2A, 2B and 2C show cross-sectional views taken along lines A-A', B-B' and C-C' of FIG. 1, respectively, and specifically show the configuration of a standard cell region with its neighborhood in the semiconductor integrated circuit device according to Example 1 of the present disclosure. FIG. 3 depicts a schematic perspective view showing the configuration of the standard cell region with its neighborhood in the semiconductor integrated circuit device according to Example 1 of the present disclosure.

The semiconductor integrated circuit device includes a substrate structure layer 10 on top of which there is formed an interconnect layer 40 at a preset interval from the substrate structure layer 10 (see FIG. 2). The semiconductor integrated circuit device also includes a frame-shaped capacitance 20 between the interconnect layer 40 and substrate structure layer 10 within a standard cell region 1 in which a standard cell is arranged. The frame-shaped capacitance 20 has been formed at a preset width inside an outer rim (boundary) of the standard cell region 1 for extending along the boundary of the standard cell region 1.

In the substrate structure layer 10 of the semiconductor integrated circuit device, a first well 11 and a second well 12 are arrayed side-by-side for extending in the Y-axis direction (see FIG. 1). In the first well 11 of the semiconductor integrated circuit device, a third diffusion region 15 is arranged for extending in the X-axis direction. A first diffusion region 13 is arranged in an area closer to the second well 12 than the third diffusion region 15. In the second well 12 of the semiconductor integrated circuit device, a second diffusion region 14 is arranged for extending in the X-axis direction, and a fourth diffusion region 16 is arranged in an area closer to the first well 11 than the second diffusion region 14. In the semiconductor integrated circuit device, the second diffusion region 14 and the third diffusion region 15 are arranged in parallel to or substantially in parallel to and at a preset spacing from each other.

In the interconnect layer 40 in the semiconductor integrated circuit device, a first power supply line 41 and a second power supply line 42 are arranged in parallel to or substantially in parallel to and at a preset spacing from each other (see FIG. 1). In the semiconductor integrated circuit device, the first power supply line 41 is arranged superposed with the third diffusion region 15, and the second power supply line 42 is arranged superposed with the second diffusion region 14, when seen along the Z-axis direction. In the semiconductor integrated circuit device, the first power supply line 41, second power supply line 42, second diffusion region 14 and the third diffusion region 15 are arranged partially superposed with the standard cell region 1.

In the semiconductor integrated circuit device, the standard cell region 1 is arrayed in a region between the first power supply line 41 and the second power supply line 42, viz., between the second diffusion region 14 and the third diffusion region 15 (see FIG. 1). Outside of the standard cell region 1 in the semiconductor integrated circuit device, the first power supply line 41 is electrically connected to the third diffusion region 15 via a first substrate contact 31 (see FIG. 2A), while the second power supply line 42 is electrically connected to the second diffusion region 14 via a second substrate contact 32 (see FIG. 2B). In the semiconductor integrated circuit device, the width of the capacitance 20 is set such as to prevent shorting of the capacitance 20 with respect to the substrate contacts 31, 32. In the capacitance 20 in the semiconductor integrated circuit device, a first electrode 21, a dielectric member 22 and a second electrode 23 are sequentially stacked in this order, beginning from the first electrode 21 (see FIG. 2). Within the standard cell region 1 in the semiconductor integrated circuit device, the first electrode 21 in the capacitance 20 is connected via a first capacitance contact 34 to the third diffusion region 15 (see FIGS. 2A and 2C), while the second electrode 23 in the capacitance 20 is connected via a second capacitance contact 33 to the second power supply line 42 (see FIGS. 2B and 2C). The semiconductor integrated circuit device may include a DRAM as its cell device. In this case, the capacitance 20 may be of a structure similar to that of a DRAM capacitor.

It is observed that a standard cell is a cell including, in a rectangular frame, any of a variety of standardized patterns composing a transistor and a capacitor. The standard cell has been pre-set by a designing device (typically, computer). The standard cell, shown in FIG. 1, is a tapless configuration standard cell in a rectangular frame of which there is not provided a substrate contact or a well contact. The tapless configuration standard cell is of such a configuration in which there is neither the first substrate contact 31 nor the second substrate contact 32. The first substrate contact 31 interconnecting the first power supply line 41 and the third diffusion region 15, while the second substrate contact 32 interconnects the second power supply line 42 and the second diffusion region 14.

The substrate structure layer 10 is a structure layer including a substrate (a semiconductor substrate, not shown), on which there are formed wells 11, 12 and diffusion regions 13 to 16. The wells 11, 12 and the diffusion regions 13 to 16 make up a structure that implements a circuitry of the standard cell in the standard cell region 1. In the substrate structure layer 10, the first and second wells 11, 12 are arranged side-by-side and extended along the Y-axis direction, and a junction line between the first and second wells 11, 12 extends along the X-axis direction. In the substrate structure layer 10, the standard cell region 1 is set astride the junction line between the first and second wells 11, 12. In the substrate structure layer 10, the third diffusion region 15, extending along the X-axis direction, is jointed to the first well 11, while the second diffusion region 14, extending along the X-axis direction, is jointed to the second well 12. The third diffusion region 15 and the second diffusion region 14 are arranged partially superposed with portions of the capacitance 20 (portion of the capacitance extending along the X-axis) within the standard cell region 1. In the substrate structure layer 10, the rectangular-shaped first diffusion region 13 is jointed in the first well 11 to the first well 11 in an area (position) closer to the second well 12 than the third diffusion region 15. The rectangular-shaped fourth diffusion region 16 is jointed in the second well 12 to the second well 12 in an area (position) closer to the first well 11 than the second diffusion region 14. The first diffusion region 13 and the fourth diffusion region 16 are arranged within the standard cell region 1 so as to be not superposed with the capacitance 20. The third diffusion region 15 is arranged spaced apart from the first diffusion region 13, while the second diffusion region 14 is arranged spaced apart from the fourth diffusion region 16.

The first and second wells 11, 12 are of conductivity types opposite to each other. The electrical potential is supplied to the first well 11 from the first power supply line 41 via the first substrate contact 31 and the third diffusion region 15. The first well 11 and the third diffusion region 15 are equipotential relative to each other. The second well 12 is of an opposite conductivity type to the first well 11. The electrical potential is supplied to the second well 12 from the second power supply line 42 via the second substrate contact 32 and the second diffusion region 14. The second well 12 and the second diffusion region 14 are equipotential relative to each other.

The first diffusion region 13 is of the opposite conductivity type to the first well 11.

The second diffusion region 14 is of the same conductivity type as the second well 12 and is higher in impurity concentration than the second well 12. The second diffusion region 14 is electrically connected to the second power supply line 42 via the second substrate contact 32 arranged outside the standard cell region 1. Hence, the second diffusion region 14 is equipotential relative to the second power supply line 42.

The third diffusion region 15 is of the same conductivity type as that of the first well 11 and is higher in impurity potential than the first well 11. The third diffusion region 15 is electrically connected to the first power supply line 41 via the first substrate contact 31 arranged outside the standard cell region 1. The third diffusion region 15 is also electrically connected to the first electrode 21 via the first capacitance contact 34 arranged within the standard cell region 1. Hence, the third diffusion region 15 and the first power supply line 41 are equipotential relative to each other.

The fourth diffusion region 16 is of the opposite conductivity type to the second well 12.

The first power supply line 41 and the second power supply line are interconnects laid in the interconnect layer 40. The interconnect (wiring) layer 40 is arranged at a preset distance from the substrate structure layer 10.

The first power supply line 41 is a conductor extending along the X-axis direction. A first power supply potential, for example, the VDD potential, is applied to the first power supply line. The first power supply line 41 is arranged in parallel with or substantially in parallel with the third diffusion region 15 when seen from the Y-axis direction (see FIG. 2A), and is arranged superposed with the third diffusion region 15 when seen along the Z-axis direction (see FIG. 1). A portion of the first power supply line 41 is arranged so as to traverse an area within the standard cell region I superposed with a portion of the capacitance 20 arranged extending along the X-axis direction (FIG. 1 and FIG. 2C). The first power supply line 41 is electrically connected to the third diffusion region 15 via the second substrate contact 31 arranged outside the standard cell region 1.

The second power supply line 42 is a conductor extending along the X-axis direction. To this second power supply line, a second power supply potential different from the potential of the first power supply, for example, the GND potential, is applied. The second power supply line 42 is arranged in parallel with or substantially in parallel with the second diffusion region 14 when seen from the Y-axis direction (see FIG. 2B), and is aligned with the second diffusion region 14 when seen along the Z-axis direction (see FIG. 1). A portion of the second power supply line 42 is adapted for traversing an area within the standard cell region 1 superposed with a portion of the capacitance 20. The second power supply line 42 is electrically connected to the, second diffusion region 14 via the second substrate contact 32 arranged outside the standard cell region 1. The second power supply line is also electrically connected to the second electrode 23 via the second capacitance contact 33 arranged within the standard cell region 1.

The capacitance 20 is similar to the capacitance (capacitor) aimed to store the information by storing an electrical charge, and is used for suppressing variations in the power supply voltage. The capacitance 20 is arranged in a layer between the substrate structure layer 10 and the interconnect (wiring) layer 40 within the standard cell region 1. Specifically, the capacitance 20 is formed for the most part in a frame shape of a preset frame width, and is placed inside an outer rim (boundary) of the frame shape of the standard cell region 1 so as to extend along the outer rim (boundary). When seen along the Z-axis, the capacitance 20 is arranged within the standard cell region 1 between the first power supply line 41 and the second power supply line 42, viz., between the third diffusion region 15 and the second diffusion region 14. The width of the capacitance 20 is set so that there will be produced no shorting across the substrate contacts 31, 32 arranged outside the standard cell region 1 and the capacitance 20. The capacitance 20 is made up of the first electrode 21, dielectric member 22 and the second electrode 23, which are all flat along the XY plane and are stacked in this order along the Z-axis direction beginning from the first electrode 21.

The first electrode 21 is a conductor electrically connected to the first power supply line 41 via the first capacitance contact 34, third diffusion region 15 and the first substrate contact 31. Hence, the first electrode 21 and the first power supply line 41 are equipotential relative to each other.

The dielectric member 22 is formed of a material that behaves as an insulator which is not current conductive under a dc voltage.

The second electrode 23 is formed of a conductor that is electrically connected to the second power supply line 42 via the second capacitance contact 33. Hence, the second electrode 23 is equipotential relative to the second power supply line 42.

The first substrate contact 31 is formed of a conductor and acts as a contact that electrically connects the first power supply line 41 to the third diffusion region 15 outside the standard cell region 1. The second substrate contact 32 is also formed of a conductor and acts as a contact that electrically connects the second power supply line 42 to the second diffusion region 14 outside the standard cell region 1.

The first capacitance contact 34 is formed of a conductor and acts as a contact that electrically connects the third diffusion region 15 and the first electrode 21 within the standard cell region 1. The second capacitance contact 33 is also formed of a conductor and acts as a contact that electrically connects the second power supply line 42 to the second electrode 23 within the standard cell region 1.

The foregoing is explanation of a single standard cell with its peripheral structure. It is observed that the regions of the interconnect layer 40 or the substrate structure layer 10, which are needed for constituting the capacitance 20, are representative for a structure common to all sorts of standard cells. Hence, a variety of different standard cells may be used in combination.

If a plurality of the standard cells of FIGS. 1 to 3 are arranged side-by-side adjacent to one another along the Y-axis direction, a capacitance 20 within each of standard cell regions 1 is connected to a capacitance(s) 20 within the neighboring standard cell region(s) 1. In short, a structure will result in which neighboring one of the capacitances 20 connects to the neighboring capacitance(s) in the region(s) of the capacitance(s) 20 superposed with the first power supply line(s) 41 and/or the second power supply line(s) 42.

In similar manner, if a plurality of the standard cells of FIGS. 1 to 3 are arranged side-by-side adjacent to one another along the X-axis direction, the capacitance 20 within each of the standard cell regions 1 may be connected to the capacitance(s) 20 of the neighboring standard cell region(s) 1, provided that certain part of the substrate contacts 31, 32 may be omitted. Viz., to prevent shorting of the capacitances 20 with the substrate contacts 31, 32, it is beneficial to omit the substrate contacts 31, 32 in those areas where the capacitance connects to the neighboring capacitances.

It is observed that, when seen along the Z-axis direction, the capacitance 20 is arranged in a space or layer between the interconnect layer 40 and the substrate structure layer 10. Thus, the capacitance 20 is arranged in a three-dimensional spacial region different from the region set for the power supply line 41 or 42 or signal interconnects (wiring) needed for implementing the standard cell circuit (interconnects, not shown, laid inside the frame shape of the capacitance 20). There is thus no risk of the capacitances 20 shorting with the power supply lines or the signal interconnects. The capacitance 20 may, of course, be constructed in case where the power supply lines connected to the first electrode 21 and to the second electrode 23 are interchanged. In short, the first electrode 21 may be electrically connected to the second power supply line 42 via a capacitance contact, not shown, the second diffusion region 14 and via the second substrate contact 32. The second electrode 23 may then be electrically connected to the first power supply line 41 via a capacitance contact, not shown.

In Example 1, the following meritorious effect may be achieved.

A first meritorious effect is that a decoupling capacitor may be constructed without increasing the LSI area. The reason is that, by arranging the capacitance 20 between the interconnect layer 40 and the substrate structure layer 10, a gate capacitance configuration capacitor cell conventionally provided within the LSI as a countermeasure against fluctuations in the power supply voltage may be dispensed with. It is thus unnecessary to arrange the capacitance 20 so as to by-pass the first power supply line 41 as well as the second power supply line 42 in the interconnect layer 40.

It is observed that, in Example 1, the capacitance 20 is arranged in a space between the substrate structure layer 10 and the interconnect layer 40 within the standard cell region 1. The capacitance 20 is thus arranged in a spacial region different from the region set for the power supply lines or the signal interconnects necessary for the standard cell circuit. Hence, the capacitance 20 may be arranged within the standard cell region 1 in a manner unaffected by structures provided in the standard cell region 1 or by interconnect resources within the LSI.

A second meritorious effect is that the design TAT (Turn Around Time) may be shortened. The reason is that the capacitance 20 operating as a decoupling capacitor may be placed within an LSI simply by placing the standard cell, so that it is unnecessary to look for a site (area) in which it is possible to place the capacitance 20, thus leading to shortened design time.

EXAMPLE 2

Figure 4:
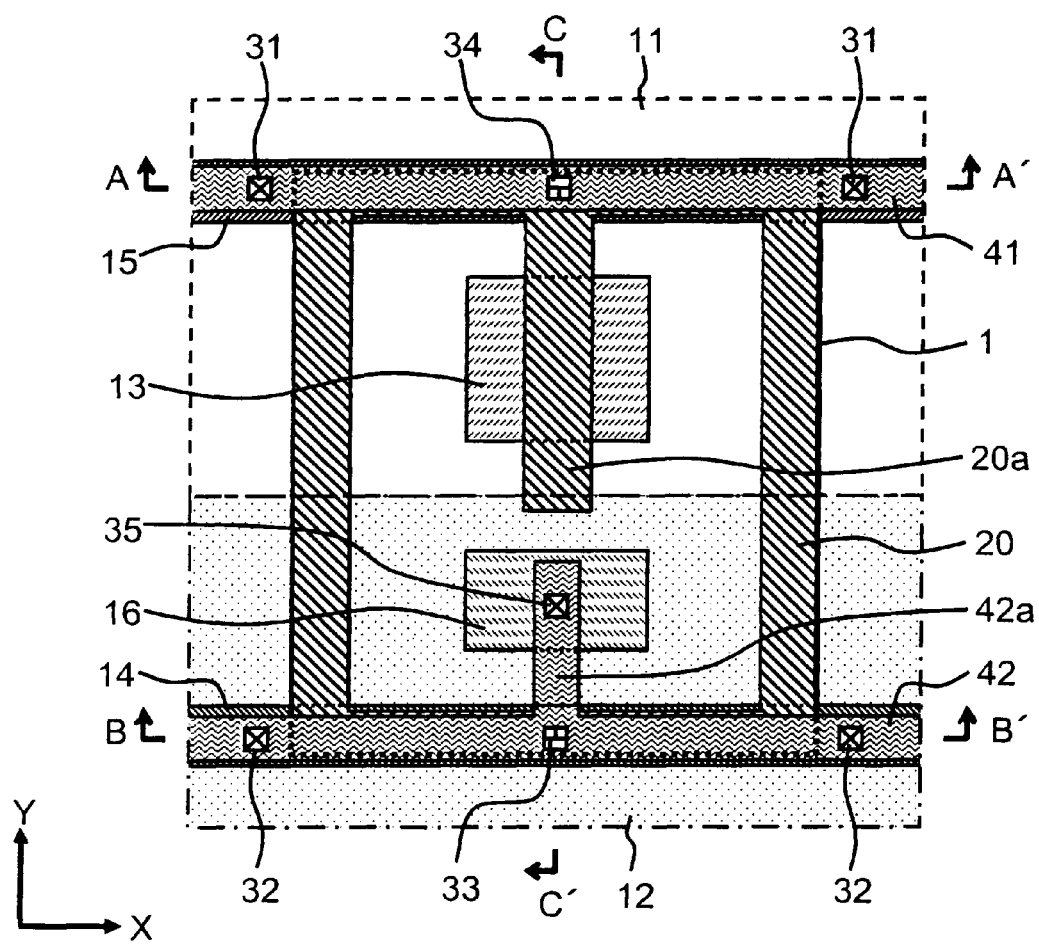
FIG. 4 is a schematic plan view showing the structure of a standard cell region with its vicinity in the semiconductor integrated circuit device according to Example 2 of the present disclosure.
Figure 5A:
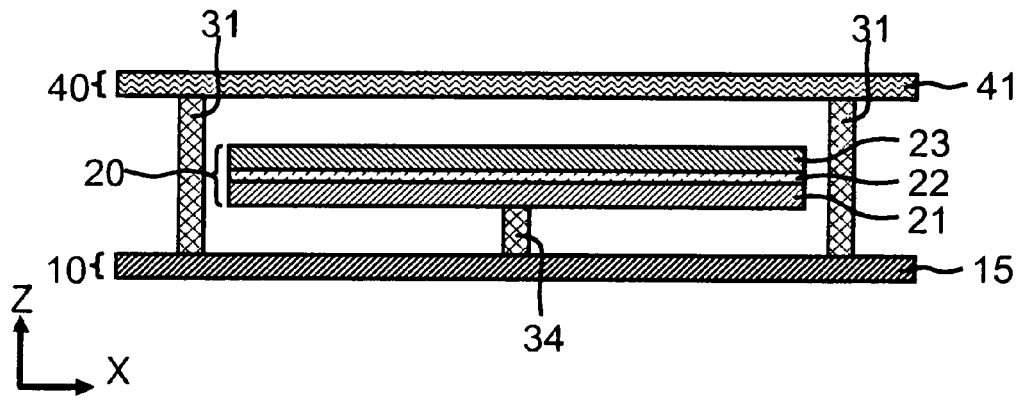
FIGS. 5A, 5B and 5C show schematic cross-sectional views taken along lines A-A', B-B' and C-C' of FIG. 4, respectively, for showing the structure of the standard cell region with its vicinity in the semiconductor integrated circuit device according to Example 2.
Figure 5B:
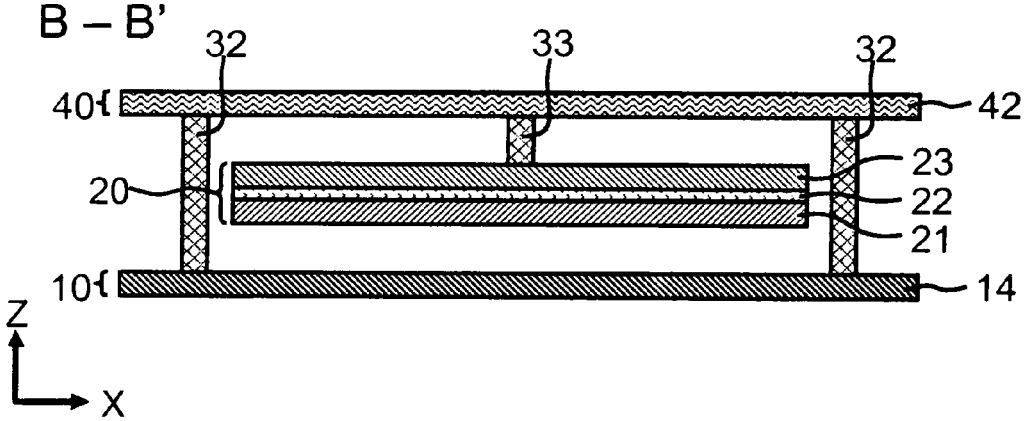
Figure 5C:
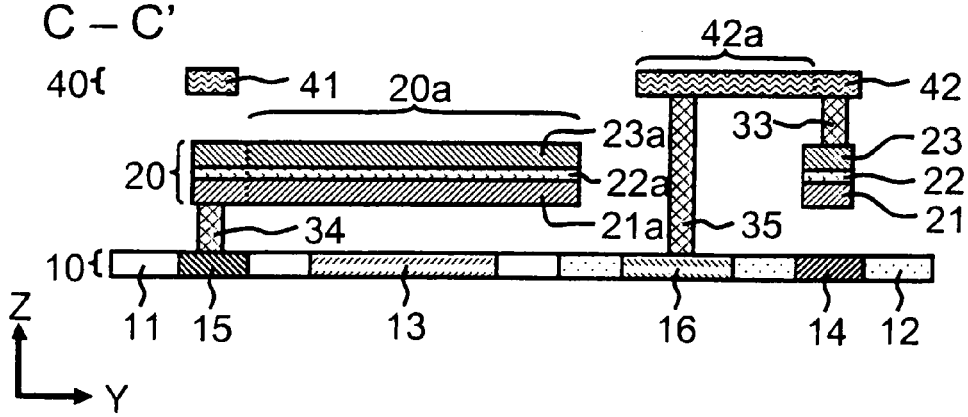
Figure 6:
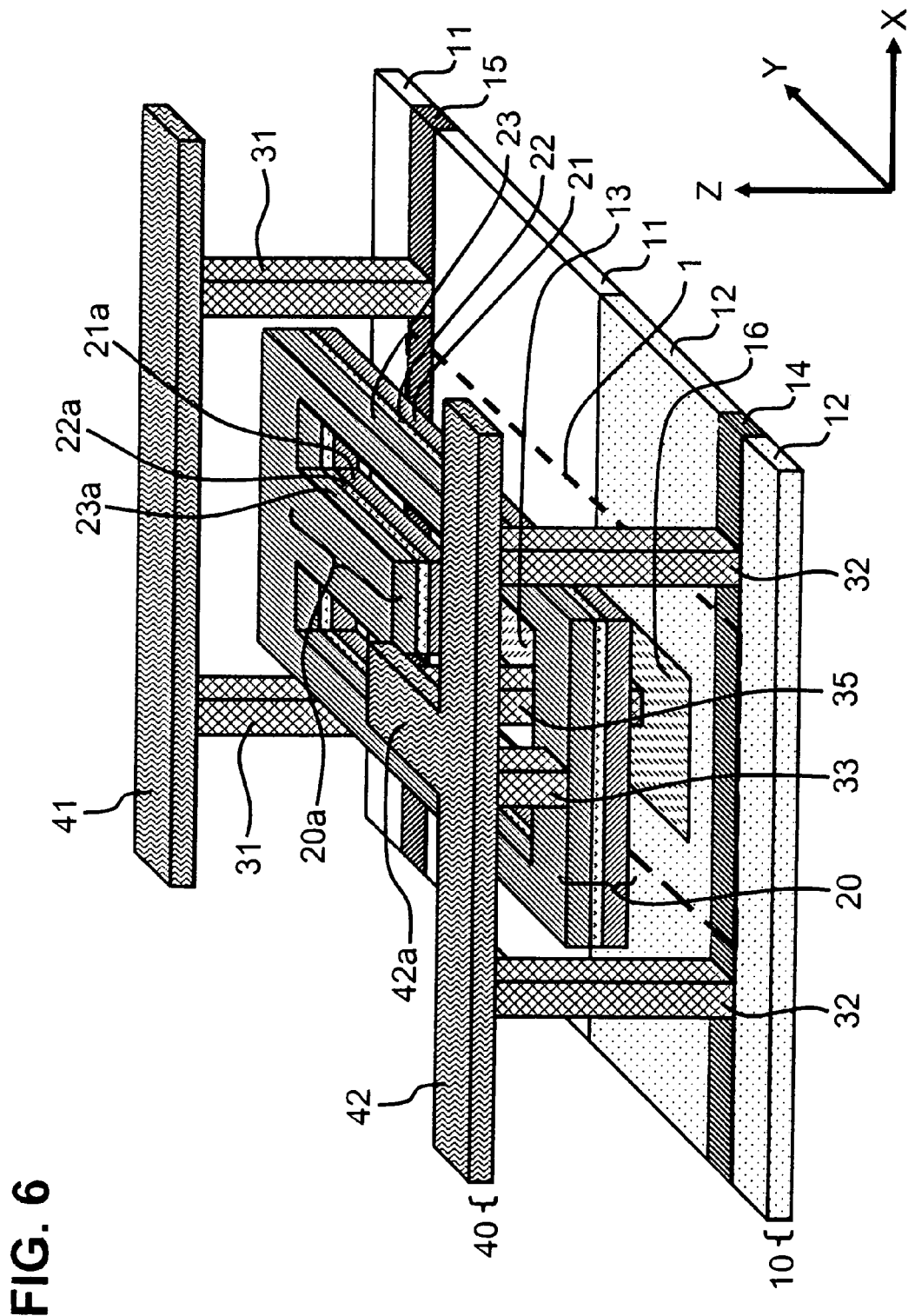
FIG. 6 is a schematic perspective view showing the structure of the standard cell region with its vicinity in the semiconductor integrated circuit device according to Example 2.

A semiconductor integrated circuit device according to Example 2 of the present disclosure will now be described with reference to the drawings. FIG. 4 depicts a schematic plan view showing the structure of a standard cell region and its neighboring part in the semiconductor integrated circuit device according to Example 2 of the present disclosure. FIGS. 5A, 5B and 5C depict schematic cross-sectional views showing the structure of a standard cell region and its neighboring part of the semiconductor integrated circuit device according to Example 2. Specifically, FIGS. 5A, 5B and 5C show cross-sectional views taken along lines A-A', B-B' and C-C' of FIG. 4, respectively. FIG. 6 depicts a schematic perspective view showing the structure of a standard cell region and its neighboring part of the semiconductor integrated circuit device according to Example 2.

Example 2 is a modification of Example 1. In the present Example 2, there is provided a portion connecting to the capacitance 20, such as an extended portion 20a of FIG. 4, within a frame shape of the capacitance 20 insofar such portion is not in conflict with power supply lines or signal interconnects necessary for the standard cell circuit. Except the capacitance 20 (the first electrode 21, dielectric member 22 and the second electrode 23), the second power supply line 42 and the second capacitance contact 35, the present Example 2 is similar in configuration to Example 1.

The capacitance 20 of Example 1 (see FIG. 1) is formed by a capacitance having a preset width in each of the X-axis direction and the Y-axis direction within an area inside an outer rim (boundary) of the standard cell region 1, which area includes the regions of the power supply lines 41, 42. The reason no portions of the capacitance 20 are provided inside the frame shape the capacitance 20 is that it is necessary to provide a region set (reserved) for a substrate contact in order to implement a circuit within the standard cell region 1. However, in case no substrate contact to implement a circuit is provided in a standard cell, such that there is an area within the frame shape of the capacitance 20 in which it is possible to construct a portion of the capacitance 20, the capacitance 20 may be constructed within the frame shape of the capacitance 20 as well. Such a case in which the capacitance 20 is arranged in a region devoid of the substrate contact will now be explained.

In Example 2, suppose that a region devoid of a substrate contact(s) to implement a circuit within the standard cell region 1 extends from a lower side of the first power supply line 41 to a halfway portion of the standard cell, as shown in FIGS. 4 to 6. In this case, there is provided an extended portion 20a (extended portions 21a, 22a, 23a) for extending from the capacitance 20 to a site halfway in an inner area of the standard cell along the Y-axis. The second power supply line 42 includes a portion 42a extended to an area superposed with the fourth diffusion region 16. The extended portion 42a is electrically connected to the fourth diffusion region 16 via the third capacitance contact 35. The extended portion 20a is formed so as to be superposed neither with the extended portion 42a nor with the third substrate contact.

In similar manner, if the third substrate contact 35, shown in FIGS. 4 to 6, is not provided, the extended portion 20a may be provided traversing the standard cell in its entirety. Viz., the foremost part of the extended portion 20a may be extended to the side of the capacitance 20 superposed with the second power supply line 42, rather than up to the vicinity of the junction between the first well 11 and the second well 12.

There may be provided no substrate contact(s) in the standard cell region 1, although such case is not shown. In this case, the capacitance 20 may be constructed in the standard cell region in its entirety.

In the present Example 2, the meritorious effects similar to those of Example 1 may be achieved. In addition, if there is such a region in the standard cell region 1 in which there is no substrate contact(s) to implement a circuit within the standard cell region 1, a capacitance 20 may be arranged in such region. By so doing, the decoupling capacitance provided in the LSI may be enhanced to render it possible to suppress power supply voltage fluctuations.

EXAMPLE 3

Figure 7:
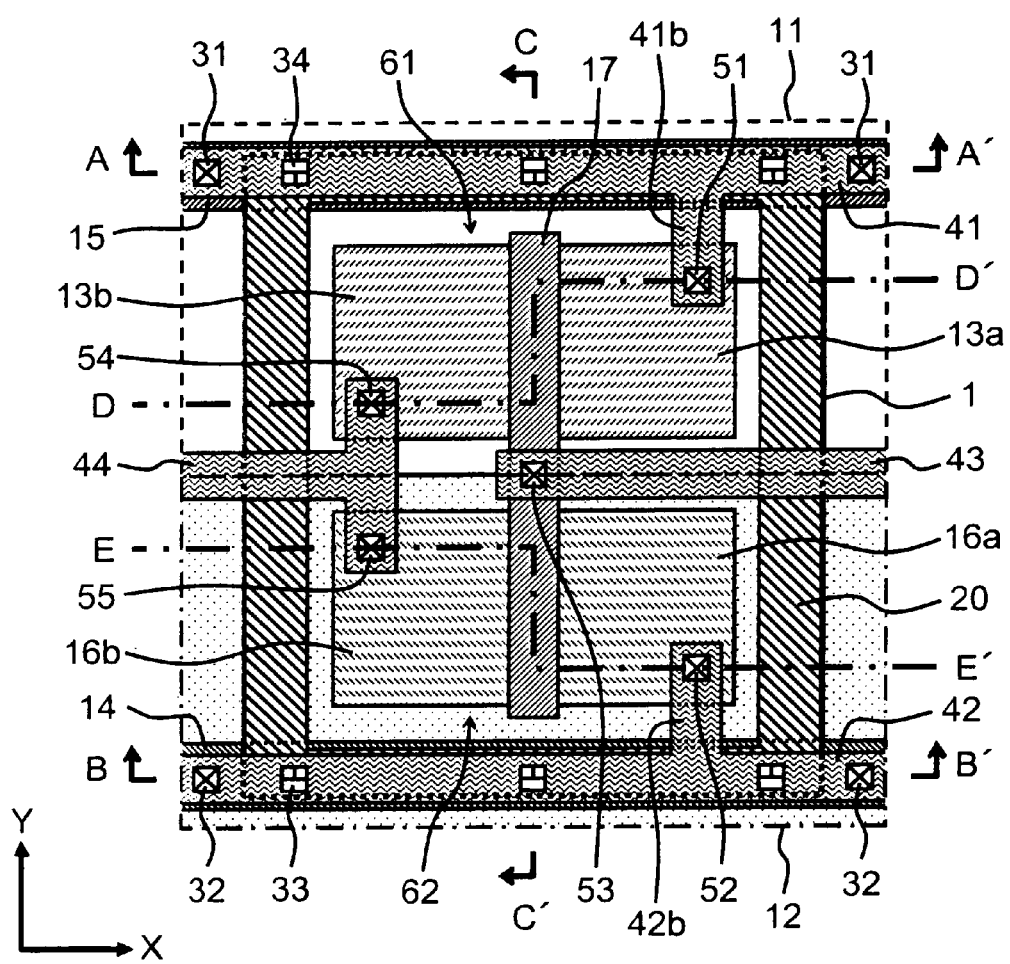
FIG. 7 is a schematic plan view showing the structure of essential portions of a semiconductor integrated circuit device according to Example 3 of the present disclosure.
Figure 8A:
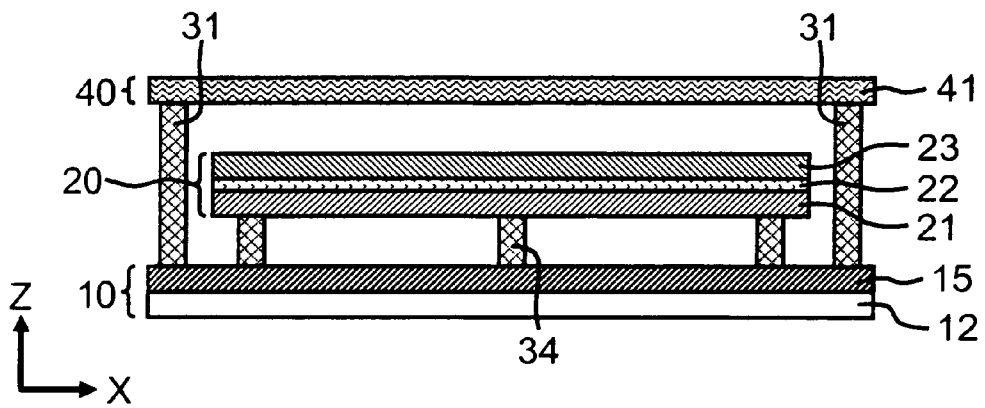
FIGS. 8A, 8B and 8C are cross-sectional views, taken along lines A-A', B-B' and C-C' of FIG. 7, for illustrating the structure of essential portions of the semiconductor integrated circuit device according to Example 3.
Figure 8B:
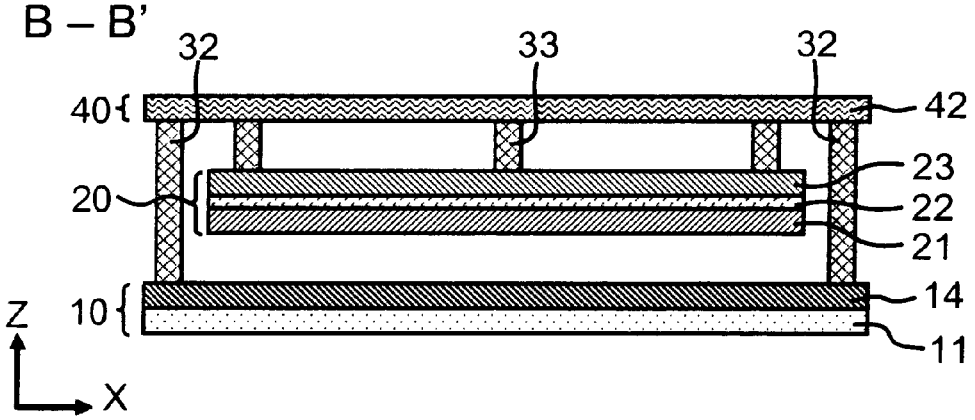
Figure 8C:
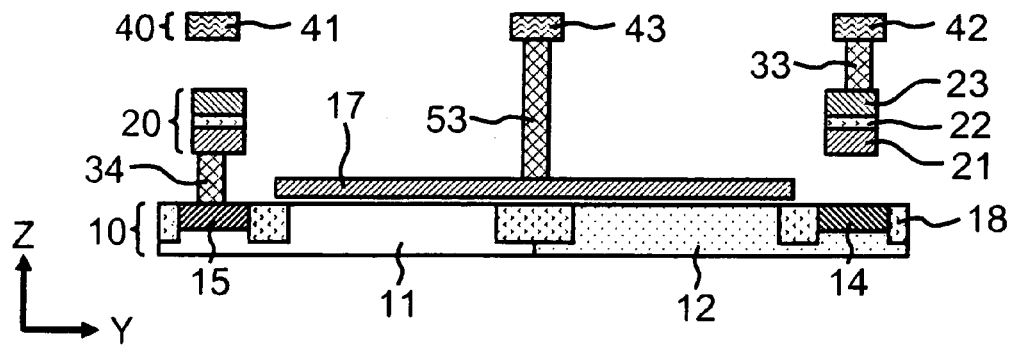
Figure 9A:
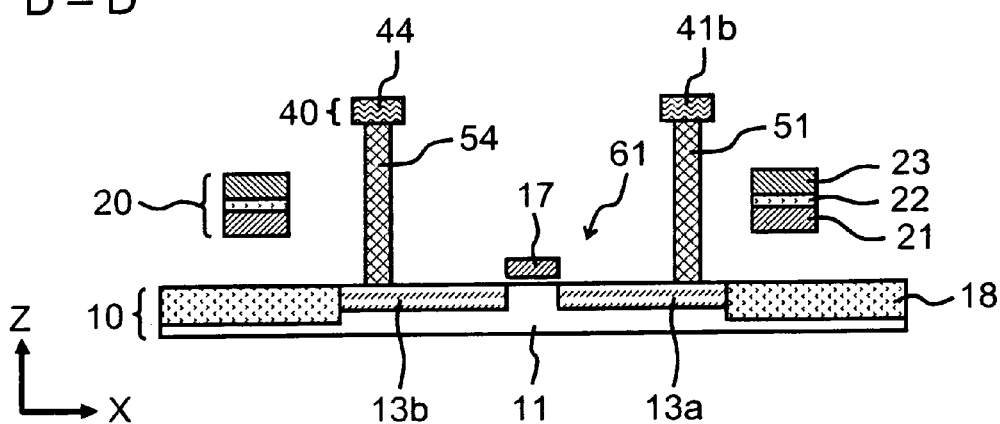
FIGS. 9A and 9B are cross-sectional views, taken along lines D-D' and E-E' of FIG. 7, for illustrating the structure of essential portions of the semiconductor integrated circuit device according to Example 3.
Figure 9B:
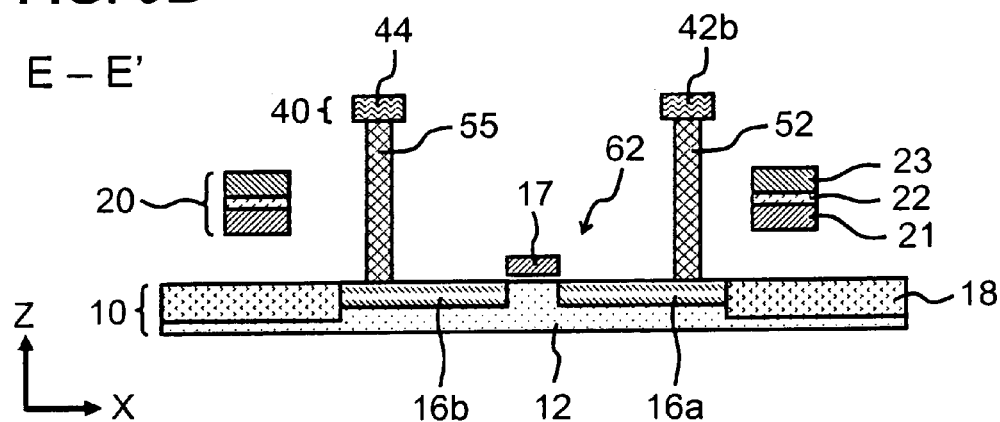
Figure 10:
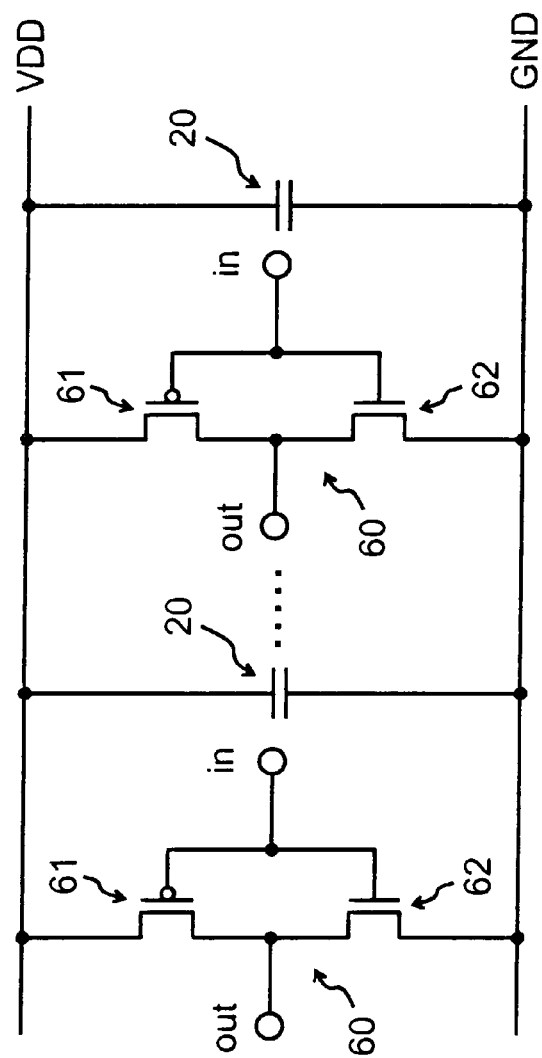
FIG. 10 is a diagram schematically showing a circuit of the semiconductor integrated circuit device according to Example 3.

A semiconductor integrated circuit device according to Example 3 of the present disclosure will now be described with reference to the drawings. FIG. 7 depicts a schematic plan view showing the structure of essential portions of the semiconductor integrated circuit device according to Example 3.FIGS. 8A, 8B and 8C show cross-sectional views taken along lines A-A', B-B' and C-C' of FIG. 7, respectively, and specifically show the structure of essential portions of the semiconductor integrated circuit device according to Example 3. FIGS. 9D and 9E show cross-sectional views taken along lines D-D' and E-E' of FIG. 7, respectively, and specifically show the structure of essential portions of the semiconductor integrated circuit device according to Example 3.FIG. 10 depicts a diagram schematically showing a circuit of the semiconductor integrated circuit device according to Example 3.

Example 3 is a modification of Example 1 applied to a semiconductor integrated circuit device in which a logic gate is constructed by a CMIS (Complementary MIS) inverter (logic circuit) made up of a p-type MIS (Metal Insulator Semiconductor) transistor and an n-type MIS transistor. It is observed that the semiconductor integrated circuit device according to Example 3 may be manufactured using any suitable known methods.

The semiconductor integrated circuit device of Example 3 includes an interconnect layer 40 above a substrate structure layer 10 at a preset distance therefrom (see FIGS. 8 and 9). In the semiconductor integrated circuit device of Example 3, a frame-shaped capacitance 20 is arranged between the substrate structure layer 10 and the interconnect layer 40.

In the substrate structure layer 10, a first well 11 and a second well 12 are arranged side-by-side on the semiconductor substrate, not shown, such as monocrystalline silicon substrate, along the Y-axis direction. The second well 12 is of the opposite electrical conductivity type to that of the first well 11. A third diffusion region is arranged on the first well 11 for extending in the X-axis direction. First diffusion regions 13a, 13b operating as source/ drain regions are arranged on either sides of a channel for extending towards the second well 12 away from the third diffusion region 15. The third diffusion region 15 is a diffusion region of the same conductivity type as that of the first well 11 and is higher in impurity concentration than the first well 11. The first diffusion regions 13a, 13b are the diffusion regions of the opposite conductivity type to that of the first well 11. A second diffusion region 14 is arranged on the second well 12 for extending in the X-axis direction. Fourth diffusion regions 16a, 16b operating as source/ drain regions are arranged on either sides of the channel for extending towards the first well 11 away from the second diffusion region 14. The second diffusion region 14 is a diffusion region of the same conductivity type as that of the second well 12 and is higher in impurity concentration than the second well 12. The fourth diffusion regions 16a, 16b are the diffusion regions of the opposite conductivity type to that of the second well 12. A device isolation region 18 is formed by, for example, STI or LOCOS around first diffusion regions 13a, 13b on the first and second wells 11, 12 except the channel-forming area, around the fourth diffusion regions 16a, 16b, around the second diffusion region 14, on either sides of the second diffusion region 14, and on either sides of the third diffusion region 15. The layer of the wells 11, 12, diffusion regions 13 to 16 and the device isolation region 18 makes up the substrate structure layer 10.

A gate electrode 17 is arranged on top of a channel between the first diffusion regions 13a, 13b and on top of a channel between the fourth diffusion regions 16a, 16b, via a gate insulation film, not shown. The gate electrode 17 and the first diffusion regions 13a, 13b make up a MIS transistor 61, while the gate electrode 17 and the fourth diffusion regions 16a, 16b make up another MIS transistor 62. The gate electrode 17 is a common gate electrode of the MIS transistors 61, 62 and extends along the Y-axis direction astride the boundary line between the wells 11, 12. The MIS transistors 61, 62 are of opposite polarities relative to each other. The combination of the MIS transistors 61, 62 provides a standard cell 60 (see FIG. 10).

The interconnect (wiring) layer 40 is arranged on the substrate structure layer 10 separated therefrom via an interlayer insulation film, not shown. In the interconnect layer 40, a first power supply line 41 and a second power supply line 42 are arranged in parallel with or substantially in parallel with each other at a preset distance therebetween. In an area between the first power supply line 41 and the second power supply line 42, an input side interconnect 43 and an output side interconnect 44 are arranged spaced apart from each other (see FIG. 7). The first power supply line 41 and the second power supply line 42 are connected to respective different power supply potentials, such that VDD (positive potential) and GND (ground potential) may be applied to one of the power supply lines and to the remaining power supply line. When seen along the Z-axis, the first power supply line 41 is arranged superposed with the third diffusion region 15, and is electrically connected to the third diffusion region 15 via one or more of first substrate contacts 31 in an area not superposed with the capacitance 20 (see FIG. 8A). When seen along the Z-axis, the second power supply line 42 is arranged superposed with the second diffusion region 14 and, in a region not superposed with the capacitance 20, is electrically connected to the second diffusion region 14 via one or more of second substrate contacts 32 (see FIG. 8B).

The first power supply line 41 includes a line portion 41b which is branched towards an area overlying the first diffusion region 13a. When seen along the Z-axis, the branched line portion 41b is electrically connected to the first diffusion region 13a via a contact 51 in the area overlying the first diffusion region 13a (see FIG. 9A). The second power supply line 42 includes a line portion 42b which is branched towards an area overlying the fourth diffusion region 16a. When seen along the Z-axis, the branched line portion 42b is electrically connected to the fourth diffusion region 16a via a contact 52 in the area overlying the fourth diffusion region 16a (see FIG. 9B). The input side interconnect 43 is an interconnect jointed to an input terminal ("in" of FIG. 10). When seen along the Z-axis, the input side interconnect 43 is electrically connected to the gate electrode 17 via contact 53 in an area overlying the gate electrode 17 (see FIG. 8C). The output side interconnect 44 is an interconnect connected to an output terminal (out in FIG. 10). When seen along the Z-axis, the output side interconnect 44 is electrically connected, in an area overlying the first diffusion region 13b and the fourth diffusion region 16b, to the first diffusion region 13b and the fourth diffusion region 16b via contacts 54, 55, respectively (see FIGS. 9A and 9B). With the above mentioned interconnection relationship, the standard cell 60, made up of the MIS transistors 61, 62, constitutes a CMIS inverter (see FIG. 10).

The capacitance 20 is arranged within an interlayer insulation film, not shown, provided in a space between the substrate structure layer 10 and the interconnect layer 40. When seen along the Z-axis, the capacitance 20 is formed in a frame shape extending along an outer contour line of the standard cell 60 formed by combining the transistors 61, 62. The capacitance 20 may also be formed in a U-shape. The capacitance 20 is arranged between an overlap region of the first power supply line 41 with the third diffusion region 15 and an overlap region of the second power supply line 42 with the second diffusion region 14. The capacitance 20 is also arranged in the overlap region of the first power supply line 41 with the third diffusion region 15 and in the overlap region of the second power supply line 42 with the second diffusion region 14. The region surrounded by an outer rim (boundary) of the capacitance 20 plays the role of the standard cell region 1. The capacitance 20 is made up of a first electrode 21, a dielectric member 22 and a second electrode 23 stacked together sequentially beginning from the substrate structure layer 10 (see FIGS. 8 and 9). When seen along the Z-axis, the first electrode 21 is electrically connected to the third diffusion region 15, via one or more of first capacitance contacts 34, in a region superposed with the third diffusion region 15 (see FIGS. 8A and 8C). When seen along the Z-axis, the second electrode 23 is electrically connected to the second power supply line 42 via one or more of second capacitance contacts 33 in an area overlying the second power supply line 42 (see FIGS. 8B and 8C). At least one capacitance 20 is associated with each standard cell 60 (see FIG. 10).

The capacitance 20 is arranged between the VDD and the GND to play the role of a so-called decoupling capacitor (bypass capacitor) and, during the high-speed transistor switching operation, may play the role of suppressing the generation of the power supply noise. The charges stored in the capacitance 20 are discharged the instant a power supply noise is generated to compensate for variations in the power supply value. The capacitance 20 is preferably set at a higher capacitance value in order to reduce the power supply noise to as small a value as possible. The capacitance 20 has a constant width both along the X-axis, direction and along the Y-axis direction (directions towards the inside of the cell). The width of the capacitance 20 is selected so as not to produce shorting with the substrate contacts 31, 32 arranged within the standard cell region 1 to implement a circuit. If it is desired to increase the capacitance value of the capacitance 20, there may be provided an extended portion (20a of FIG. 4), such as one provided in Example 2.

A plurality of the standard cells 60 of the semiconductor integrated circuit device may be provided between the VDD and the GND (see FIG. 10). In each stage, the standard cell 60 and the capacitance 20 form a set. If, under clock signal control, an input signal is delivered to an input terminal (in) of the standard cell 60 of the first stage to set the voltage level from the HIGH level to the LOW level, the MIS transistor 61 is turned on, while the MIS transistor 62 is turned off. Hence, the VDD potential is output via the MIS transistor 61 in its on-state to an output terminal (out). Consequently, the output signal is inverted from the LOW level to the HIGH level. An output of the standard cell 60 of the first stage is delivered to the standard cell 60 of the second stage.

In FIG. 10, since the capacitance 20 is provided between VDD and GND, electrical charges have been stored in the capacitance 20. Thus, if the MIS transistor 61 is turned on to allow the current to flow from VDD to an output, the electrical charges stored in the capacitance 20 are instantaneously discharged to reduce the power supply noise generation.

Moreover, if the power supply noise is generated in the first stage standard cell 20, the power supply noise may be removed by the capacitance 20 before the power supply noise is transmitted to a spaced apart nth stage standard cell 60 spaced apart with respect to the path. In addition, if the power supply is low in voltage, it is possible to prevent malfunctions otherwise produced by the power supply noise.

In Example 3, the standard cell 20 is an inverter. However, the standard cell 20 may be a NAND gate, a NOR gate or the like logic circuit. It is observed that the logic gate is known per se and hence is not here explained.

In Example 3, as in Example 1, a decoupling capacitor may be constructed without increasing the area taken up by the LSI. Additionally, the design TAT may be shortened.

EXAMPLE 4

Figure 11:
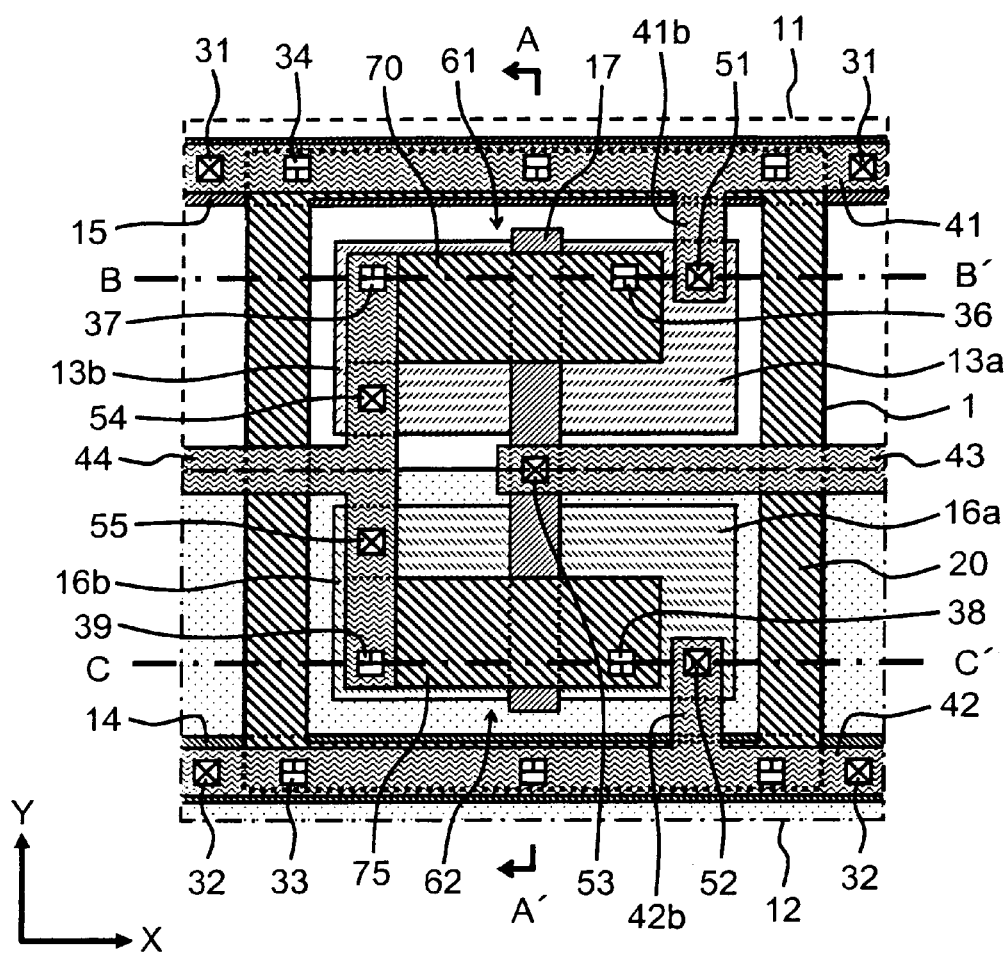
FIG. 11 is a schematic plan view showing essential portions of a semiconductor integrated circuit device according to Example 4 of the present disclosure.
Figure 12A:
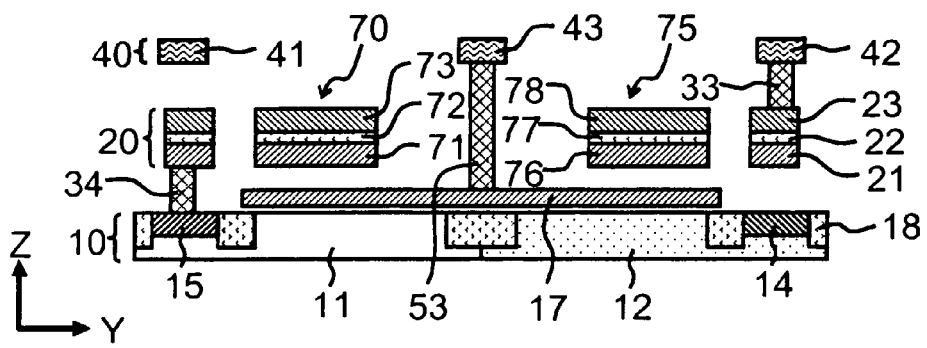
FIGS. 12A, 12B and 12C are cross-sectional views, taken along lines A-A', B-B' and C-C' of FIG. 11, for illustrating the structure of essential portions of the semiconductor integrated circuit device according to Example 4.
Figure 12B:
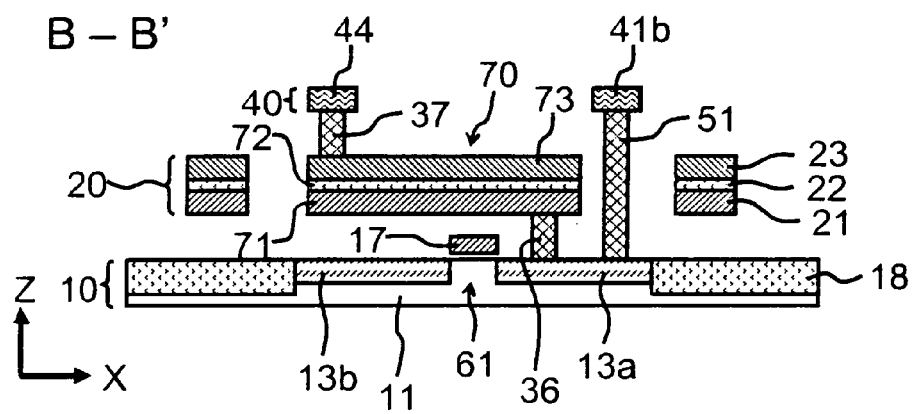
Figure 12C:
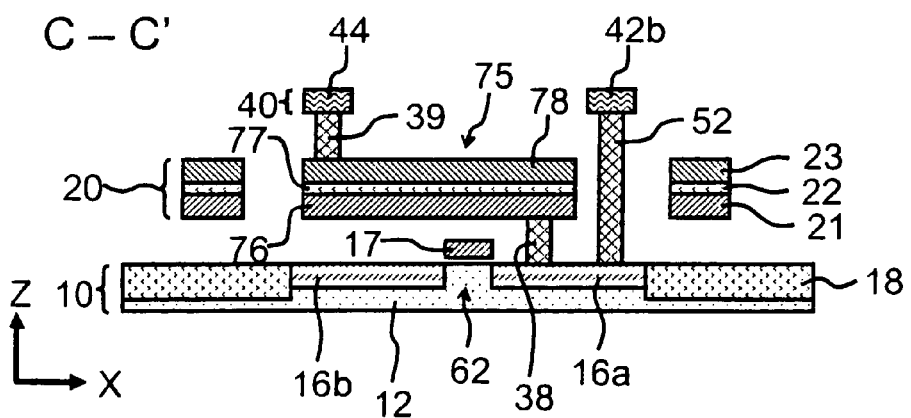
Figure 13:
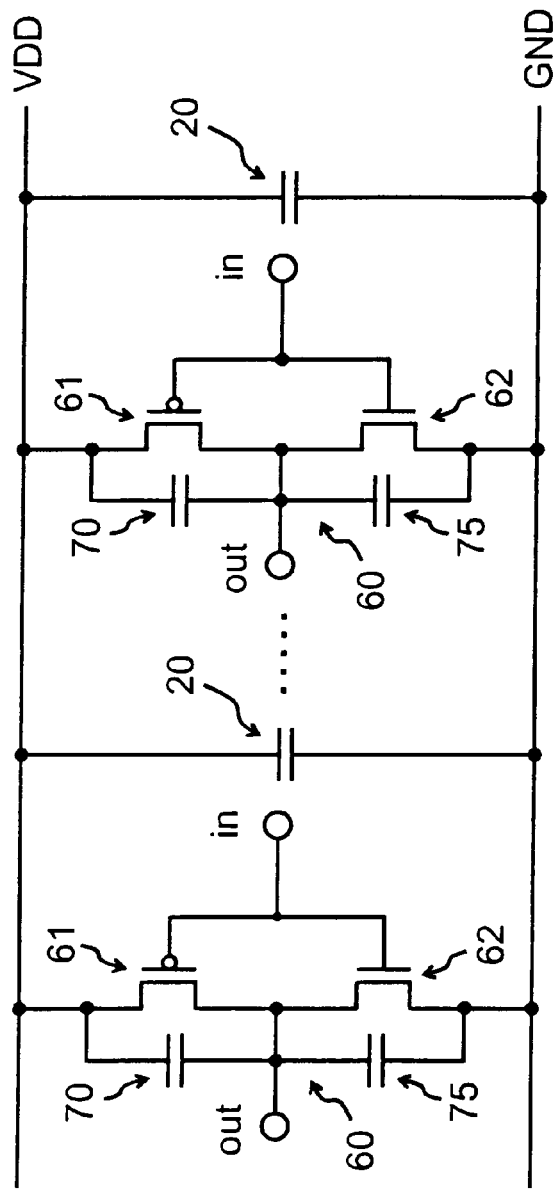
FIG. 13 is a diagram schematically showing a circuit of the semiconductor integrated circuit device according to Example 4.

The semiconductor integrated circuit device according to Example 4 of the present disclosure will now be described with reference to the drawings. FIG. 11 depicts a plan view schematically showing the structure of essential portions of the semiconductor integrated circuit device according to Example 4 of the present disclosure. FIGS. 12A to 12C schematically show the structure of essential portions of the semiconductor integrated circuit device according to Example 4 of the present disclosure and are cross-sectional views taken along lines A-A', B-B' and C-C' of FIG. 11, respectively. FIG. 13 depicts a diagram showing a circuit of the semiconductor integrated circuit device according to Example 4.

Example 4 is a modification of Example 3 in which a capacitance 70 is added between the first power supply line 41 (VDD) and the output side interconnect 44 (output terminal out) and in which a capacitance 75 is added between the second power supply line 42 (GND) and the output side interconnect 44 (output terminal out). The present Example 4 is the same as Example 3 in configuration except the capacitances 70, 75.

The capacitances 70, 75 are arranged internally of the frame-shaped capacitance 20. The capacitance 70 is arranged in the first well 11 inside of the frame shape of the capacitance 20. The capacitance 70 may also be arranged above the MIS transistor 61. The capacitance 75 is arranged in the second well 12 inside of the frame shape of the capacitance 20. The capacitance 75 may also be arranged above the MIS transistor 62. The capacitances 70, 75 are arranged between the substrate structure layer 10 and the interconnect layer 40 in the same layer as the capacitance 20. The capacitances 20, 70, 75 are spaced apart from one another.

Like the capacitance 20, the capacitance 70 is made up of a first electrode 71, a dielectric member 72 and a second electrode 73, sequentially stacked together in this order from the side the substrate structure layer 10 (see FIG. 12). The first electrode 71 is electrically connected to the first diffusion region 13a, via a third capacitance contact 36, in an area overlying the first diffusion region 13a when seen along the Z-axis (see FIG. 12B). Consequently, the first electrode 71 is electrically connected to the first power supply line 41 via the third capacitance contact 36, first diffusion region 13a, contact 51 and the branched line portion 41b. The second electrode 73 is electrically connected to the output side interconnect 44, via a fourth capacitance contact 37, in an area overlying the output side interconnect 44 when seen along the Z-axis (see FIG. 12B). It is observed that the capacitance 70 is spaced apart from the contacts 51, 53, 54.

Like the capacitance 20, the capacitance 75 is made up of a first electrode 76, a dielectric member 77 and a second electrode 78, sequentially stacked together in this order from the side the substrate structure layer 10 (see FIG. 12). The first electrode 76 is electrically connected to the fourth diffusion region 16a via a fifth capacitance contact 38 in an area overlying the fourth diffusion region 16a when seen along the Z-axis (see FIG. 12C). Consequently, the first electrode 76 is electrically connected to the second power supply line 42 via the fifth capacitance contact 38, fourth diffusion region 16a, contact 52 and the branched line portion 42b. The second electrode 78 is electrically connected to the output side interconnect 44, via a sixth capacitance contact 39, in an area overlying the output side interconnect 44 when seen along the Z-axis (see FIG. 12C). It is observed that the capacitance 70 is spaced apart from the contacts 52, 53, 55.

It is observed that the output side interconnect 44 is configured to be electrically connected to the second electrodes 73, 78 via capacitance contacts 37, 39. At least each one of the capacitances 20, 70, 75 is associated with the standard cell 60 (see FIG. 13).

In the Example 4, the same meritorious effect as that of Example 3 may be achieved. In addition, since the DRAM capacitance, inherently aimed to hold a value of an electrical charge, is used as the capacitance 70 or 75 of the interconnect within the standard cell 60, the charging/discharging time (τ=RC) may be prolonged. Since it is no longer necessary to arrange a buffer cell or a capacitor cell, the LSI area may be suppressed from being increased.

In the conventional technique, it has been necessary to increase the area taken up by the LSI because a buffer cell or a capacitor cell has to be provided to add the delay time to assure the hold timing. There is no necessity of doing so in the present Example 3.

Moreover, in the present Example 4, in which the capacitances 70, 75 are provided within the standard cell region 1, it is possible to make fine adjustment of the delay time, desired to be increased, without affecting the placement of pre-existing cells. By so doing, the ill effects on the placement of pre-existing cells or on the shape of the interconnects may be suppressed, thus shortening the design time.

EXAMPLE 5

Figure 14:
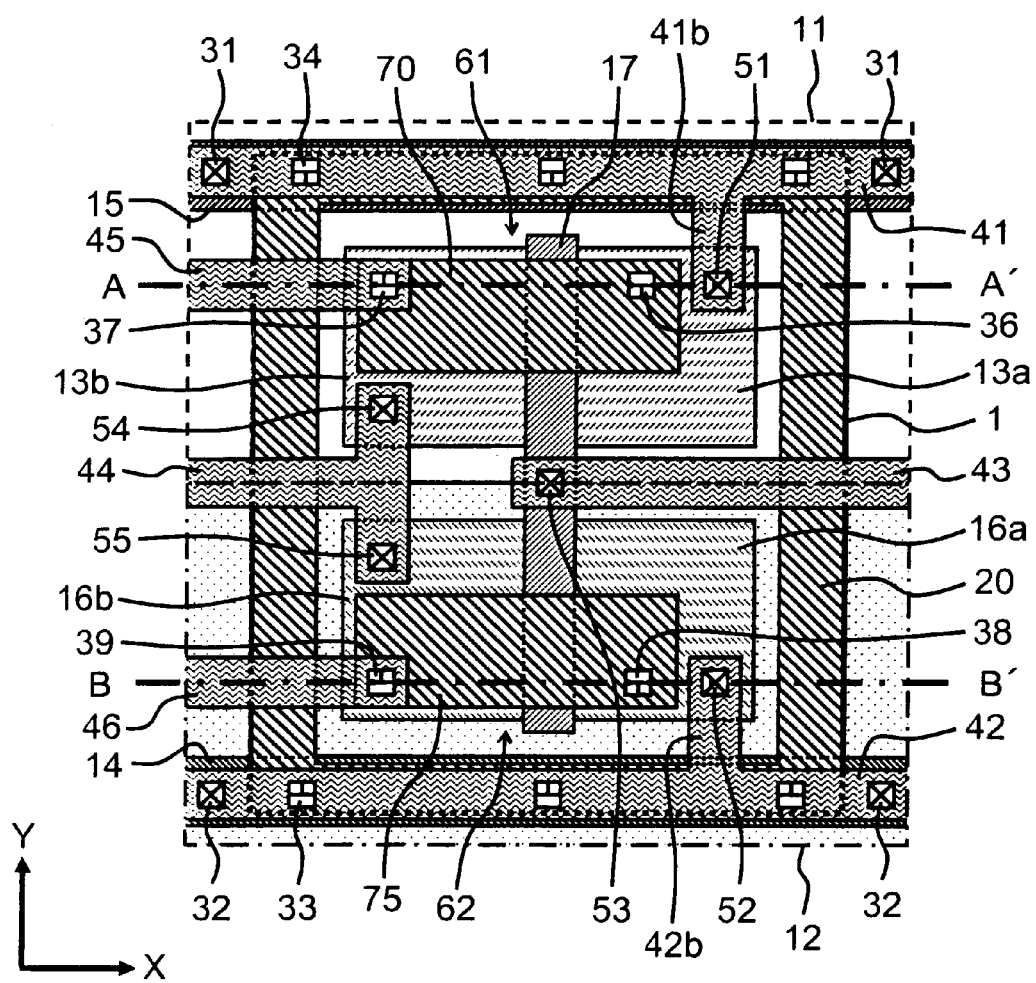
FIG. 14 is a schematic plan view showing essential portions of a semiconductor integrated circuit device according to Example 5 of the present disclosure.
Figure 15A:
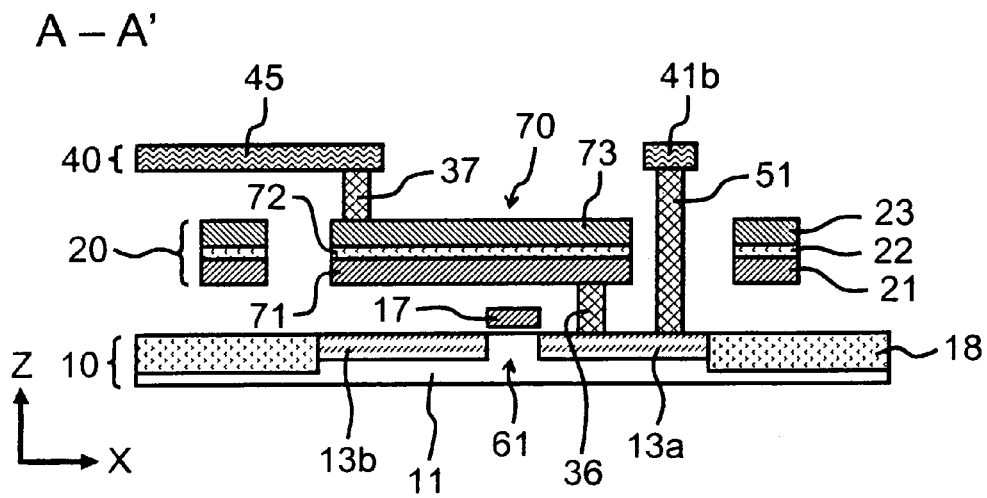
FIGS. 15A and 15B are cross-sectional views, taken along lines A-A' and B-B' of FIG. 14, for illustrating the structure of essential portions of the semiconductor integrated circuit device according to Example 5.
Figure 15B:
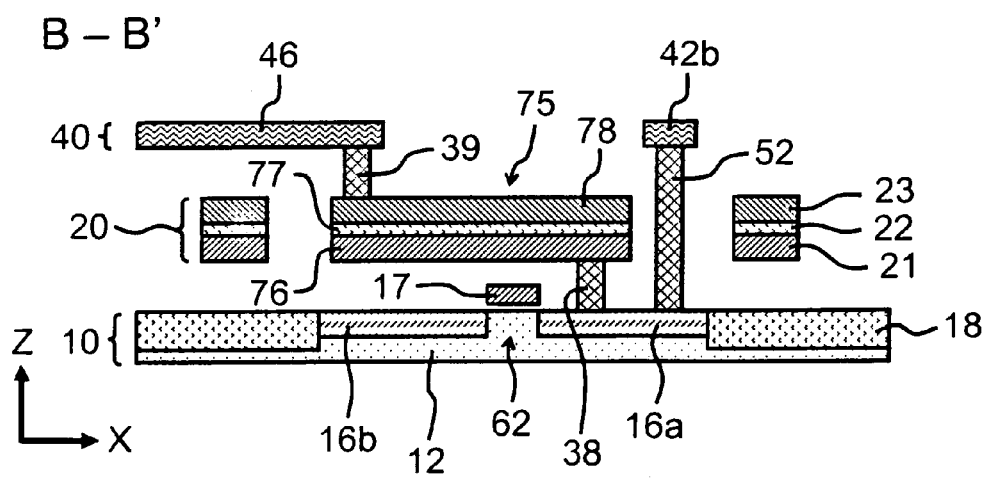
Figure 16:
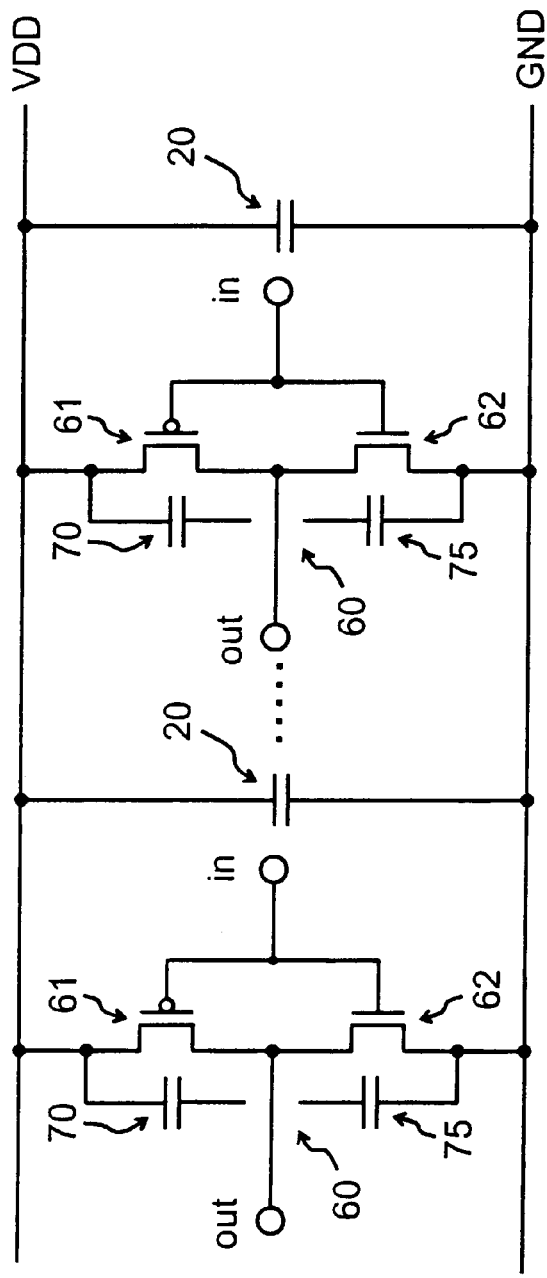
FIG. 16 is a diagram schematically showing a circuit of the semiconductor integrated circuit device according to Example 5.

The semiconductor integrated circuit device according to Example 5 of the present disclosure will now be described with reference to the drawings. FIG. 14 schematically shows the structure of essential portions of the semiconductor integrated circuit device according to Example 5.FIGS. 15A and 15B depict cross-sectional views taken along lines A-A' and B-B" of FIG. 14, respectively, and schematically show the structure of essential portions of the semiconductor integrated circuit device according to Example 5. FIG. 16 depicts a diagram showing a circuit of the semiconductor integrated circuit device according to Example 5.

The present Example 5 is a modification of Example 4. In the present Example, connecting the capacitance 70, electrically connected to the first power supply line 41, to the output side interconnect 44, is eliminated, while connecting the capacitance 75, electrically connected to the second power supply line 42, to the output side interconnect 44, is also eliminated. The second electrode 73 of the capacitance 70 is electrically connected to an interconnect 45 via the fourth capacitance contact 37, however, the destination of connection of the interconnect 45 is not specified (see FIG. 15A). The second 20, electrode 78 of the capacitance 75 is electrically connected to an interconnect 46 via the sixth capacitance contact 39, however, the destination of connection of the interconnect 46 is not specified (see FIG. 15B). The interconnects 45, 46 are provided in the interconnect layer 40 and are spaced apart from the other lines or interconnects 41 to 44. The output side interconnect 44 is laid so as not to conflict with the interconnects 45, 46. It is observed that the interconnect 45 may be electrically connected to a site where it is desired to provide capacity with respect to the first power supply line 41, for example, to the second power supply line 42. The interconnect 46 may be electrically connected to a site where it is desired to provide capacity with respect to the second power supply line 42, for example, to the first power supply line 41. There may be no destination of connection for the interconnects 45, 46. Otherwise, the configuration of Example 5 is the same as that of Example 4.

With Example 5, the meritorious effects similar to those of Example 4 may be obtained. In addition, the destination of connection of the interconnects 45, 46, electrically connected to the capacitances 70, 75, may be selected as desired.

EXAMPLE 6

Figure 17:
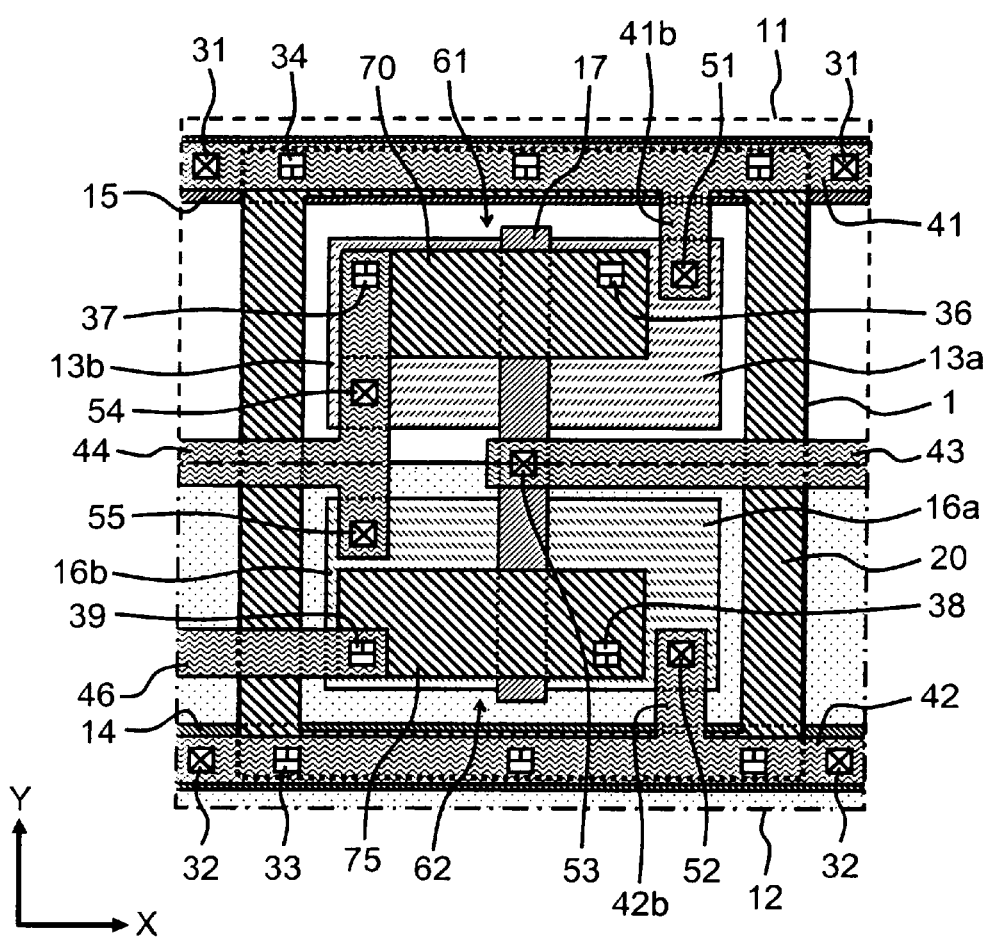
FIG. 17 is a schematic plan view showing essential portions of a semiconductor integrated circuit device according to Example 6 of the present disclosure.
Figure 18:
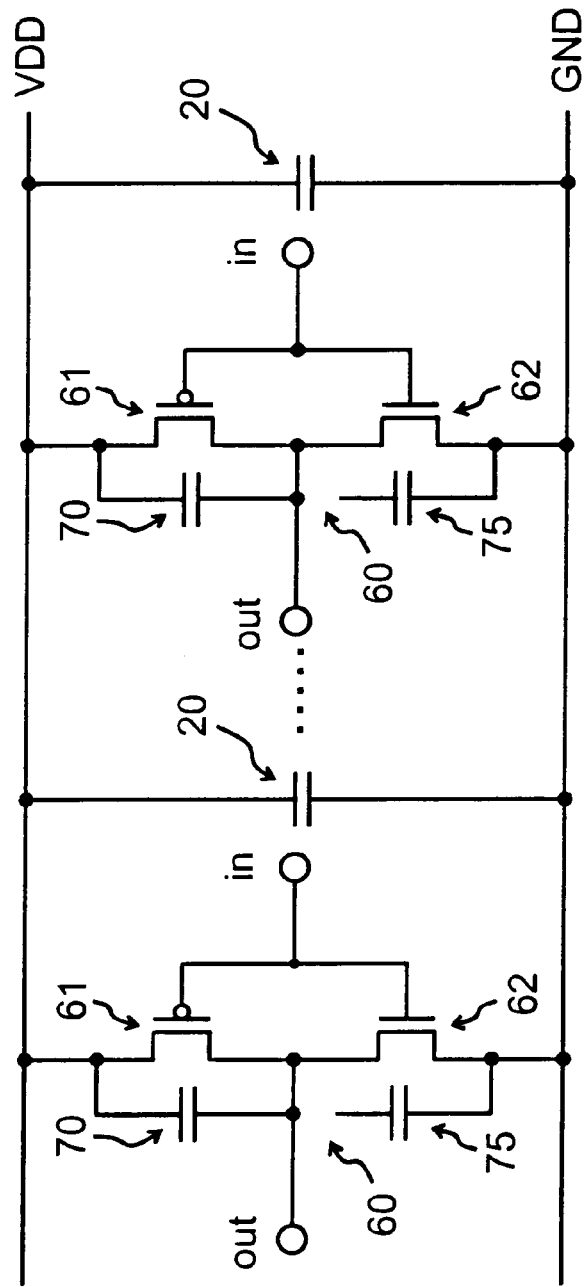
FIG. 18 is a diagram schematically showing a circuit of the semiconductor integrated circuit device according to Example 6.

A semiconductor integrated circuit device according to Example 6 of the present disclosure will now be explained with reference to the drawings. FIG. 17 depicts a schematic plan view showing the structure of essential portions of the semiconductor integrated circuit device according to Example 6. FIG. 18 is a diagram schematically showing a circuit of the semiconductor integrated circuit device according to Example 6.

Example 6 is a modification of Example 4. In Example 6, connecting the capacitance 75, electrically connected to the second power supply line 42, to the output side interconnect 44, is eliminated. A second electrode of the capacitance 75, equivalent to 78 of FIG. 15B, is electrically connected to the interconnect 46 via the sixth capacitance contact 39. However, the destination of connection of the interconnect 46 is not specified. The interconnect 46 is provided in the interconnect layer 40 and is spaced apart from the other lines or interconnects 41 to 44. The output side interconnect 44 is laid so as not to conflict with the interconnect 46. It is observed that the interconnect 46 may be electrically connected to a site where it is desired to provide the capacity relative to the second power supply line 42, for example, to the first power supply line 41. There may be no destination of connection for the interconnect 46. The configuration of the capacitance 70 between the first power supply line 41 and the output side interconnect 44 is similar to that in Example 4. Otherwise, the configuration of Example 6 is the same as that of Example 4.

With Example 6, the meritorious effects similar to those of Example 4 may be obtained. In addition, the destination of connection of the interconnect 46, electrically connected to the capacitance 75, may be selected as desired.

EXAMPLE 7

Figure 19:
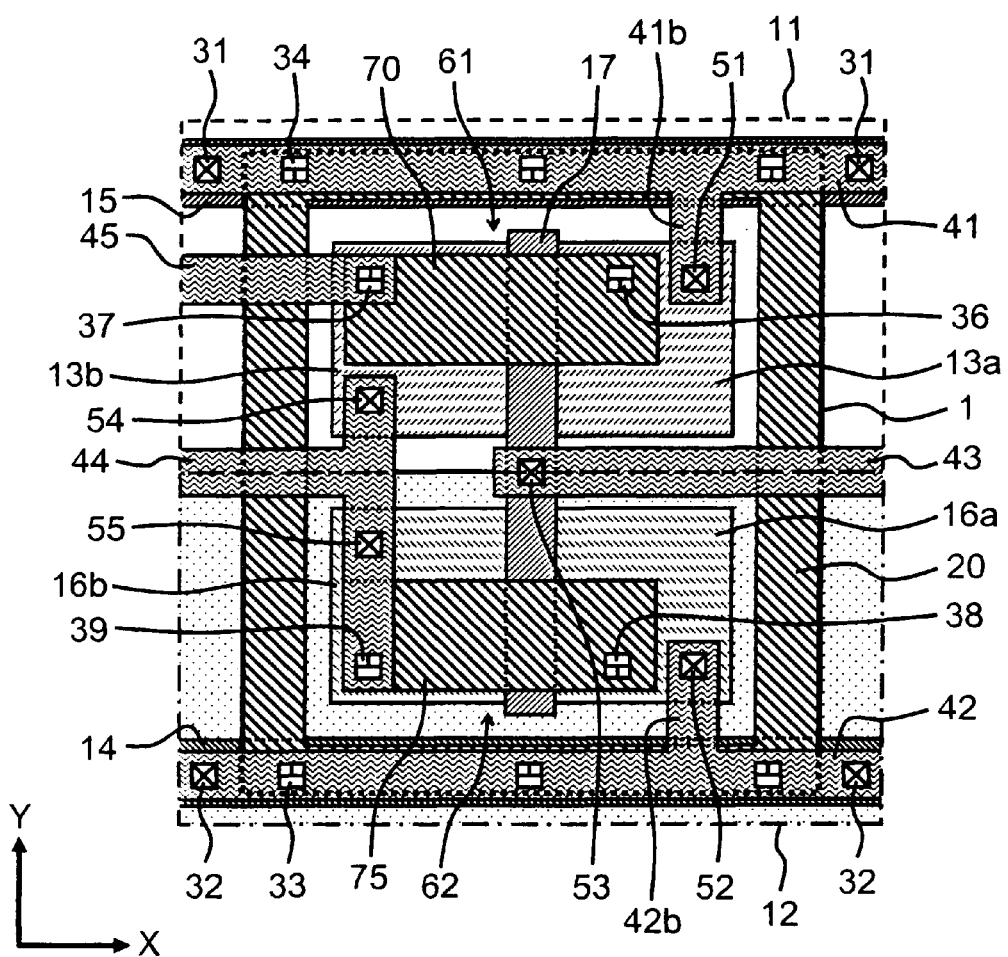
FIG. 19 is a schematic plan view showing essential portions of a semiconductor integrated circuit device according to Example 7 of the present disclosure.
Figure 20:
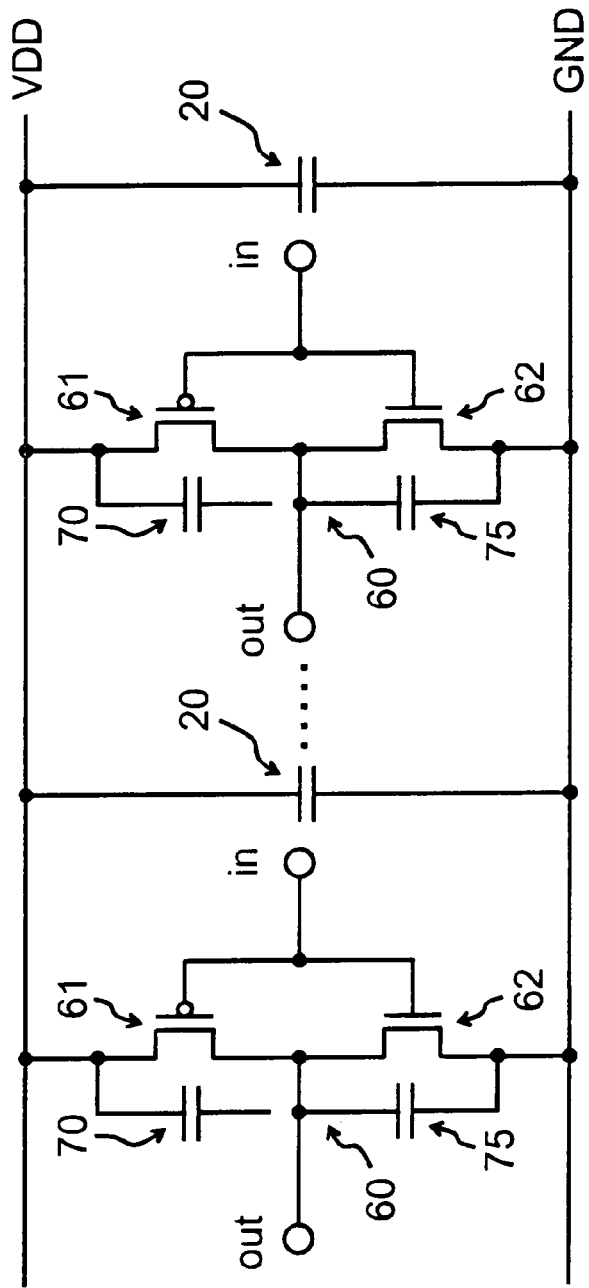
FIG. 20 is a diagram schematically showing a circuit of the semiconductor integrated circuit device according to Example 7.

A semiconductor integrated circuit device according to Example 7 of the present disclosure will now be explained with reference to the drawings. FIG. 19 is a schematic plan view showing the structure of essential portions of the semiconductor integrated circuit device according to Example 7. FIG. 20 is a diagram schematically showing a circuit of the semiconductor integrated circuit device according to Example 7.

Example 7 is a modification of Example 4. In Example 7, connecting the capacitance 70, electrically connected to the first power supply line 41, to the output side interconnect 44, is eliminated. A second electrode of the capacitance 70, equivalent to 73 of FIG. 15A, is electrically connected to the interconnect 45 via the fourth capacitance contact 37, however, the destination of connection of the interconnect 46 is not specified. The interconnect 45 is provided in the interconnect layer 40 and is spaced apart from the other lines or interconnects 41 to 44. The output side interconnect 44 is laid so as not to conflict with the interconnect 45. It is observed that the interconnect 45 may be electrically connected to a site where it is desired to provide the capacity relative to the first power supply line 41, for example, to the second power supply line 42. The interconnect 45 may be electrically connected to a site where it is desired to provide capacity relative to the first power supply line 41, for example, to the second power supply line 42. There may be no destination of connection for the interconnect 46. The configuration of the capacitance 75 between the second power supply line 42 and the output side interconnect 44 is the same as in Example 4. Otherwise, the configuration of Example 7 is the same as that of Example 4.

With Example 7, the meritorious effects similar to those of Example 4 may be obtained. In addition, the destination of connection of the interconnect 45, electrically connected to the capacitance 70, may be selected as desired.

EXAMPLE 8

Figure 21:
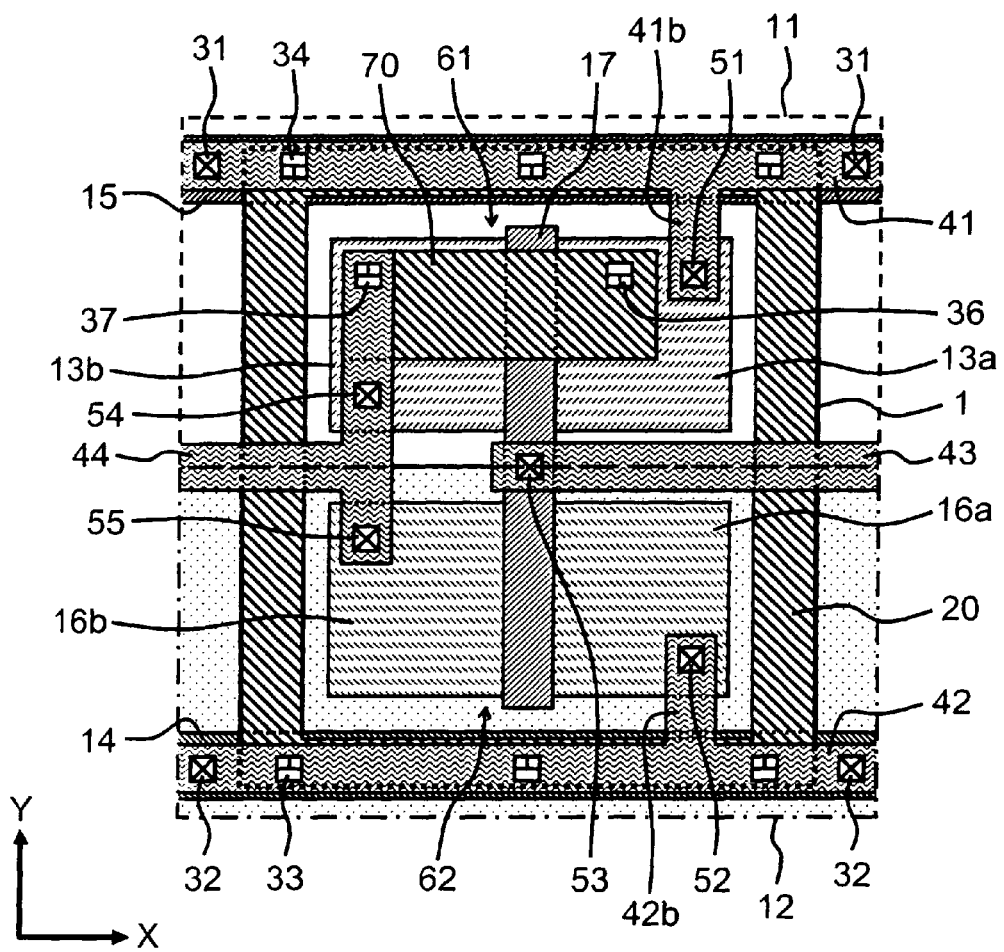
FIG. 21 is a schematic plan view showing essential portions of a semiconductor integrated circuit device according to Example 8 of the present disclosure.
Figure 22:
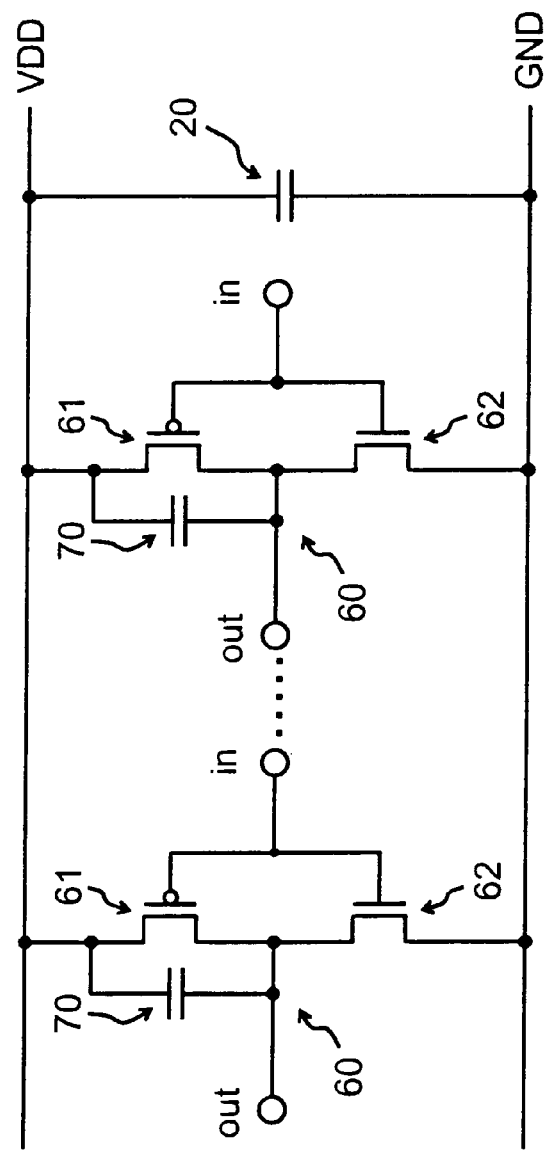
FIG. 22 is a diagram schematically showing a circuit of the semiconductor integrated circuit device according to Example 8.

A semiconductor integrated circuit device according to Example 8 of the present disclosure will now be explained with reference to the drawings. FIG. 21 is a schematic plan view showing the structure of essential portions of the semiconductor integrated circuit device according to Example 8. FIG. 22 is a diagram schematically showing a circuit of the semiconductor integrated circuit device according to Example 8.

Example 8 is a modification of Example 6. In Example 8, the capacitance of Example 6 (75 of FIG. 17), capacitance contacts (38, 39 of FIG. 17) and the interconnect (46 of FIG. 17) are deleted. The capacitance 70 between the first power supply line 41 and the output side interconnect 44 is similar to that of Example 6. Otherwise, the configuration of Example 8 is the same as that of Example 6.

With Example 8, the meritorious effects similar to those of Example 4 may be obtained. In addition, unneeded capacitance(s) may be deleted or reduced.

EXAMPLE 9

Figure 23:
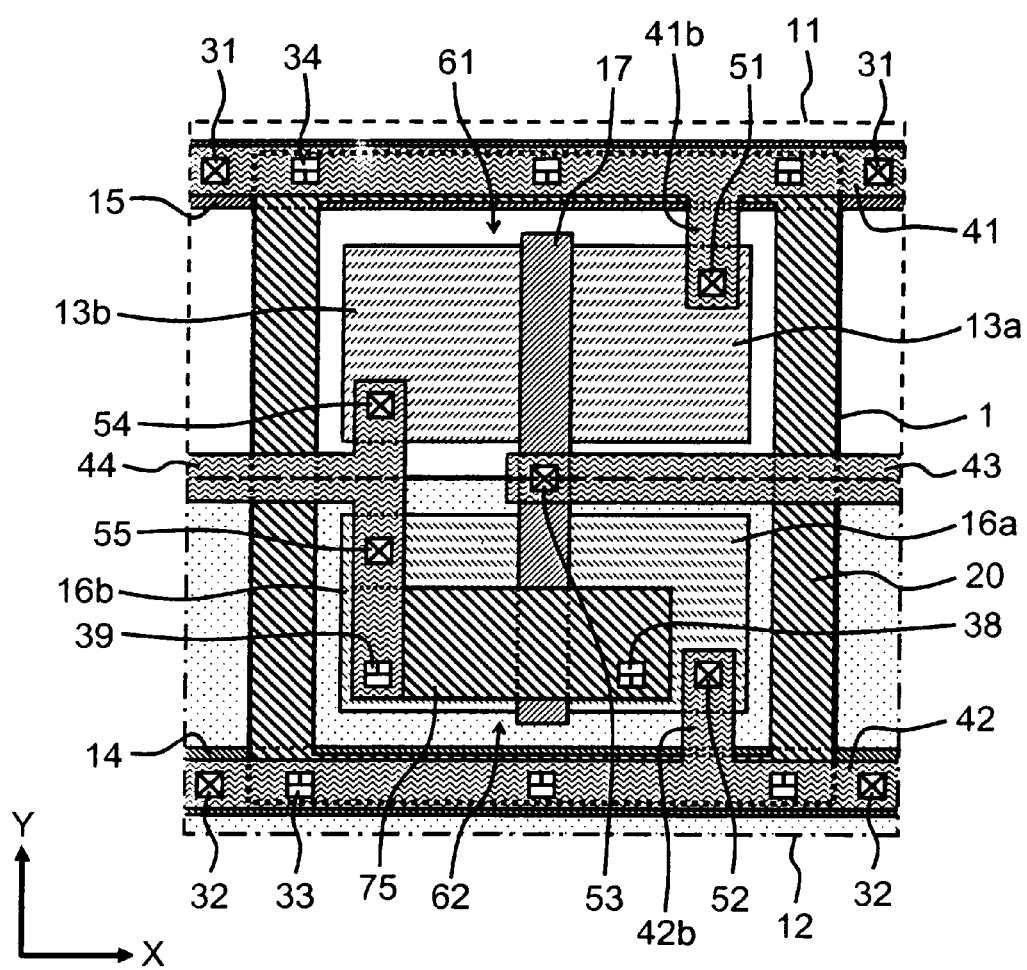
FIG. 23 is a schematic plan view showing essential portions of a semiconductor integrated circuit device according to Example 9 of the present disclosure.
Figure 24:
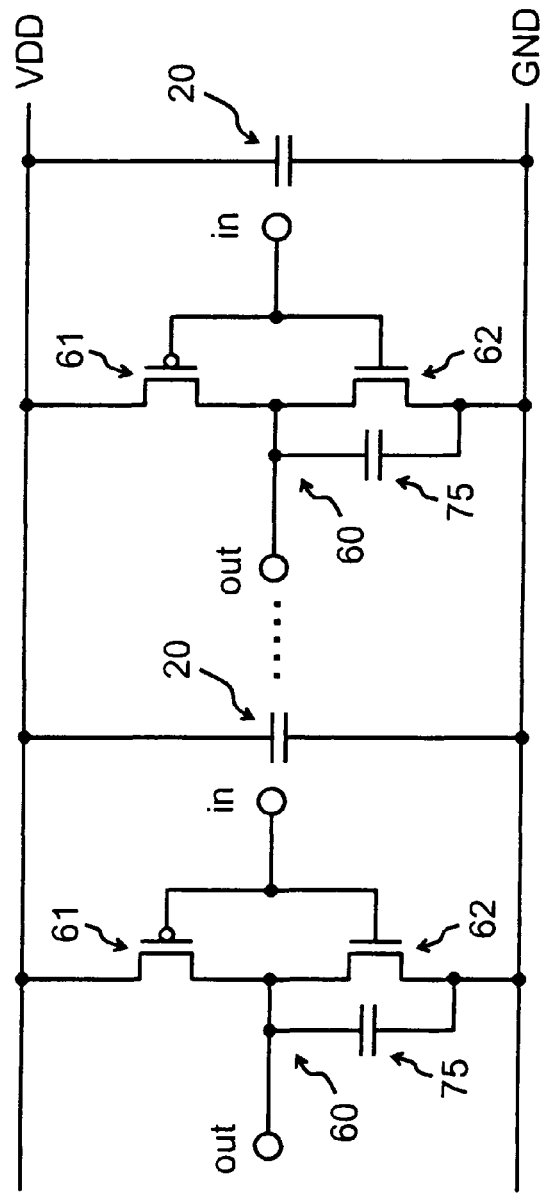
FIG. 24 is a diagram schematically showing a circuit of the semiconductor integrated circuit device according to Example 9 of the present disclosure.

A semiconductor integrated circuit device according to Example 9 of the present disclosure will now be explained with reference to the drawings. FIG. 23 is a schematic plan view showing the structure of essential portions of the semiconductor integrated circuit device according to Example 9. FIG. 24 is a diagram schematically showing a circuit of the semiconductor integrated circuit device according to Example 9.

Example 9 is a modification of Example 7. In Example 9, the capacitance of Example 7 (70 of FIG. 19), capacitance contacts (36, 37 of FIG. 19) and the interconnect (45 of FIG. 19) are eliminated. Otherwise, the configuration of Example 9 is the same as that of Example 7.

With Example 9, the meritorious effects similar to those of Example 4, referred to in Example 7, may be obtained. In addition, unneeded capacitance(s) may be dispensed with.

EXAMPLE 10

Figure 25:
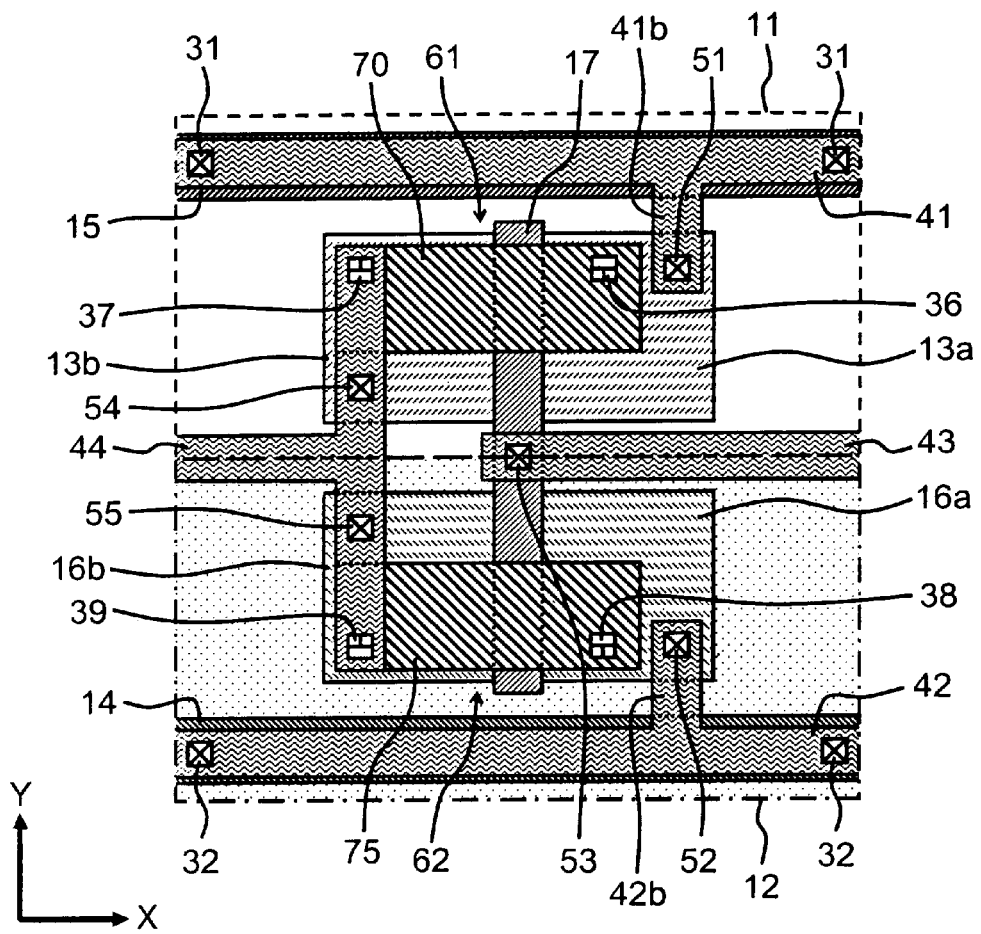
FIG. 25 is a schematic plan view showing essential portions of a semiconductor integrated circuit device according to Example 10 of the present disclosure.
Figure 26:
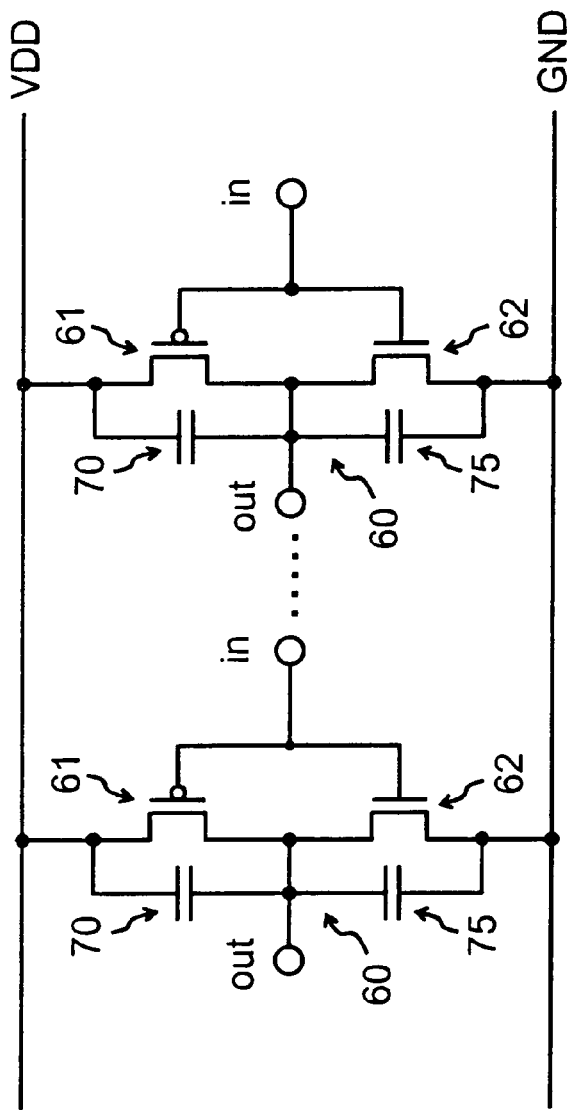
FIG. 26 is a diagram schematically showing a circuit of the semiconductor integrated circuit device according to Example 10.

A semiconductor integrated circuit device according to Example 10 of the present disclosure will now be explained with reference to the drawings. FIG. 25 is a schematic plan view showing the structure of essential portions of the semiconductor integrated circuit device according to Example 10. FIG. 26 is a diagram schematically showing a circuit of the semiconductor integrated circuit device according to Example 10.

Example 10 is a modification of Example 4. It is observed that, in case the capacitance between VDD and GND is unneeded, the capacitance between VDD and GND (20 of FIG. 11) as well as the capacitance contacts (33, 34 of FIG. 11) of Example 4 may be dispensed with. The capacitances 70, 75 as well as the other formulation of the present Example are the same as in Example 4. If, in Examples 5 to 9, the capacitances between VDD and GND are unnecessary, the capacitances between VDD and GND (20 of FIGS. 14, 17, 19, 21, 23) as well as the capacitance contacts (33, 34 of FIGS. 14, 17, 19, 21, 23) may be dispensed with.

In Example 10, the meritorious effects similar to those of Example 4 may be obtained. In addition, if the capacitance(s) between VDD and GND be unnecessary, these capacitance(s) may be dispensed with.

EXAMPLE 11

Figure 27:
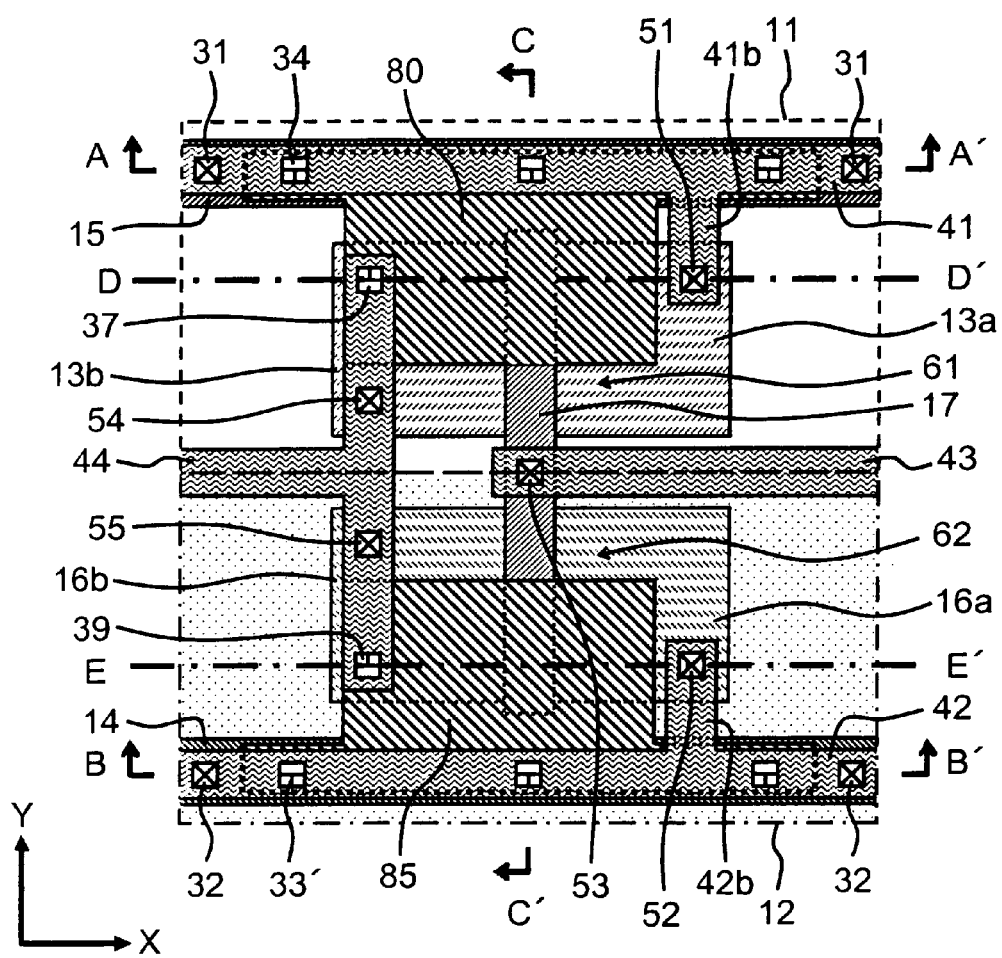
FIG. 27 is a schematic plan view showing essential portions of a semiconductor integrated circuit device according to Example 11 of the present disclosure.
Figure 28A:
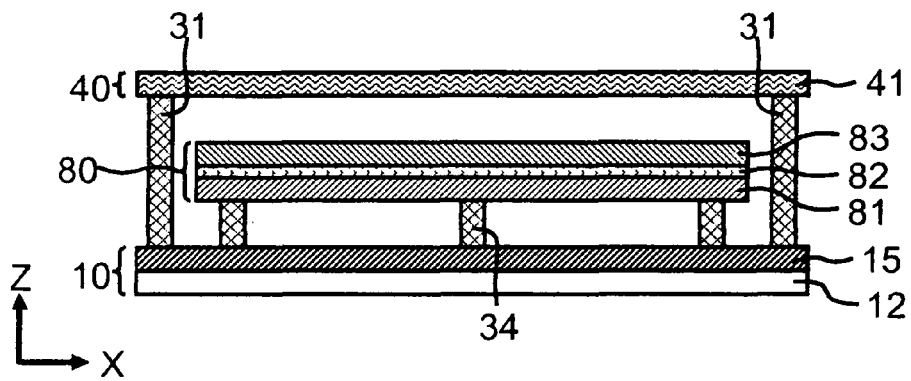
FIGS. 28A, 28B and 28C are cross-sectional views, taken along lines A-A', B-B' and C-C' of FIG. 27, respectively, for illustrating the structure of essential portions of the semiconductor integrated circuit device according to Example 11.
Figure 29A:
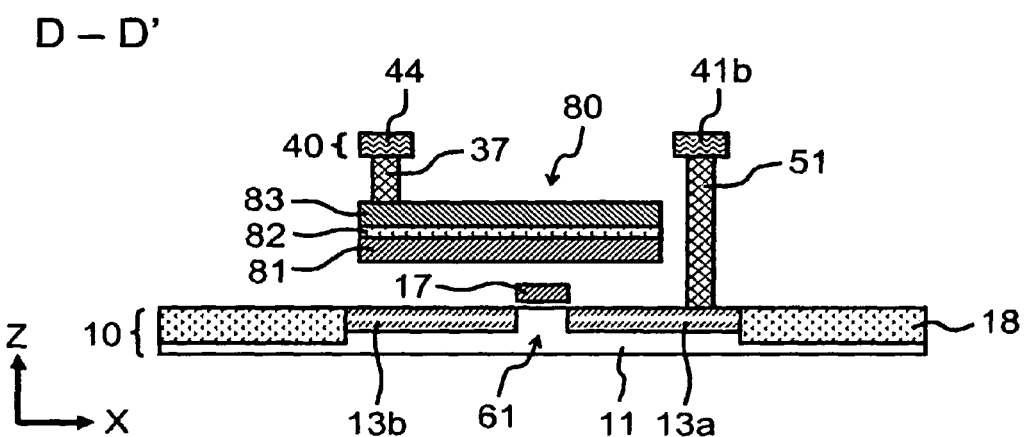
FIGS. 29A and 29B are cross-sectional views, taken along lines D-D' and E-E' of FIG. 27, for illustrating the structure of essential portions of the semiconductor integrated circuit device according to Example 11.
Figure 29B:
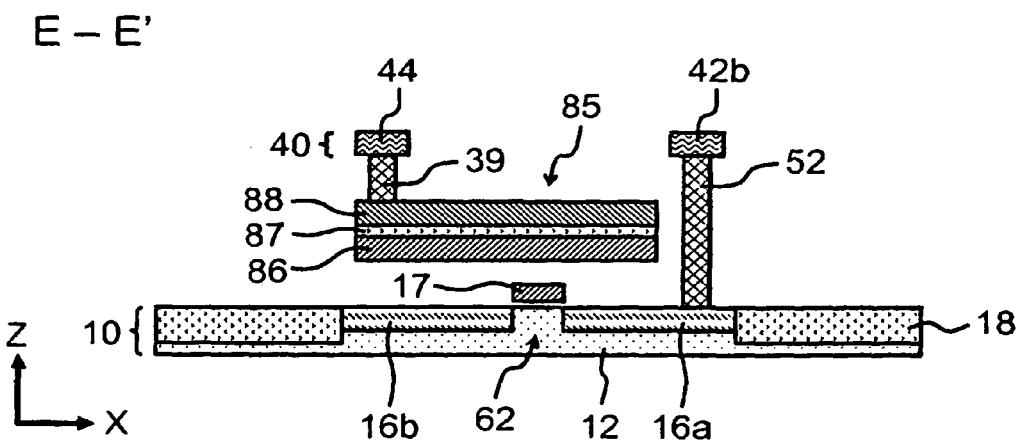
Figure 30:
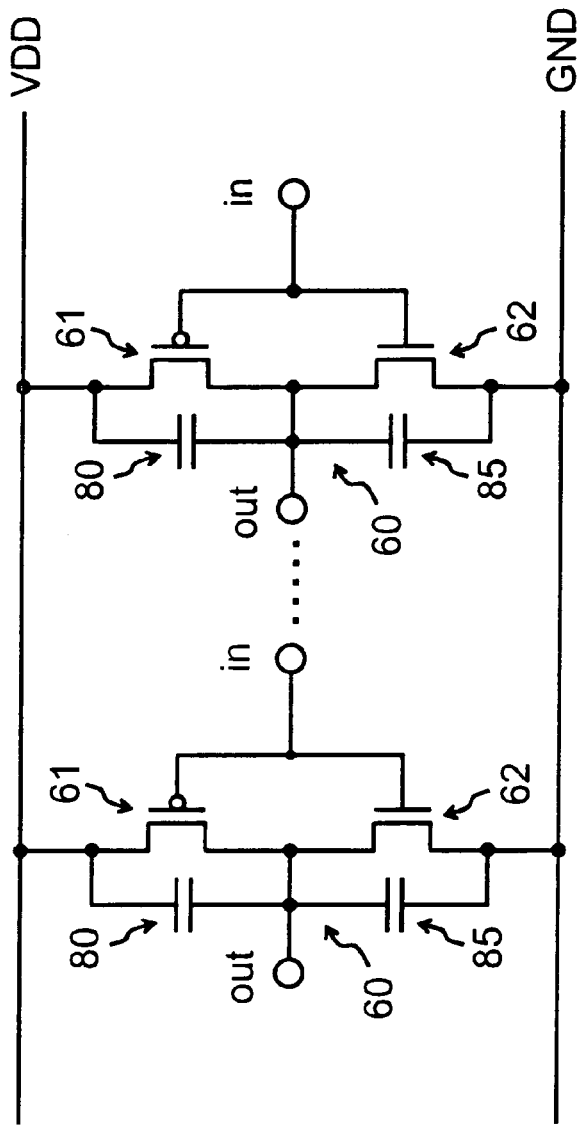
FIG. 30 is a diagram schematically showing a circuit of the semiconductor integrated circuit device according to Example 11.

A semiconductor integrated circuit device according to Example 11 of the present disclosure will now be described with reference to the drawings. FIG. 27 depicts a schematic plan view showing the structure of essential portions of the semiconductor integrated circuit device according to Example 11. FIGS. 28A, B and C depict cross-sectional views taken along lines A-A', B-B' and C-C' of FIG. 27, respectively, for illustrating the structure of essential portions of the semiconductor integrated circuit device according to Example 11. FIGS. 29A and 29B depict cross-sectional views taken along lines D-D' and E-E' of FIG. 27, respectively, for illustrating the structure of essential portions of the semiconductor integrated circuit device according to Example 11. FIG. 30 shows a diagram schematically showing a circuit of the semiconductor integrated circuit device according to Example 11.

Figure 28B:
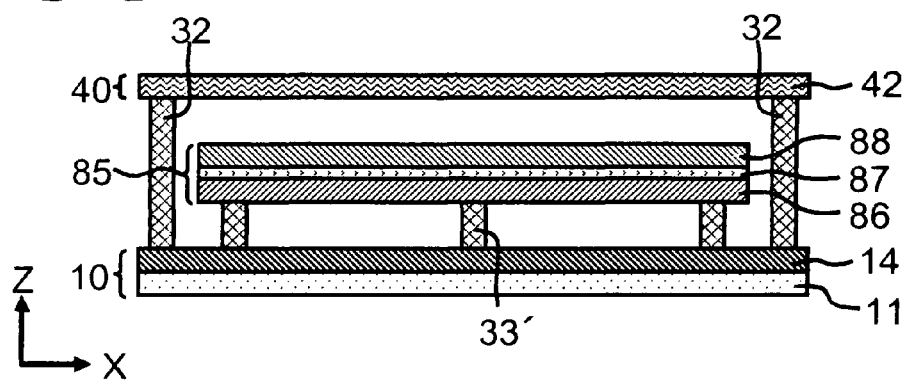
Figure 28C:
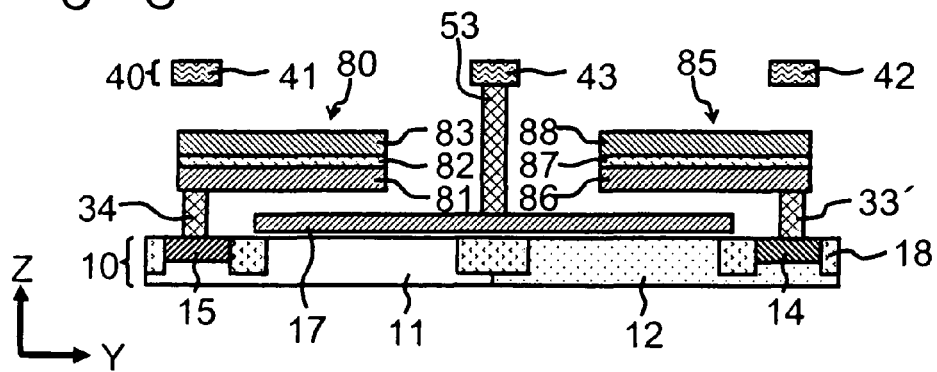

Example 11 is a modification of Example 10. In Example 11, electrically connecting a first electrode 81 of a capacitance 80 (equivalent to the capacitance 70 of FIG. 25) arranged on the MIS transistor 61 (first well 11) to the first diffusion region 13a via capacitance contact is eliminated. Instead, the capacitance 80 is extended to an overlap region of the third diffusion region 15 and the first power supply line 41, and the first electrode 81 of the capacitance 80 is electrically connected to the third diffusion region 15 via one or more first capacitance contacts 34 (see FIGS. 28A and 28C). Moreover, electrically connecting a first electrode 86 of a capacitance 85 (equivalent to the capacitance 75 of FIG. 25) arranged on the MIS transistor 62 (second well 12) to the fourth diffusion region 16a via capacitance contact is eliminated. Instead, the capacitance 85 is extended to an overlap region of the second diffusion region 14 and the second power supply line 42, and the first electrode 86 of the capacitance 85 is electrically connected to the second diffusion region 14 via one or more second capacitance contacts 33' (see FIGS. 28B and 28C). The capacitances 80 and 85 are spaced apart from each other. The capacitance 80 is made up of a first electrode 81, a dielectric member 82 and a second electrode 83 sequentially stacked together in this order from the side the substrate structure layer 10 (see FIGS. 28 and 29). The second electrode 83 is electrically connected to the output side interconnect 44 via fourth capacitance contact 37. The capacitance 85 is made up of a first electrode 86, a dielectric member 87 and a second electrode 88 sequentially stacked together in this order from the side the substrate structure layer 10 (see FIGS. 28 and 29). The second electrode 88 is electrically connected to the output side interconnect 44 via sixth capacitance contact 39. Otherwise, the configuration of Example 11 is the same as Example 10.

In place of electrically connecting the first electrode 81 of the capacitance 80 to the third diffusion region 15 via first capacitance contacts 34 and electrically connecting the second electrode 83 to the output side interconnect 44 via fourth capacitance contact 37, the first electrode 81 and the first diffusion region 13b may be interconnected via a capacitance contact, not shown. The second electrode 83 and the first power supply line 41 may be interconnected in this case via a capacitance contact, not shown. The same connection is then made for the capacitance 85. Viz., in place of electrically connecting the first electrode 86 to the second diffusion region 14 via second capacitance contacts 33' and electrically connecting the second electrode 88 to the output side interconnect 44 via sixth capacitance contact 39, the first electrode 86 and the fourth diffusion region 16b may be interconnected via a capacitance contact, not shown. The second electrode 88 and the second power supply line 42 are interconnected in this case via a capacitance contact, not shown.

With Example 11, the same meritorious effect as that of Example 10 may be obtained. Additionally, the capacitance values of the capacitance 80 between VDD and the output terminal as well as the capacitance 85 between GND and the output terminal may be increased, respectively.

EXAMPLE 12

Figure 31:
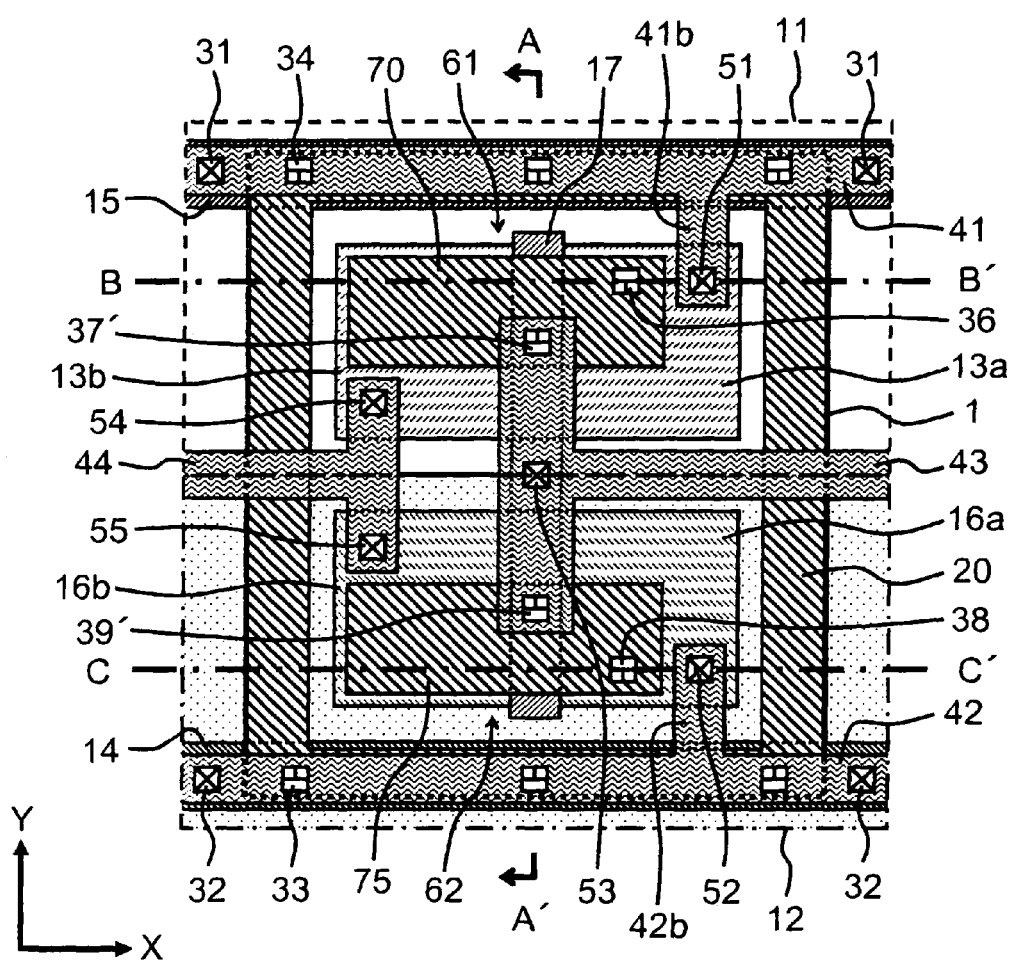
FIG. 31 is a schematic plan view showing essential portions of a semiconductor integrated circuit device according to Example 12 of the present disclosure.
Figure 32A:
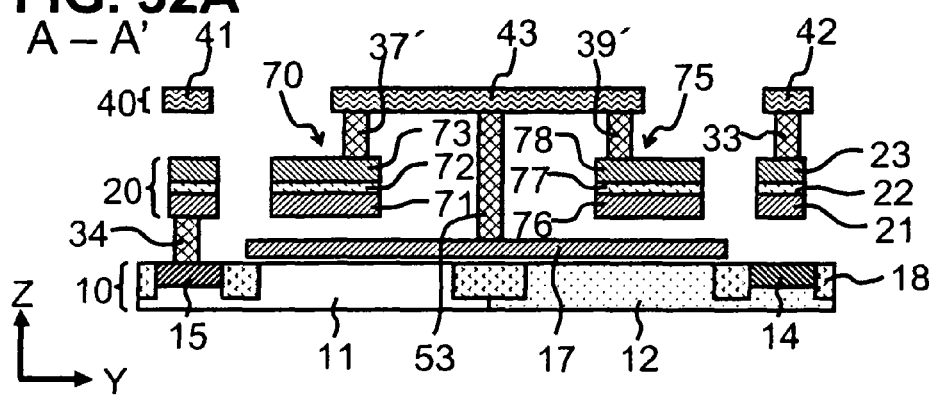
FIGS. 32A, 32B and 32C are cross-sectional views, taken along lines A-A', B-B' and C-C' of FIG. 31, respectively, for illustrating the structure of essential portions of the semiconductor integrated circuit device according to Example 12.
Figure 32B:
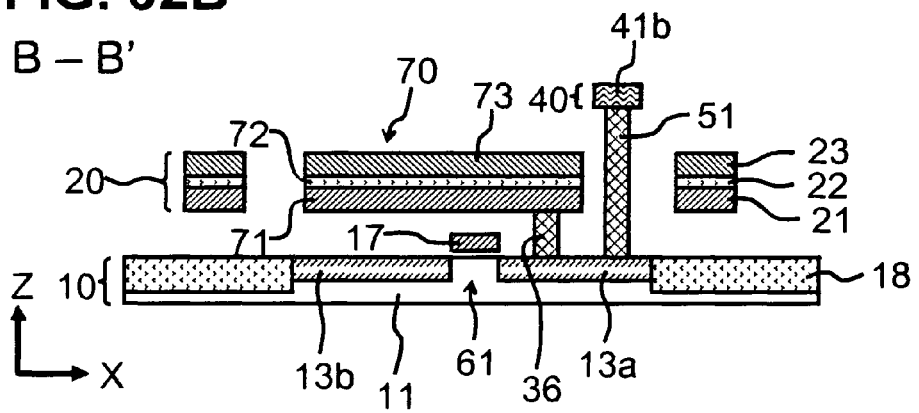
Figure 32C:
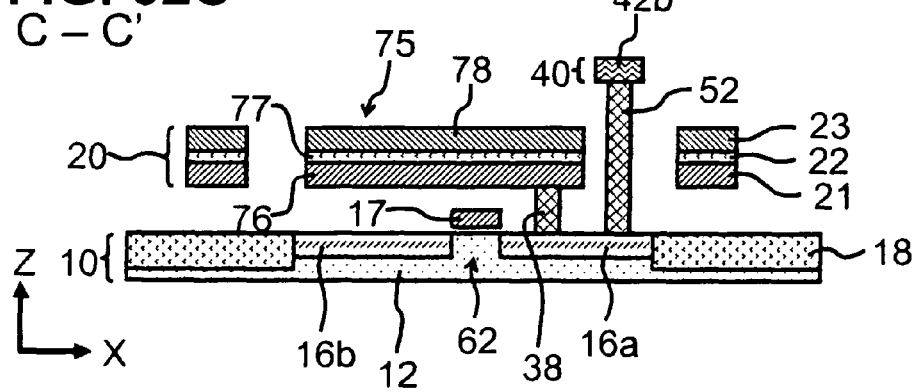
Figure 33:
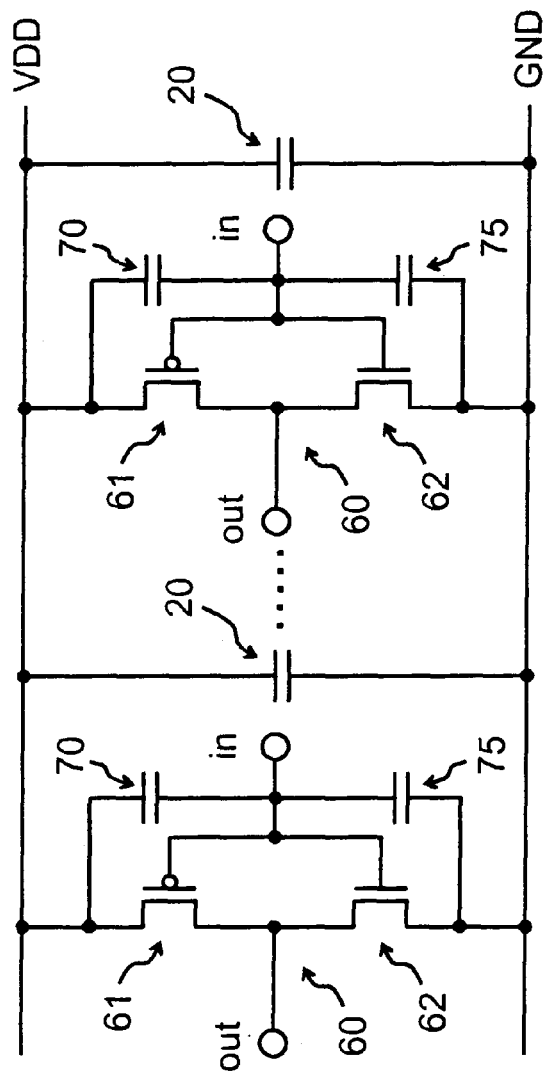
FIG. 33 is a diagram schematically showing a circuit of the semiconductor integrated circuit device according to Example 12.

The semiconductor integrated circuit device according to Example 12 of the present disclosure will now be described with reference to the drawings. FIG. 31 depicts a schematic plan view showing the structure of essential portions of the semiconductor integrated circuit device according to Example 12. FIGS. 32A to 32C are cross-sectional views taken along lines A-A', B-B" and C-C' of FIG. 31, respectively, and schematically show the structure of essential portions of the semiconductor integrated circuit device according to Example 12. FIG. 33 depicts a diagram showing a circuit of the semiconductor integrated circuit device according to Example 12.

Example 12 is a modification of Example 4. Specifically, the capacitance 70 is provided not between VDD and the output terminal but between VDD and the input terminal, while the capacitance 75 is provided not between GND and the output terminal but between GND and the input terminal. In short, electrically connecting the second electrode 72 of the capacitance 70 to the output side interconnect 44 via capacitance contact is eliminated and the second electrode 72 is electrically connected to the input side interconnect 43 via a fourth capacitance contact 37'. On the other hand, electrically connecting the second electrode 77 of the capacitance 75 to the output side interconnect 44 via capacitance contact is eliminated and the second electrode 77 is electrically connected to the input side interconnect 43 via a sixth capacitance contact 39' (see FIG. 32A). Otherwise, the present Example is similar in configuration to Example 4.

With Example 12, the meritorious effect similar to that of Example 4 may be obtained.

EXAMPLE 13

Figure 34:
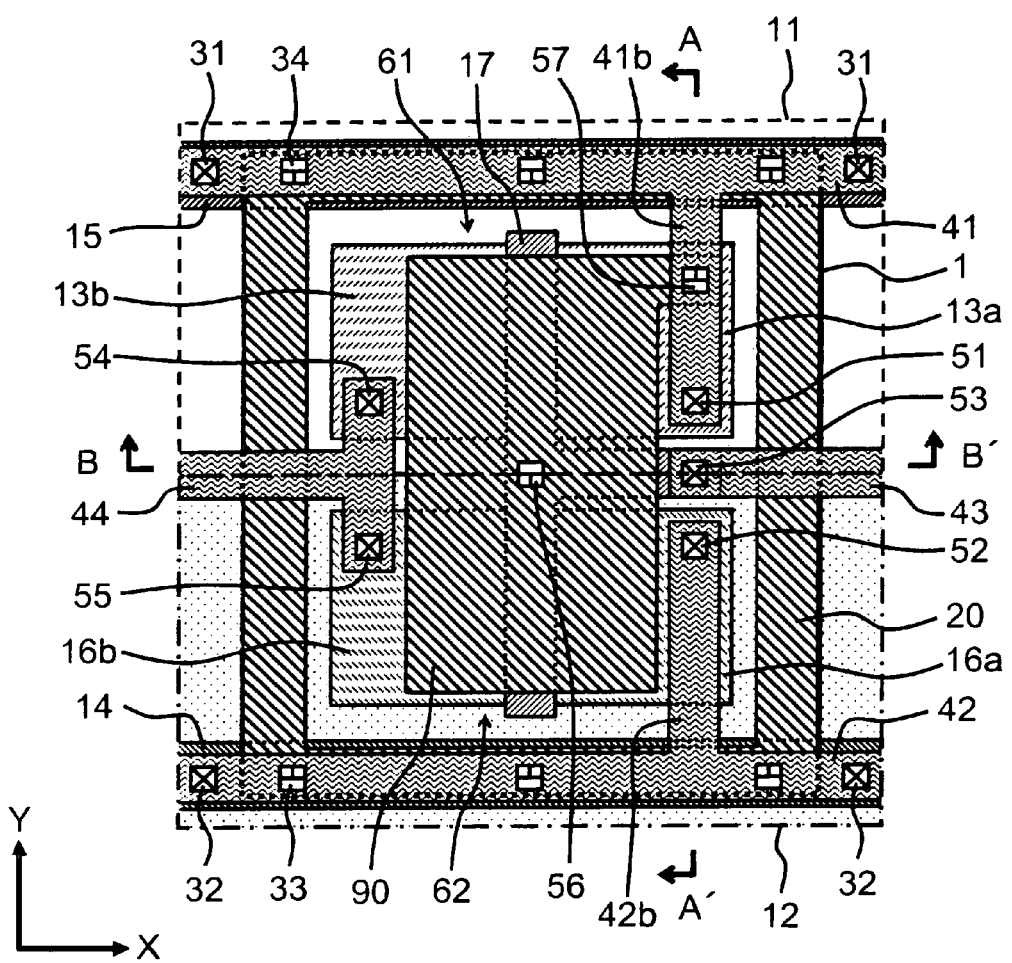
FIG. 34 is a schematic plan view showing essential portions of a semiconductor integrated circuit device according to Example 13 of the present disclosure.
Figure 35A:
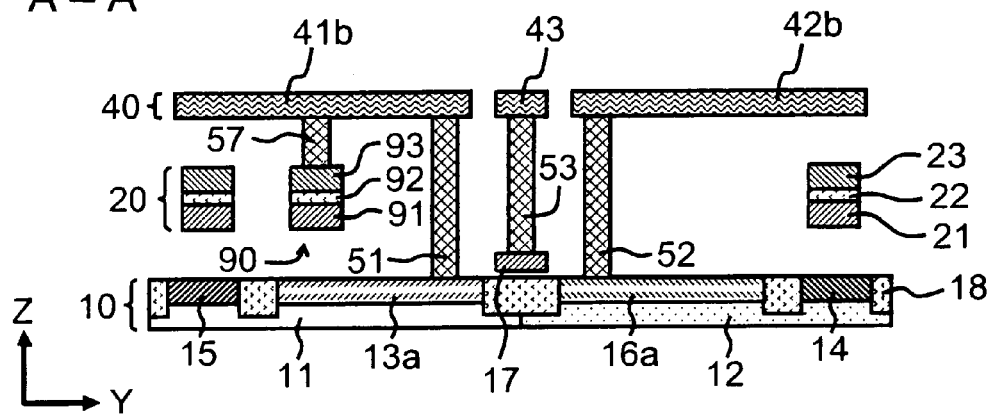
FIGS. 35A and 35B are cross-sectional views, taken along lines A-A' and B-B' of FIG. 34, for illustrating the structure of essential portions of the semiconductor integrated circuit device according to Example 13.
Figure 35B:
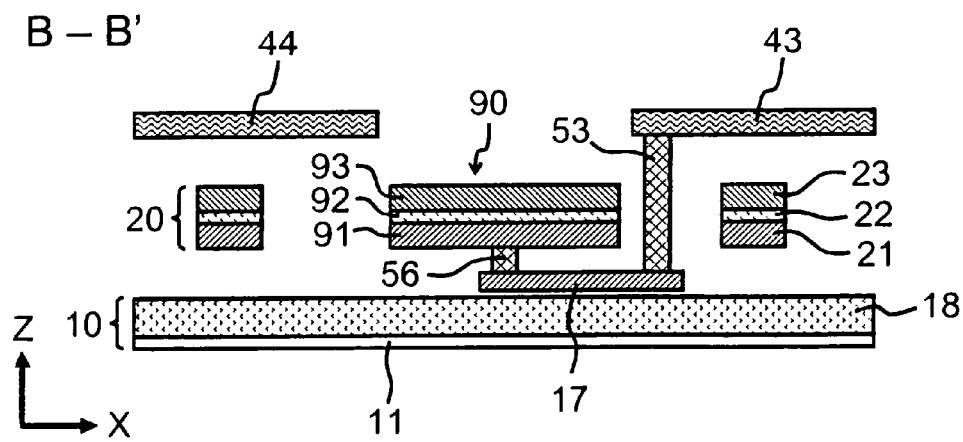
Figure 36:
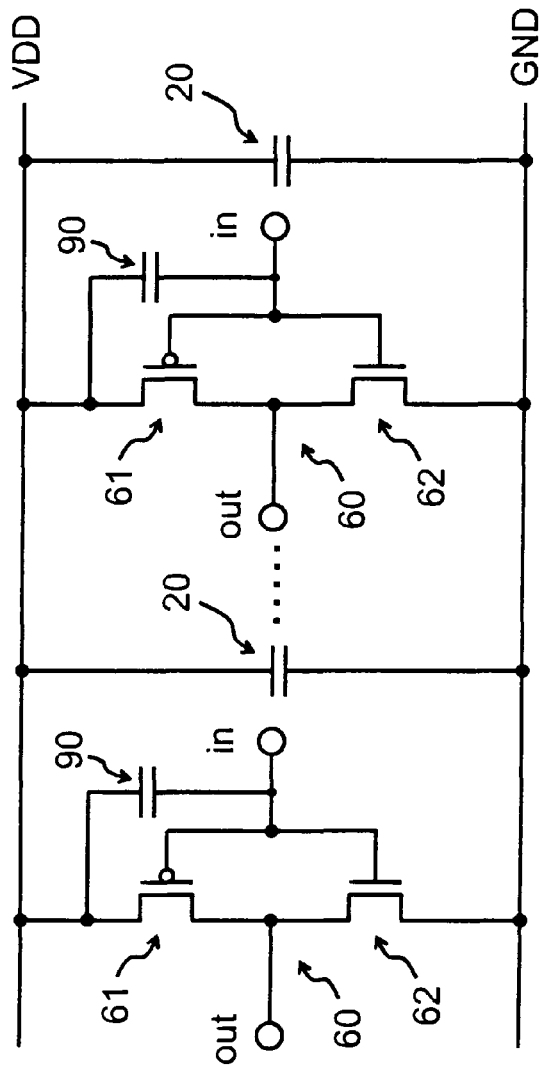
FIG. 36 is a diagram schematically showing a circuit of the semiconductor integrated circuit device according to Example 13.

The semiconductor integrated circuit device according to Example 13 of the present disclosure will now be described with reference to the drawings. FIG. 34 depicts a plan view schematically showing the structure of essential portions of the semiconductor integrated circuit device according to Example 13. FIGS. 35A and 35B are cross-sectional views taken along lines A-A' and B-B" of FIG. 34, respectively, for schematically showing the structure of essential portions of the semiconductor integrated circuit device according to Example 13. FIG. 36 depicts a diagram showing a circuit of the semiconductor integrated circuit device according to Example 13.

Example 13 is a modification of Example 3. Viz., there is added in Example 13 a capacitance 90 in a region inside the frame-shaped capacitance 20. The capacitance 90 is provided between VDD and an input terminal.

The capacitance 90 is provided astride the boundary line of the first and second wells 11, 12 in a region inside the frame-shaped capacitance 20. It is provided above the gate electrode 17 as well. The capacitance 90 is provided in a region between the substrate structure layer 10 and the interconnect layer 40 in the same layer as the capacitance 20. The capacitances 20 and 90 are spaced apart from each other. The capacitance 90 is arranged partially superposed with the branched line portion 41b of the first power supply line 41 when seen along the Z-axis. Like the capacitance 20, the capacitance 90 is made up of a first electrode 91, a dielectric member 92 and a second electrode 93, sequentially stacked together in this order from the side the substrate structure layer 10 (see FIG. 35). The first electrode 91 is electrically connected to the gate electrode 17, via a capacitance contact 56, in a region thereof superposed with the gate electrode 17 when seen along the Z-axis (see FIG. 35B). The second electrode 93 is electrically connected to the branched line portion 41b of the first power supply line 41 via a capacitance contact 57 in a region thereof superposed with the branched line portion 41b when seen along the Z-axis (see FIG. 35A). The capacitance 90 is provided spaced apart from the contacts 51 to 55.

The gate electrode 17 has a portion extending to a region not superposed with the capacitance 90 nor with the diffusion regions 13a, 13b, 14, 15, 16a, 16b when seen along the Z-axis. At this extending portion, the gate electrode 17 is electrically connected to the input side interconnect 43 via contact 53. The input side interconnect 43 is electrically connected to the first electrode 91 of the capacitance 90 via contact 53, gate electrode 17 and capacitance contact 56. Each one of the capacitances 20 and 90 is associated with each standard cell 60 (see FIG. 36). Otherwise, the present Example is the same in configuration as Example 3.

Instead of electrically connecting the first electrode 91 of the capacitance 90 to the gate electrode 17 via capacitance contact 56 and electrically connecting the second electrode 93 to the branched line portion 41b of the first power supply line 41 via capacitance contact 57, the first electrode 91 and the first diffusion region 13a may be interconnected via capacitance contact, not shown. In this case, the input side interconnect 43 may be partially superposed with the capacitance 90, and the second electrode 93 may be electrically connected to the input side interconnect 43 via capacitance contact, not shown.

In Example 13, the same meritorious effect as that of Example 3 may be derived. In addition, since the DRAM capacitance, inherently aimed to hold a value of electrical charges, is used as the capacitance 90 of interconnects within the standard cell 60, the charging/discharging time ($\tau$=RC) may be prolonged, while it is no longer necessary to arrange a buffer cell or a capacitor cell. Hence, the LSI area may be suppressed from increasing.

Additionally, with Example 13, in which a plurality of capacitances 90 are provided within the standard cell region 1, it is possible to make fine adjustment of the delay time, desired to be prolonged, without affecting the placement of pre-existing cells. It is thus possible to suppress the adverse effect on placement of the pre-existing cells or on the shape of the interconnections. As a result, the meritorious effect of shortening the design time may be obtained.

EXAMPLE 14

Figure 37:
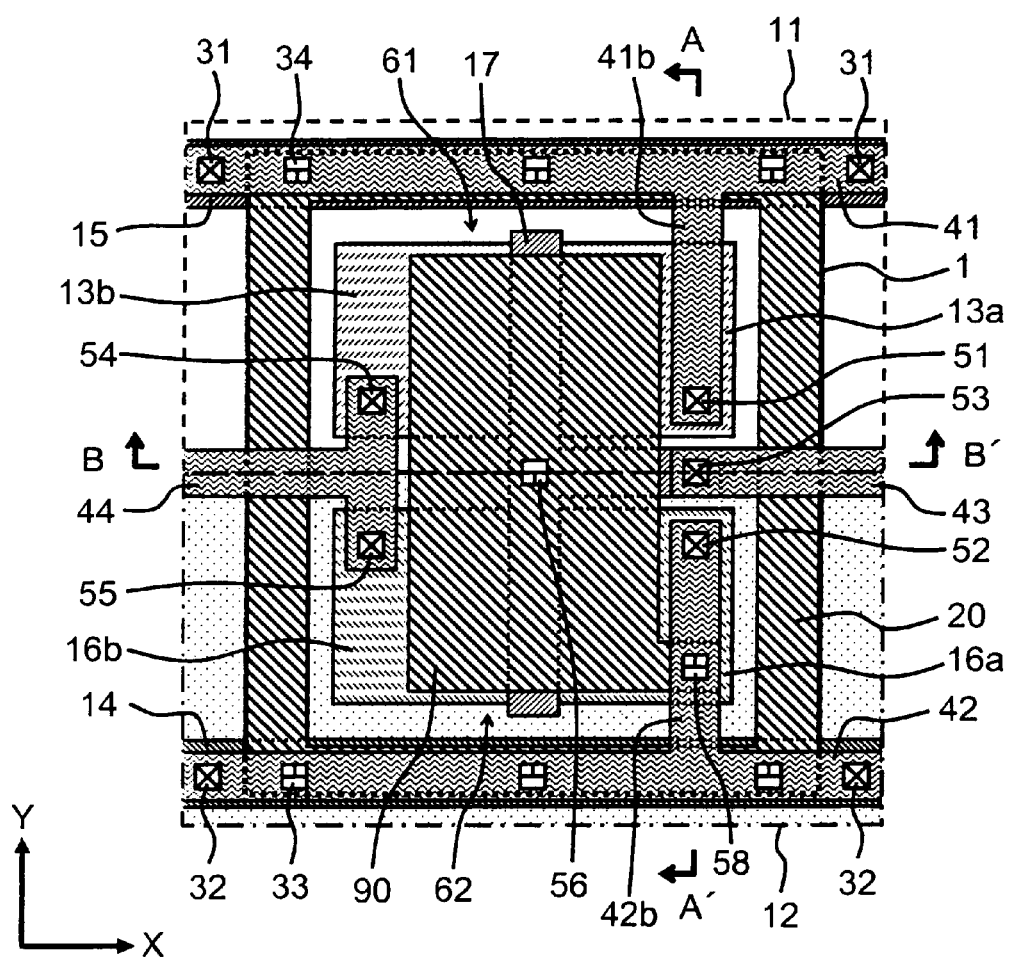
FIG. 37 is a schematic plan view showing essential portions of a semiconductor integrated circuit device according to Example 14 of the present disclosure.
Figure 38A:
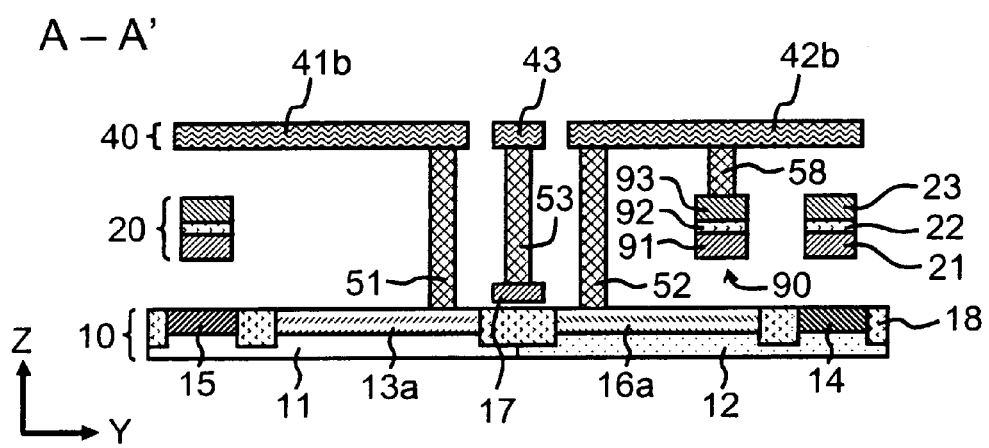
FIGS. 38A and 38B are cross-sectional views, taken along lines A-A' and B-B' of FIG. 37, for illustrating the structure of essential portions of the semiconductor integrated circuit device according to Example 14.
Figure 38B:
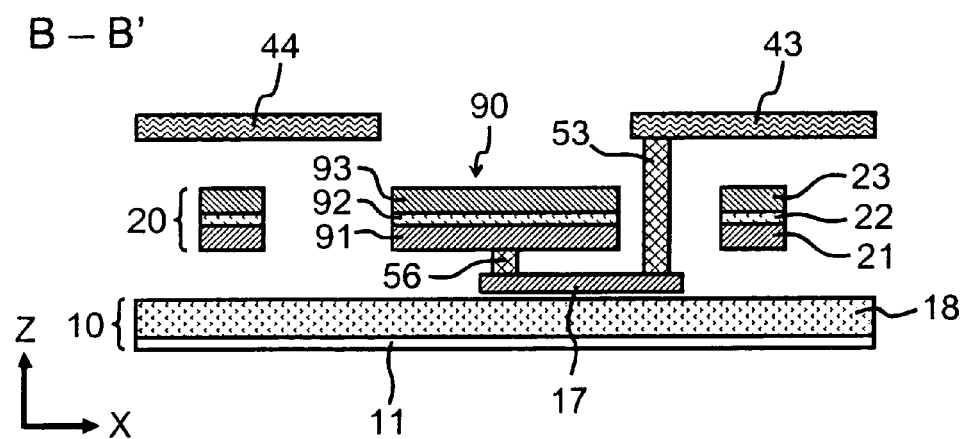
Figure 39:
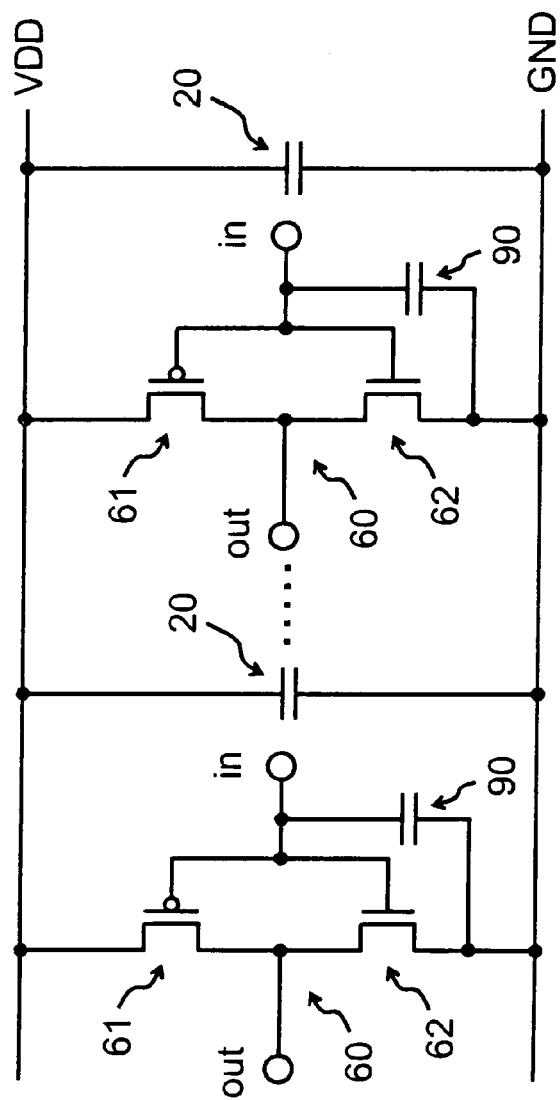
FIG. 39 is a diagram schematically showing a circuit of the semiconductor integrated circuit device according to Example 14.

A semiconductor integrated circuit device according to Example 14 of the present disclosure will now be described with reference to the drawings. FIG. 37 depicts a plan view schematically showing the structure of essential portions of the semiconductor integrated circuit device according to Example 14. FIGS. 38A and 38B are cross-sectional views taken along lines A-A' and B-B' of FIG. 37, respectively, and schematically show the structure of essential portions of the semiconductor integrated circuit device according to Example 14. FIG. 39 depicts a diagram showing a circuit of the semiconductor integrated circuit device according to Example 14n.

Example 14 is a modification of Example 13. Specifically, the capacitance 90 is provided between GND and the input terminal instead of between VDD and the input terminal. In short, electrically connecting the second electrode 93 to the branched line portion 41b of the first power supply line 41 via capacitance contact is eliminated and the capacitance 90 is partially superposed with the branched line portion 42b of the second power supply line 42. Additionally, the second electrode 93 is electrically connected to the branched line portion 42b of the second power supply line 42 via capacitance contact 58 (FIG. 38A). Otherwise, the present Example is similar in configuration to Example 13.

Instead of electrically connecting the first electrode 91 of the capacitance 90 to the gate electrode 17 via capacitance contact 56 and electrically connecting the second electrode 93 to the branched line portion 42b of the second power supply line 42 via capacitance contact 58, the first electrode 91 and the fourth diffusion region 16a may be interconnected via capacitance contact, not shown. In this case, the input side interconnect 43 is partially superposed with the capacitance 90, and the second electrode 93 is electrically connected to the input side interconnect 43 via a capacitance contact, not shown.

With the present Example 14, the same meritorious effect as that of Example 13 may be obtained.

EXAMPLE 15

Figure 40:
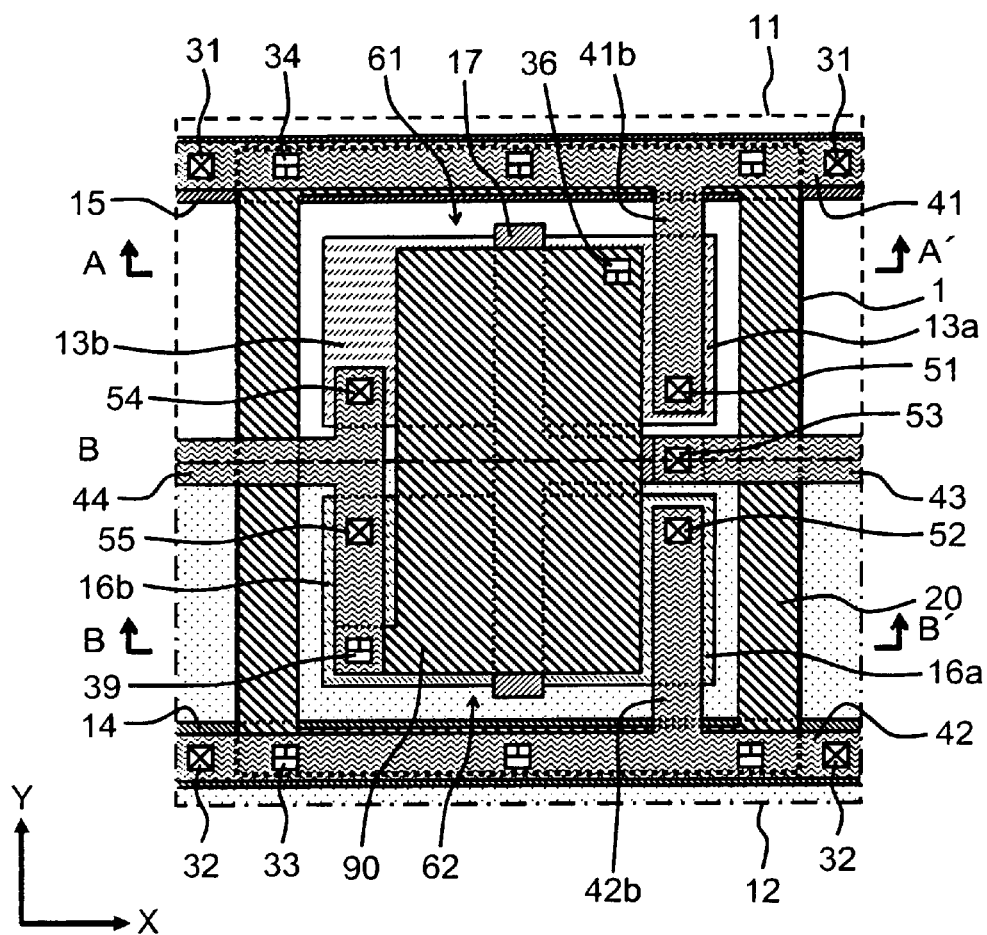
FIG. 40 is a schematic plan view showing essential portions of a semiconductor integrated circuit device according to Example 15 of the present disclosure.
Figure 41A:
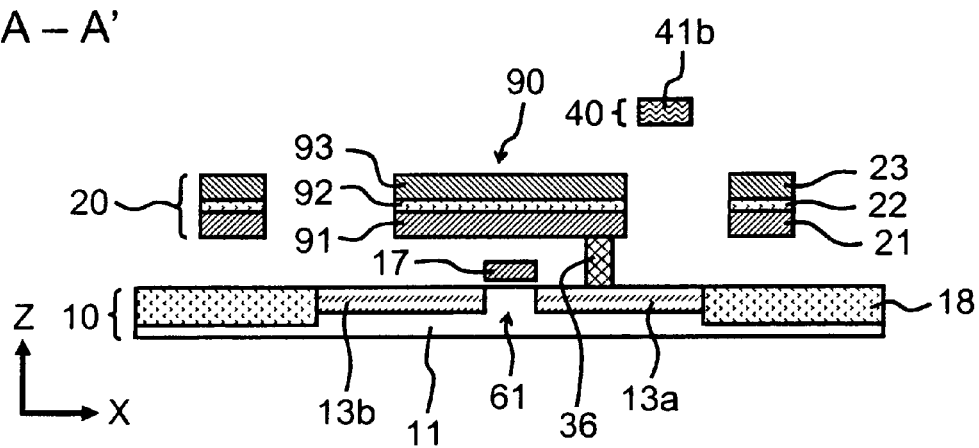
FIGS. 41A and 41B are cross-sectional views, taken along lines A-A' and B-B' of FIG. 40, for illustrating the structure of essential portions of the semiconductor integrated circuit device according to Example 15.
Figure 41B:
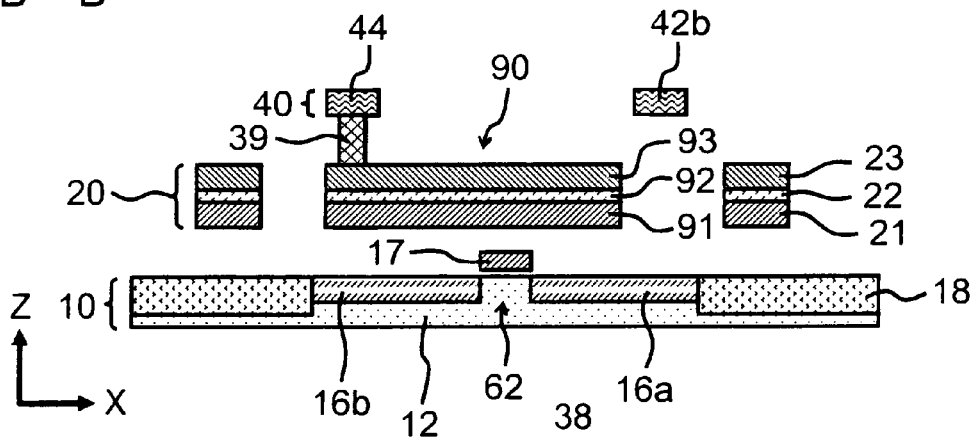
Figure 42:
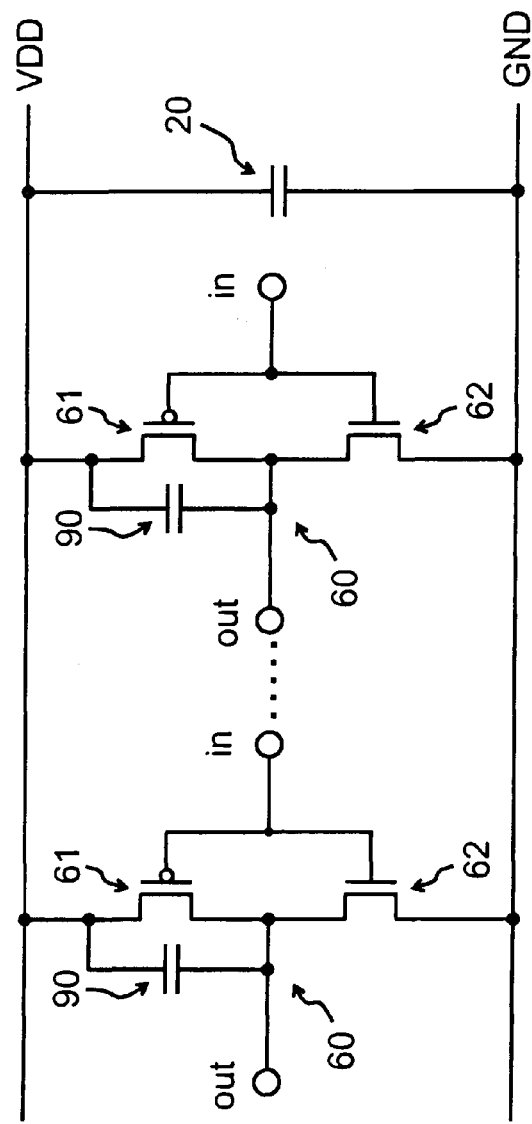
FIG. 42 is a diagram schematically showing a circuit of the semiconductor integrated circuit device according to Example 15.

A semiconductor integrated circuit device according to Example 15 of the present disclosure will now be described with reference to the drawings. FIG. 40 depicts a plan view schematically showing the structure of essential portions of the semiconductor integrated circuit device according to Example 15. FIGS. 41A and 41B are cross-sectional views taken along lines A-A' and B-B' of FIG. 40, respectively, and schematically show the structure of essential portions of the semiconductor integrated circuit device according to Example 15. FIG. 42 depicts a diagram showing a circuit of the semiconductor integrated circuit device according to Example 15.

Example 15 is a modification of Example 13. Specifically, the capacitance 90 is provided not between VDD and the input terminal but between VDD and the output terminal. In short, electrically connecting the first electrode 91 to the gate electrode 17 via capacitance contact is eliminated, while electrically connecting the second electrode 93 to the branched line portion 41b of the first power supply line 41 via capacitance contact is also eliminated. The first electrode 91 is electrically connected to the first diffusion region 13a via third capacitance contact 36 (see FIG. 41A). The capacitance 90 is partially superposed with of the output side interconnect 44. The second electrode 93 and the output side interconnect 44 are interconnected via sixth capacitance contact 39 (see FIG. 41B). Otherwise, the present Example is similar in configuration to Example 13.

Instead of electrically connecting the first electrode 91 of the capacitance 90 to the first diffusion region 13a via third capacitance contact 36 and electrically connecting the second electrode 93 to the output side interconnect 44 via sixth capacitance contact 39, the first electrode 91 may be electrically connected to the fourth diffusion region 16b via a capacitance contact, not shown. In this case, the capacitance 90 is partially superposed with the branched line portion 41b of the first power supply line 41, and the second electrode 93 is electrically connected to the branched line portion 41b via a capacitance contact, not shown.

With the Example 15, the same meritorious effect as that of Example 13 may be obtained.

EXAMPLE 16

Figure 43:
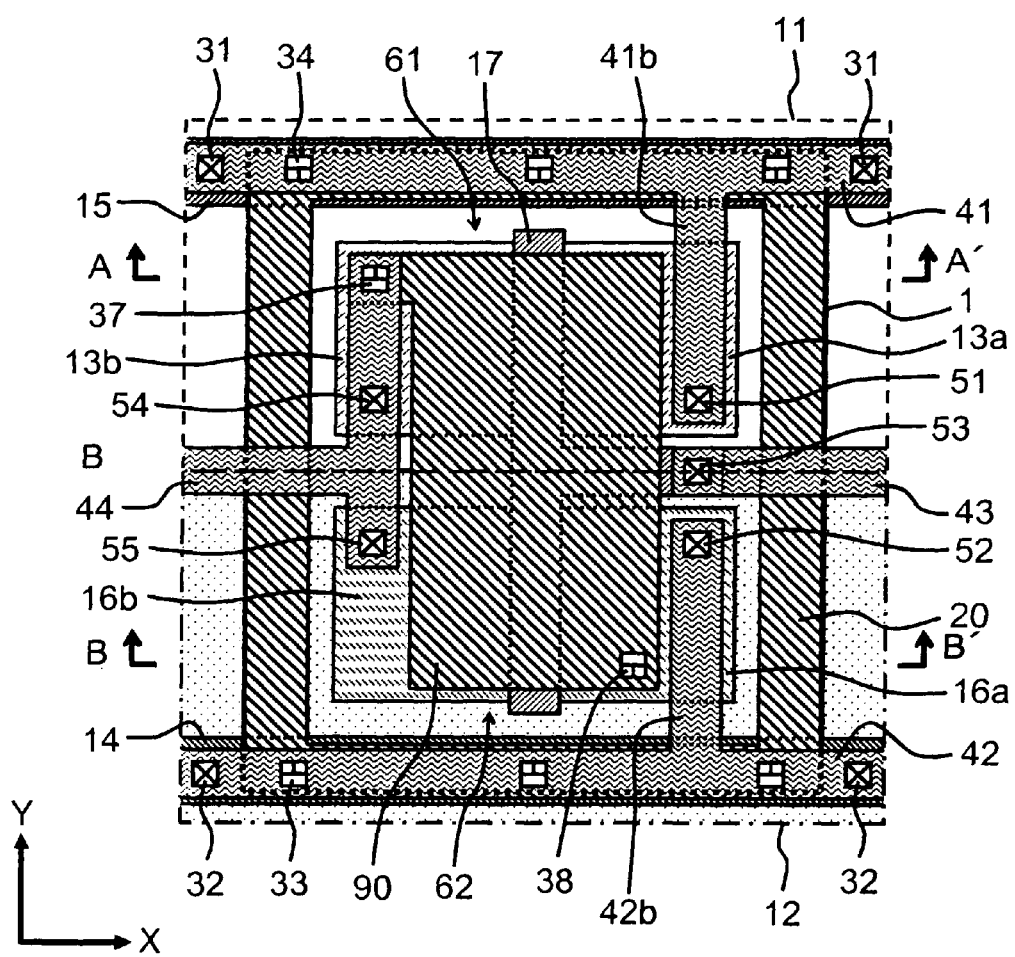
FIG. 43 is a schematic plan view showing essential portions of a semiconductor integrated circuit device according to Example 16.
Figure 44A:
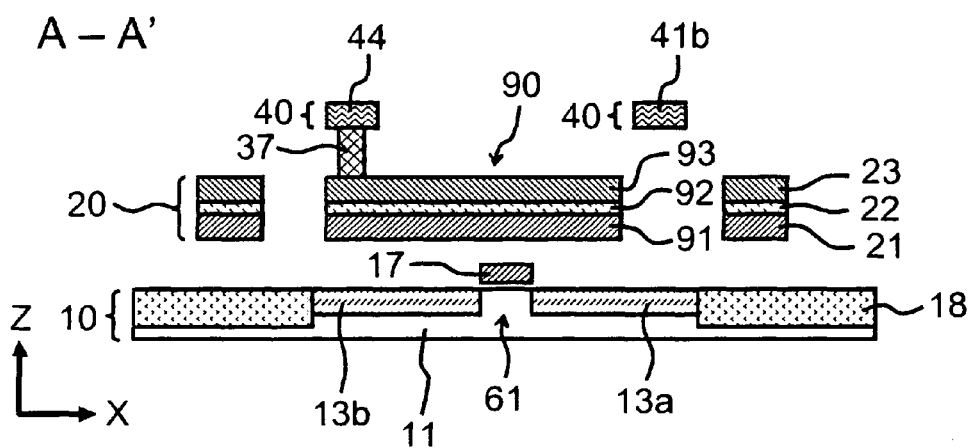
FIGS. 44A and 44B are cross-sectional views, taken along lines A-A' and B-B' of FIG. 43, for illustrating the structure of essential portions of the semiconductor integrated circuit device according to Example 16.
Figure 44B:
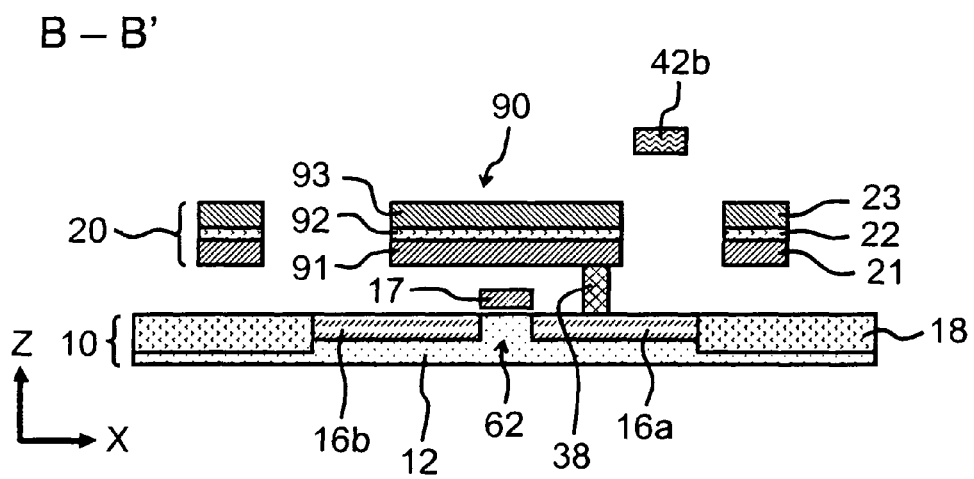
Figure 45:
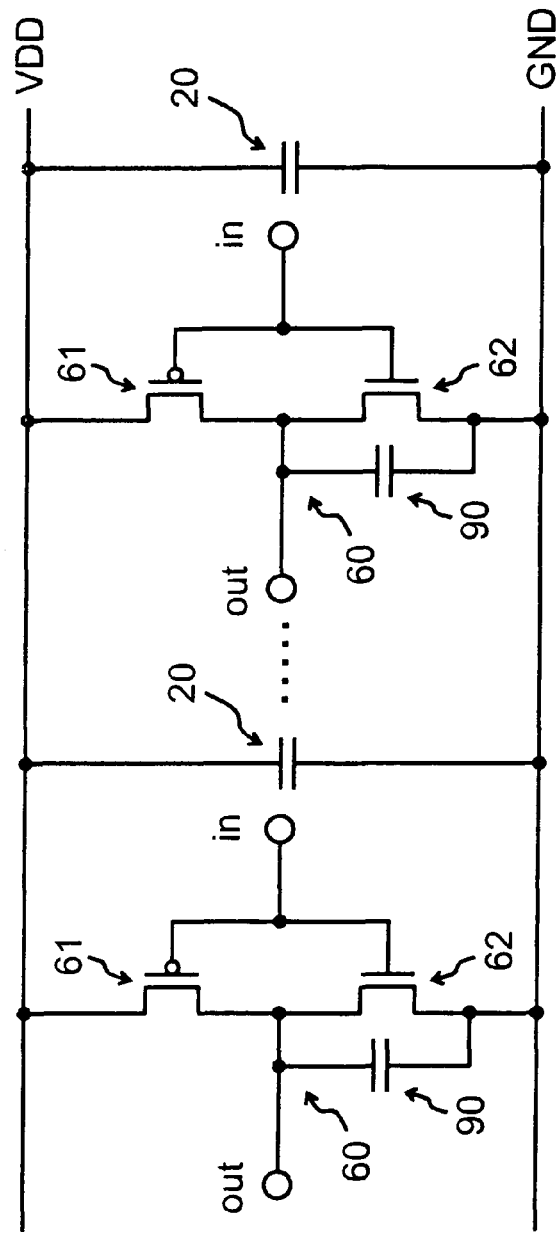
FIG. 45 is a diagram schematically showing a circuit of the semiconductor integrated circuit device according to Example 16.

A semiconductor integrated circuit device according to Example 16 of the present disclosure will now be described with reference to the drawings. FIG. 43 depicts a plan view schematically showing the structure of essential portions of the semiconductor integrated circuit device according to Example 16. FIGS. 44A and 44B depict cross-sectional views taken along lines A-A' and B-B' of FIG. 43, respectively, and schematically show the structure of essential portions of the semiconductor integrated circuit device according to Example 16. FIG. 45 depicts a diagram schematically showing a circuit of the semiconductor integrated circuit device according to Example 16.

Example 16 is a modification of Example 13. Specifically, the capacitance 90 is provided not between VDD and the input terminal but between GND and the output terminal. In short, electrically connecting the first electrode 91 to the gate electrode 17 via capacitance contact is eliminated, while electrically connecting the second electrode 93 to the branched line portion 41b of the first power supply line 41 via capacitance contact is also eliminated. The first electrode 91 is electrically connected to the fourth diffusion region 16a via fifth capacitance contact 38 (see FIG. 44A). The capacitance 90 is partially superposed with the output side interconnect 44. The second electrode 93 and the output side interconnect 44 are interconnected via fourth capacitance contact 37 (see FIG. 44B). Otherwise, the present Example is similar in configuration to Example 13.

Instead of electrically connecting the first electrode 91 of the capacitance 90 to the fourth diffusion region 16a via third capacitance contact 38 and electrically connecting the second electrode 93 to the output side interconnect 44 via fourth capacitance contact 37, the capacitance 90 may be partially superposed with the branched line portion 42b of the second power supply line 42. In this case, the first electrode 91 is electrically connected to the branched line portion 42b via a capacitance contact, not shown, and the second electrode 93 may be electrically connected to the first diffusion region 13b via a capacitance contact, not shown.

With the Example 16, the same meritorious effect as that of Example 13 may be obtained.

The particular exemplary embodiments or examples may be modified or adjusted within the gamut of the entire disclosure of the present disclosure, inclusive of claims and drawings, based on the fundamental technical concept of the disclosure. Further, a wide variety of combinations or selections of elements disclosed herein may be made within the purport of the claims. Viz., the present disclosure may encompass various modifications or corrections that may occur to those skilled in the art in accordance with and within the gamut of the entire disclosure of the present disclosure, inclusive of claim and drawings and the technical concept of the present disclosure.

It should be noted that other objects, features and aspects of the present disclosure will become apparent in the entire disclosure and that modifications may be done without departing the gist and scope of the present disclosure as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
   a substrate structure layer at least including a pair of diffusion regions arranged at a preset spacing from each other;
   an interconnect layer at least including a pair of power supply lines arranged at a preset spacing from each other so that said power supply lines will be superposed with said pair of diffusion regions;
   a capacitance including a first electrode, a dielectric member and a second electrode stacked in this order looking from a side of said substrate structure layer; said capacitance being arranged within a space delimited between said substrate structure layer and said interconnect layer and being formed in a shape of a frame of a preset width; said capacitance of the frame shape being disposed inside an outer rim of a standard cell region so as to extend along the outer rim of the standard cell region; said standard cell region being a region in which a standard cell is arranged between the pair of power supply lines;
   a first substrate contact that electrically connects one of the power supply lines that is superposed with one of said pair diffusion regions to said one diffusion region, externally of said standard cell region;
   a second substrate contact that electrically connects the other of the power supply lines that is superposed with the other of said pair of diffusion regions to said other diffusion region, externally of said standard cell region;
   a first capacitance contact that electrically connects said first electrode and said other diffusion region, internally of said standard cell region; and
   a second capacitance contact that electrically connects said second electrode to said one power supply line, internally of said standard cell region.

2. The semiconductor integrated circuit device according to claim 1, wherein
   said standard cell comprises a tapless configuration standard cell in a rectangular frame of which there is not provided a substrate contact or a well contact; said standard cell including a DRAM.

3. The semiconductor integrated circuit device according to claim 1, wherein
   said capacitance has a width set so that no shorting will occur between said capacitance and said first or second substrate contact.

4. The semiconductor integrated circuit device according to claim 1, wherein
   said substrate structure layer has a preset diffusion region in a region inside the frame shape of said capacitance;
   said other power supply line including a portion extended to a site superposed with said preset diffusion region;
   said preset diffusion region being electrically connected via a third substrate contact to said extended portion of said other power supply line;
   said capacitance including a portion extended to a region where said third substrate contact is not provided.

5. The semiconductor integrated circuit device according to claim 4, wherein
   said capacitance includes a portion extended from a side of a region thereof superposed with said one power supply line towards said other power supply line.

6. The semiconductor integrated circuit device according to claim 5, wherein
   said extended portion of said capacitance is formed so as not to be superposed with said extended portion of said other power supply line and with said third substrate contact.

7. The semiconductor integrated circuit device according to claim 1, wherein
   said standard cell does not include, in said standard cell region, a substrate contact that electrically connects said pair of power supply lines to a component part of said substrate structure layer;
   said capacitance including a portion that is extended from a side of a region thereof superposed with said one power supply line and that connects to a side of another region thereof superposed with said other power supply line.

8. The semiconductor integrated circuit device according to claim 1, wherein
said standard cell does not include, in said standard cell region, a substrate contact that electrically connects said pair of power supply lines to a component part of said substrate structure layer;
said capacitance being formed in said standard cell region in its entirety.

* * * * *

UNITED STATES PATENT AND TRADEMARK OFFICE
CERTIFICATE OF CORRECTION

PATENT NO. : 8,546,913 B2  
APPLICATION NO. : 13/064599  
DATED : October 1, 2013  
INVENTOR(S) : Masatake Wada et al.

Page 1 of 1

It is certified that error appears in the above-identified patent and that said Letters Patent is hereby corrected as shown below:

On the Title Page

In particular, it is requested that Item (30) the first Foreign Application Filing Date should read as follows:

(30)   Foreign Application Priority Data

April 2, 2010   (JP) 2010-085686  
        March 3, 2011  (JP) 2011-046790

Signed and Sealed this  
Twenty-second Day of April, 2014

Michelle K. Lee  
*Deputy Director of the United States Patent and Trademark Office*